United States Patent
Shimizu et al.

(10) Patent No.: US 8,021,576 B2
(45) Date of Patent: Sep. 20, 2011

(54) PHOSPHOR AND PRODUCTION METHOD THEREOF, AND PHOSPHOR-CONTAINING COMPOSITION, LIGHT EMITTING DEVICE, IMAGE DISPLAY AND LIGHTING SYSTEM

(75) Inventors: Etsuo Shimizu, Kanagawa (JP); Kumie Shimizu, legal representative, Tokyo (JP); Naoto Kijima, Kanagawa (JP); Yasuo Shimomura, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 229 days.

(21) Appl. No.: 12/403,405

(22) Filed: Mar. 13, 2009

(65) Prior Publication Data

US 2009/0243467 A1    Oct. 1, 2009

Related U.S. Application Data

(63) Continuation of application No. PCT/JP2007/067902, filed on Sep. 14, 2007.

(30) Foreign Application Priority Data

Sep. 15, 2006 (JP) ................................ 2006-251826
Sep. 15, 2006 (JP) ................................ 2006-251827
Apr. 27, 2007 (JP) ................................ 2007-119627

(51) Int. Cl.
*H01L 33/00* (2010.01)
*C09K 11/78* (2006.01)
*C09K 11/08* (2006.01)

(52) U.S. Cl. .......... 252/301.4 R; 252/301.6 R; 313/486; 313/487

(58) Field of Classification Search ........... 252/301.4 R, 252/301.6 R; 313/486, 487
See application file for complete search history.

(56) References Cited

U.S. PATENT DOCUMENTS

| 5,520,847 | A | | 5/1996 | Satoh et al. |
| 5,770,111 | A | * | 6/1998 | Moriyama et al. ..... 252/301.4 R |
| 6,190,577 | B1 | * | 2/2001 | Hase et al. ............. 252/301.4 R |
| 6,267,911 | B1 | * | 7/2001 | Yen et al. ............... 252/301.4 R |
| 6,315,924 | B1 | * | 11/2001 | Isoda ...................... 252/301.4 R |
| 7,830,472 | B2 | * | 11/2010 | Kawana et al. ................ 349/61 |
| 2004/0100181 | A1 | | 5/2004 | Hamada et al. |

(Continued)

FOREIGN PATENT DOCUMENTS

EP     1 985 683 A1    10/2008

(Continued)

OTHER PUBLICATIONS

Jeong et al, "First applicability of ZnGa2O4:Ge+4,Li+,Mn2+ phoshor for a plasme display panel", Solid Satae Communication, 139, Jun. 16, 2006, pp. 157-160.*

(Continued)

*Primary Examiner* — Carol M Koslow
(74) *Attorney, Agent, or Firm* — Oblon, Spivak, McClelland, Maier & Neustadt, L.L.P.

(57) ABSTRACT

To provide a phosphor having nearly spherical shapes, the phosphor has an elemental ratio represented by the formula below, and contains at least two kinds of Li, Na, K, Rb, Cs, P, Cl, F, Br, I, Zn, Ga, Ge, In, Sn, Ag, Au, Pb, Cd, Bi and Ti.

$$M^1_a M^2_b M^3_c O_d$$

($M^1$ represents Cr, Mn, Fe, Co, Ni, Cu, Ce, Pr, Nd, Sm, Eu, Tb, Dy, Ho, Er, Tm or Yb, $M^2$ mainly represents a bivalent metal element, $M^3$ mainly represents a trivalent metal element, and a, b, c and d are $0.0001 \leq a \leq 0.2$, $0.8 \leq b \leq 1.2$, $1.6 \leq c \leq 2.4$ and $3.2 \leq d \leq 4.8$, respectively.)

30 Claims, 22 Drawing Sheets

U.S. PATENT DOCUMENTS

| | | | |
|---|---|---|---|
| 2009/0026920 A1* | 1/2009 | Shimomura et al. | 313/504 |
| 2009/0033201 A1 | 2/2009 | Shimooka et al. | |
| 2009/0166584 A1 | 7/2009 | Shimooka et al. | |

FOREIGN PATENT DOCUMENTS

| | | | |
|---|---|---|---|
| JP | 2006045526 | | 2/2006 |
| WO | WO 2005/111707 | * | 11/2005 |
| WO | WO 2006/008935 | * | 1/2006 |
| WO | WO 2006/093015 A1 | | 9/2006 |
| WO | WO 2006/098450 A1 | | 9/2006 |

OTHER PUBLICATIONS

U.S. Appl. No. 12/766,600, filed Apr. 23, 2010, Kawana, et al.

Y.S. Jeong, et al., "First applicability of $ZnGa_2O_4$:$Ge^{4+}$, $Li^+$, $Mn^{2+}$ phosphor for a plasma display panel", Solid State Communications, vol. 139, No. 4, Jul. 1, 2006, XP025127350, pp. 157-160.

Tzu-Piao Tang, et al., "The photoluminescence of $SrAl_2O_4$:Sm phosphors", Ceramics International, vol. 32, No. 6, Jan. 1, 2006, XP024914341, pp. 665-671.

\* cited by examiner

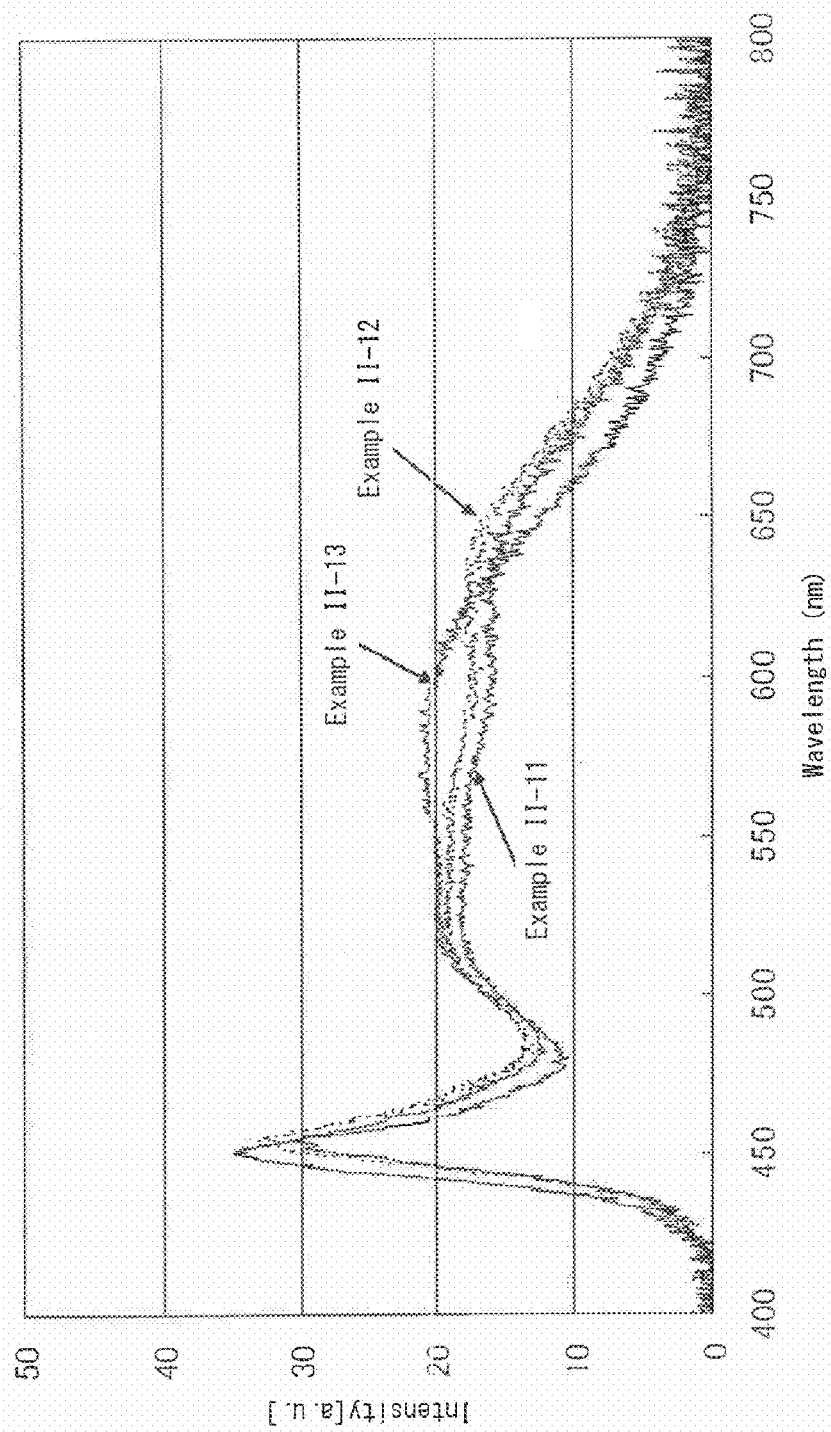

PHOSPHOR AND PRODUCTION METHOD THEREOF, AND PHOSPHOR-CONTAINING COMPOSITION, LIGHT EMITTING DEVICE, IMAGE DISPLAY AND LIGHTING SYSTEM

TECHNICAL FIELD

The present invention relates to a phosphor and a production method thereof. More particularly, it relates to a phosphor and a production method thereof, and also to a phosphor-containing composition, a light emitting device, an image display and a lighting system using the phosphor.

BACKGROUND ART

In recent years, white light emitting devices using a gallium nitride (GaN) based light-emitting diode (LED) as semiconductor light emitting device and a phosphor as wavelength conversion material in combination have been attracting attention as light sources of image displays or lighting systems for their advantages such as low power consumption and long lasting quality. With this attention, development of a phosphor that is easy to manufacture, high in emission intensity, uniform in particle diameter, and further, capable of realizing a light emitting device with high color rendering has been desired.

Patent Document 1 discloses a candidate of such a phosphor that can meet the above-mentioned requirements. The phosphor, represented by the general formula (X) below, has its maximum emission peak of the emission spectrum within the wavelength range of from 485 nm to 555 nm and comprises a compound having a specific chemical composition as its host crystal. In the host crystal, trivalent cerium ($Ce^{3+}$) is at least contained as activator element (luminescent center element). This phosphor is hereinafter abbreviated as "CSO phosphor", as appropriate.

$$M^1_a M^2_b M^3_c O_d \quad (X)$$

(In the formula (X), $M^1$ represents an activator element including at least Ce, $M^2$ represents a bivalent metal element, and $M^3$ represents a trivalent metal element. a, b, c and d are numbers in the ranges of $0.0001 \leq a \leq 0.2$, $0.8 \leq b \leq 1.2$, $1.6 \leq c \leq 2.4$ and $3.2 \leq d \leq 4.8$, respectively.)

[Patent Document 1] Japanese Patent Laid-Open Publication (Kokai) No. 2006-45526

DISCLOSURE OF THE INVENTION

Problem to be Solved by the Invention

It is preferable that the phosphor that converts the wavelength of the LED light emits light isotropically. However, when the CSO phosphor represented by the aforementioned general formula (X), which has $CaFe_2O_4$-type crystal structure, is manufactured by a synthetic method based on an ordinary solid state reaction, the manufactured CSO phosphor exhibits an indefinite crystalline structure in which the particles are fused together. Consequently, this phosphor has a problem of low particle dispersibility and therefore it has been impractical. In addition, the crystalline structure of an acicular phosphor is usually difficult to be aligned uniformly in the liquid medium to be described later, and therefore, the light of a white LED using such a phosphor will be spotted. From such reasons, a phosphor having nearly spherical shape, in addition to superior luminescent characteristics such as emission intensity, has been desired.

On the other hand, in an LED, which is a highly efficient light source, considerable portion of the electric energy supplied is consumed as heat. Therefore, in a large-current device such as one for an illumination, the temperature of the light emitting device sometimes rises up to near 180° C. In most of phosphors, the brightness decreases at high temperatures, but this tendency is not desirable. Hereinafter, smaller degree of brightness decrease at high temperatures will be referred to as "superiority in temperature characteristics".

The temperature characteristics of the conventional phosphors have been insufficient. The temperature characteristics of the phosphor disclosed in Patent Document 1 has been improved relative to that of $(Y,Gd)_3Al_5O_{12}$:Ce (hereinafter abbreviated as "YAG:Ce" as appropriate), but it is still inadequate.

The present invention has been made to solve the above problems. The first object thereof is to provide a phosphor having nearly spherical shape and a production method thereof, and also to provide a phosphor-containing composition, a light emitting device, an image display and a lighting system using the phosphor. In this context, "nearly spherical shape" means, for example, that the phosphor has a low aspect ratio. Aspect ratio means the ratio between the major axis and the minor axis of a particle. The lower the aspect ratio is, the more spherical the particle shape is.

In addition, the second object of the present invention is to provide a phosphor having improved temperature characteristics and a production method thereof, and also to provide a phosphor-containing composition, a light emitting device, an image display and a lighting system using the phosphor.

Means for Solving the Problem

The inventors of the present invention have made an intensive investigation to solve the above problems. In consequence, they have found that coexistence of a specific compound during the firing process of phosphor can make phosphor consist of single particles due to reduced fusing of the particles and have nearly spherical shapes.

The present inventors have also found that the brightness of the phosphor having composition represented by the aforementioned general formula (X) is high and tends to decrease less at high temperatures when $M^1$ is within a specific concentration range. In addition, a further study revealed that it is preferable that $M^1$ is distributed in the crystal uniformly and the distribution can not be identified just by a composition analysis of the resultant phosphor. Therefore, the present inventors made a detailed investigation on the relationship between luminescent color and non-luminous object color of a phosphor and its luminescent characteristics such as brightness and the like, and found that a phosphor of which non-luminous object color is within a specific range has good luminescent characteristics and temperature characteristics.

By these findings, the present inventors completed the present invention.

Namely, the subject matter of the present invention lies in a phosphor having an elemental ratio represented by the formula [1] and containing at least two kinds of elements selected from the group consisting of Li, Na, K, Rb, Cs, P, Cl, F, Br, I, Zn, Ga, Ge, In, Sn, Ag, Au, Pb, Cd, Bi and Ti.

$$M^1_a M^2_b M^3_c O_d \quad [1]$$

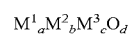

(In the formula [1], $M^1$ represents at least one kind of element selected from the group consisting of Cr, Mn, Fe, Co, Ni, Cu, Ce, Pr, Nd, Sm, Eu, Tb, Dy, Ho, Er, Tm and Yb, $M^2$ mainly represents a bivalent metal element, $M^3$ mainly represents a trivalent metal element, a represents a number in the range of $0.0001 \leqq a \leqq 0.2$, b represents a number in the range of $0.8 \leqq b \leqq 1.2$, c represents a number in the range of $1.6 \leqq c \leqq 2.4$, and d represents a number in the range of $3.2 \leqq d \leqq 4.8$.).

Another subject matter of the present invention lies in a phosphor having an elemental ratio represented by the formula [1'].

$$M^1_a M^2_b M^3_c O_d \quad [1']$$

(In the formula [1'], $M^1$ represents at least one kind of element selected from the group consisting of Cr, Mn, Fe, Co, Ni, Cu, Ce, Pr, Nd, Sm, Eu, Tb, Dy, Ho, Er, Tm and Yb, $M^2$ mainly represents a bivalent metal element, $M^3$ mainly represents a trivalent metal element, a represents a number in the range of $0.003 < a < 0.01$, b represents a number in the range of $0.8 \leqq b \leqq 1.2$, c represents a number in the range of $1.6 \leqq c \leqq 2.4$, and d represents a number in the range of $3.2 \leqq d \leqq 4.8$.).

In this case, it is preferable that $M^2$ is at least one kind of metal element selected from the group consisting of Mg, Ca, Zn, Sr, Cd and Ba, and $M^3$ is at least one kind of metal element selected from the group consisting of Al, Sc, Ga, Y, In, La, Gd, Yb and Lu.

Further, it is preferable that the phosphor of the present invention satisfies the following formula [2] and/or formula [3].

$$Br(125)/Br(25) \geqq 0.7 \quad [2]$$

$$Br(160)/Br(25) \geqq 0.5 \quad [3]$$

(In the above formula [2] and [3], Br(25) is brightness of the above-mentioned phosphor when excited by a light having wavelength of 455 nm at 25° C., Br(125) is brightness of the above-mentioned phosphor when excited by a light having wavelength of 455 nm at 125° C., Br(160) is brightness of the above-mentioned phosphor when excited by a light having wavelength of 455 nm at 160° C.).

Still another subject matter of the present invention lies in a phosphor emitting light at room temperature and having a crystal phase of $CaFe_2O_4$-type crystal structure, the percentage of the number of the phosphor particles of which average circularity is smaller than 85% being 10% or less.

In this case, it is preferable that the value QD, represented by the equation, "$QD=(D_{75}-D_{25})/(D_{75}+D_{25})$", where $D_{25}$ and $D_{75}$ are the values of the particle diameter in the weight-standard particle size distribution curve at integrated values of 25% and 75% respectively, is 0.24 or smaller.

Still another subject matter of the present invention lies in a phosphor emitting light at room temperature and having a crystal phase of $CaFe_2O_4$-type crystal structure and weight-average median diameter $D_{50}$ of 10 μm or larger, the value QD, being 0.27 or smaller.

Still another subject matter of the present invention lies in a phosphor having the maximum emission peak in the wavelength range of from 485 nm to 555 nm and a crystal phase of $CaFe_2O_4$-type crystal structure, wherein the percentage of the number of the particles of which aspect ratio is 3 or smaller is 60% or more.

In this case, it is preferable that the non-luminous object color of the phosphor of the present invention represented by $L^*, a^*, b^*$ color space satisfies $100 \leqq L^* \leqq 110$, $-30 \leqq a^* \leqq -15$ and $45 \leqq b^* \leqq 70$, and the color coordinates x and y, in CIE standard calorimetric system, of the luminescent color at the time of excitation with light of 455 nm wavelength satisfy $0.320 \leqq x \leqq 0.360$ and $0.570 \leqq y \leqq 0.600$ respectively.

Further, it is preferable that the phosphor of the present invention contains at least one kind of element selected from the group consisting of Cr, Mn, Fe, Co, Ni, Cu, Ce, Pr, Nd, Sm, Eu, Tb, Dy, Ho, Er, Tm and Yb, at least one kind of metal element selected from the group consisting of Mg, Ca, Zn, Sr, Cd and Ba, and at least one kind of metal element selected from the group consisting of Al, Sc, Ga, Y, In, La, Gd, Yb and Lu.

Further, it is preferable that the phosphor of the present invention has an elemental ratio represented by the formula [1].

Further, it is preferable that the phosphor of the present invention contains at least two kinds of elements selected from the group consisting of Li, Na, K, Rb, Cs, P, Cl, F, Br, I, Zn, Ga, Ge, In, Sn, Ag, Au, Pb, Cd, Bi and Ti in a concentration range of from 1 ppm to 5000 ppm.

Further, it is preferable that the phosphor of the present invention contains at least two kinds of elements selected from the group consisting of Li, K, P and Cl in concentration ranges of $1 \text{ ppm} \leqq Li \leqq 500 \text{ ppm}$, $1 \text{ ppm} \leqq K \leqq 500 \text{ ppm}$, $0 \text{ ppm} \leqq P \leqq 1000 \text{ ppm}$ and $0 \text{ ppm} < Cl \leqq 1000 \text{ ppm}$.

Further, it is preferable that the phosphor of the present invention contains at least one kind of element selected from the group consisting of Zn, Ga, Ge, In and Sn in a concentration range of from 1 ppm to 500 ppm.

Further, it is preferable that $M^1$ contains at least Ce, $M^2$ contains at least Ca and/or Sr, and $M^3$ contains at least Sc.

Further, it is preferable that at least two kinds of elements selected from the group consisting of Li, Na, K, Rb, Cs, P, Cl, F, Br, I, Zn, Ga, Ge, In, Sn, Ag, Au, Pb, Cd, Bi and Ti are contained in the crystal phase of the phosphor of the present invention.

Further, in the phosphor of the present invention, it is preferable that the electric conductivity of the supernatant fluid that is obtained by leaving the phosphor, dispersed in 10-fold amount of water as ratio by weight, to stand for 1 hour is 10 mS/m or lower.

Further, in the phosphor of the present invention, it is preferable that the emission spectrum at the time of excitation with light of 455 nm wavelength at 25° C. has the maximum emission peak in the wavelength range of from 500 nm to 535 nm.

Still another subject matter of the present invention lies in a method for producing a phosphor of the present invention, comprising a step of: heating material which contains two or more kinds selected from the group consisting of a halide of an alkaline-earth metal, a phosphate of an alkali metal, a halide of an alkali metal and a sulfate of an alkali metal.

In this case, it is preferable that the material contains a compound which forms a metal whose melting point or sublimation point is 1200° C. or lower by heating and/or a compound which forms an oxide of an alkali metal by heating.

Further, it is preferable that the material contains two or more kinds selected from the group consisting of $CaCl_2$, $Li_3PO_4$, $KH_2PO_4$, KCl and $Li_2SO_4$.

Further, it is preferable that the material contains one or more kinds selected from the group consisting of ZnO, $Ga_2O_3$, $GeO_2$, $In_2O_3$, $SnO_2$ and $K_2CO_3$. Particularly, it is preferable that the material contains ZnO, and/or $K_2CO_3$.

Still another subject matter of the present invention lies in a method for producing a phosphor of the present invention, wherein a coprecipitation oxide that is obtained by heating a coprecipitated compound containing at least two kinds of constituent elements of the above-mentioned phosphor is used as the material.

In this case, it is preferable that a coprecipitation oxide that is obtained by heating a coprecipitated compound containing at least two kinds of constituent elements of the above-mentioned phosphor is used as the material.

Further, it is preferable that at least two kinds of the constituent elements of the above-mentioned phosphor are Sc and Ce.

Still another subject matter of the present invention lies in a phosphor-containing composition comprising: the phosphor of the present invention and a liquid medium.

Still another subject matter of the present invention lies in a light emitting device comprising: a first luminous body and a second luminous body which emits visible light when irradiated with light from the above-mentioned first luminous body, wherein the above-mentioned second luminous body comprises, as a first phosphor, one or more kinds of the phosphors of the present invention.

In this case, it is preferable that the above-mentioned second luminous body comprises, as a second phosphor, one or more kinds of phosphors of which emission peak wavelengths are different from that of the above-mentioned first phosphor.

Further, it is preferable that the above-mentioned first luminous body has an emission peak in the range of from 420 nm to 500 nm, and the above-mentioned second luminous body comprises, as the second phosphor, at least one kind of a phosphor having an emission peak in the wavelength range of from 570 nm to 780 nm.

Further, it is preferable that the above-mentioned first luminous body has an emission peak in the range of from 300 nm to 420 nm, and the above-mentioned second luminous body comprises, as the second phosphor, at least one kind of a phosphor having an emission peak in the wavelength range of from 420 nm to 490 nm and at least one kind of a phosphor having an emission peak in the wavelength range of from 570 nm to 780 nm.

Still another subject matter of the present invention lies in an image display comprising a light emitting device of the present invention as a light source.

Still another subject matter of the present invention lies in a lighting system comprising a light emitting device of the present invention as a light source.

Advantageous Effect of the Invention

According to the present invention, at least either a phosphor having appropriate dispersibility and packing density in practical use due to its nearly spherical shape as well as having high brightness or a novel phosphor having good temperature characteristics, namely less decrease in brightness at high temperatures, can be provided. And also, according to the present invention, a production method of the phosphor, a phosphor-containing composition, a light emitting device, an image display and a lighting system using the phosphor can be provided.

BRIEF DESCRIPTION OF THE DRAWINGS

Both

FIG. 22 is a graph showing the emission spectra of the surface-mount white light emitting devices produced in Examples II-11 to II-13 of the present invention.

EXPLANATION OF LETTERS OR NUMERALS

Figure 1:
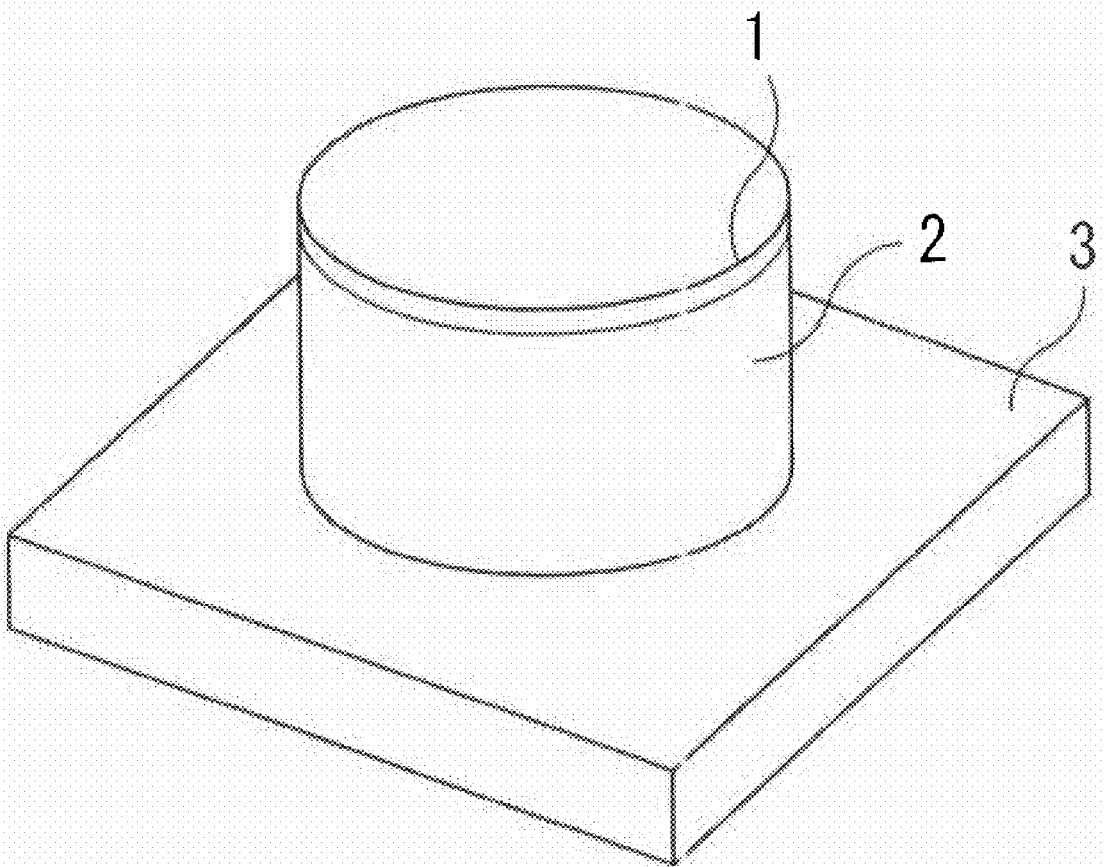
FIG. 1 is a schematic perspective view illustrating the positional relationship between an excitation light source (first luminous body) and a phosphor-containing part (second luminous body), in an example of the light emitting device of the present invention.

1: second luminous body
2: surface emitting type GaN-based LD
3: substrate
4: light emitting device
5: mount lead
6: inner lead
7: first luminous body 8: phosphor-containing resinous part
9: conductive wire
10: mold member
11: surface-emitting lighting system
12: holding case
13: light emitting device
14: diffusion plate
22: first luminous body
23: phosphor-containing resinous part
24: frame
25: conductive wire
26: electrode
27: electrode
121: blue LED
122: phosphor-containing part
123: frame
124: gold wire
125: electrode
126: electrode

BEST MODES FOR CARRYING OUT THE INVENTION

The present invention will be explained below by referring to an embodiment and examples. However, it is to be noted that the present invention is by no means restricted to the following embodiment and examples, and any modifications can be added thereto insofar as they do not depart from the scope of the present invention.

Each composition formula of the phosphors in this Description is punctuated by a pause mark (,). Further, when two or more elements are juxtaposed with a comma (,) in between, one kind of or two or more kinds of the juxtaposed elements can be contained in the composition formula in any combination and in any composition. For example, a composition formula, "(Ca,Sr,Ba)Al$_2$O$_4$:Eu", inclusively indicates all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu" and "Ca$_{1-x-y}$Sr$_x$Ba$_y$Al$_2$O$_4$:Eu" (here, in these formulae, 0<x<1, 0<y<1, 0<x+y<1).

[1. Phosphor A]
Phosphor A of the present invention has an elemental ratio represented by the formula [1] below and contains at least two kinds of elements selected from the group consisting of Li, Na, K, Rb, Cs, P, Cl, F, Br, I, Zn, Ga, Ge, In, Sn, Ag, Au, Pb, Cd, Bi and Ti.

$$M^1{}_aM^2{}_bM^3{}_cO_d \qquad [1]$$

(In the formula [1],
M$^1$ represents at least one kind of element selected from the group consisting of Cr, Mn, Fe, Co, Ni, Cu, Ce, Pr, Nd, Sm, Eu, Tb, Dy, Ho, Er, Tm and Yb,
M$^2$ mainly represents a bivalent metal element,
M$^3$ mainly represents a trivalent metal element,
a represents a number in the range of $0.0001 \leq a \leq 0.2$,
b represents a number in the range of $0.8 \leq b \leq 1.2$,
c represents a number in the range of $1.6 \leq c \leq 2.4$, and
d represents a number in the range of $3.2 \leq d \leq 4.8$.)

[1-1. Composition of Phosphor A]
The composition of phosphor A of the present invention has a composition ratio of each element which is represented by the formula [1] below. The major constituent elements of phosphor A of the present invention are the elements represented in the following formula [1]. And usually, phosphor A of the present invention contains a trace element originating from a flux to be described later inside and/or outside of the crystal of the phosphor having a composition of the formula [1] below.

$$M^1{}_aM^2{}_bM^3{}_cO_d \qquad [1]$$

In the formula [1], M$^1$ represents at least one kind of element selected from the group consisting of Cr, Mn, Fe, Co, Ni, Cu, Ce, Pr, Nd, Sm, Eu, Tb, Dy, Ho, Er, Tm and Yb. M$^1$ in the formula [1] is an activator element (luminescent center ion) contained in the host crystal to be described later.

Ce is preferable as M$^1$ among the aforementioned group, and therefore, it is preferable that M$^1$ contains at least Ce. This is because Ce-originated luminescence is a 5d-4f transition (an allowed transition), which is high in transition probability, and therefore a Ce-containing phosphor exhibits high emission efficiency.

In addition, M$^1$ may contain two or more kinds of elements selected from the aforementioned group in any combination and in any ratio. Particularly, it is preferable that Ce and other element (hereinafter, this other element is referred to as "coactivator", as appropriate) are used in combination as M$^1$, from the standpoint of light storage, chromaticity adjustment, sensitization, and the like. In this way, when Ce is used in combination with a coactivator, the amount of the coactivator relative to 1 mol of Ce is usually 0.01 mol or more, preferably 0.1 mol or more, more preferably 1 mol or more, and usually 20 mol or less, preferably 10 mol or less, more preferably 5 mol or less. As coactivator, Pr, Tb, Sm, Tm or the like can be used. For example when Pr is used as coactivator, luminescence of the Pr, coactivator, appears around 620 nm wavelength in addition to the luminescence of Ce, which preferably increases red-component luminescence.

In the formula [1], a represents concentration of activator element M$^1$. In the formula [1], a is in the range of $0.0001 \leq a \leq 0.2$. The reason why the value of coefficient a preferably falls within the above-mentioned range is that it is preferable that the luminescent center element is distributed in the host crystal with appropriate and uniform concentration in the phosphor of the present invention. Concretely, when the value of a is too small, the emission intensity tends to be low because of too small amount of luminescent center ion existing in the host crystal of phosphor A of the present invention. On the other hand, when the value of a is too large, the emission intensity tends to be low due to concentration quenching.

More detailed explanation will be given below for the case where the luminescent center element is Ce. The relationship between Ce concentration and the luminescent color is constant over relatively wide range of the concentration. However, the temperature characteristics are significantly affected by the concentration of Ce, luminescent center element, and therefore it is preferable that the value of coefficient a in the formula [1] is within the above-mentioned range. At this point, when a falls below the above-mentioned range, the brightness of the phosphor luminescence will be decreased and the phosphor may be impractical. On the other hand, when a is too large, the brightness of the phosphor at high temperatures may be largely decreased. The reason is not clear. However, it can be inferred that high Ce concentration shortens the distance between each luminescent center element and this makes interaction at high temperatures strong.

Accordingly, from the standpoint of emission intensity, it is preferable that a is usually 0.0005 or larger, particularly 0.002 or larger, and usually 0.1 or smaller, particularly 0.01 or smaller. Among them, for improving the temperature characteristics of phosphor A while maintaining the brightness of its luminescence, a is preferably smaller than 0.01 and larger than 0.003. Moreover, higher Ce concentration causes shift of the emission-peak wavelength to the longer wavelength side, leading to relative increase in amount of green luminescence, which has high spectral luminous efficiency. Therefore, from the standpoint of balance between the emission intensity and the emission-peak wavelength, it is preferable that a is usually 0.004 or larger, preferably 0.005 or larger, more preferably 0.006 or larger, and usually 0.15 or smaller, preferably 0.1 or smaller, more preferably 0.01 or smaller, much more preferably 0.009 or smaller, particularly preferably 0.008 or smaller.

In the formula [1], $M^2$ mainly represents a bivalent metal element. More specifically, $M^2$ represents at least one kind of metal element selected from the group consisting of Mg, Ca, Zn, Sr, Cd and Ba, from the standpoint of emission efficiency or the like. Among this group, it preferably contains at least one kind of metal element selected from the group consisting of Mg, Ca, Sr, Ba and Zn. It more preferably contains at least one kind of metal element selected from the group consisting of Mg, Ca and Sr. It particularly preferably contains at least one kind of metal element selected from the group consisting of Ca and Sr. In addition, $M^2$ may contain two or more kinds of elements selected from the aforementioned group in any combination and in any ratio.

In this context, "mainly represent" means that $M^2$ may include another element insofar as the luminescent characteristics are not affected. Concretely, it means that the bivalent metal element included in $M^2$ is usually 95 mole percent or more, preferably 98 mole percent or more, and more preferably 99 mole percent or more. The upper limit is ideally 100 mole percent.

When phosphor A of the present invention is prepared as green phosphor, it is preferable that $M^2$ contains at least Ca, particularly a large amount of Ca. In more concrete terms, it is particularly preferable that Ca occupies usually 50 mole percent or more, preferably 80 mole percent or more, and more preferably 90 mole percent or more of the constituent elements of $M^2$. At this point, the element that is preferably included with Ca as $M^2$ is Sr. When at least Ca and Sr are included as $M^2$, larger amount of Sr content advantageously shifts the emission-peak wavelength to the shorter wavelength side. In addition, it advantageously enlarges the weight-average median diameter of phosphor A. Though shift of the emission-peak wavelength to the shorter wavelength side has tendency to decrease the brightness, larger weight-average median diameter causes improvement in brightness. Therefore, by including appropriate amount of Sr as $M^2$, a phosphor with high brightness can be realized. A concrete range of Sr content in the $M^2$ elements is usually 1 mole percent or higher, preferably 3 mole percent or higher, and usually 30 mole percent or lower, preferably 10 mole percent or lower, more preferably 8 mole percent or lower.

When phosphor A of the present invention is prepared as blue green phosphor, it is preferable that a large amount of Sr is included as $M^2$. In more concrete terms, it is particularly preferable that Sr occupies usually 50 mole percent or more, preferably 80 mole percent or more, more preferably 90 mole percent or more of the constituent elements of $M^2$.

In the formula [1], $M^3$ mainly represents a trivalent metal element. More specifically, $M^3$ represents at least one kind of metal element selected from the group consisting of Al, Sc, Ga, Y, In, La, Gd, Yb and Lu, from the standpoint of emission efficiency or the like. Among this group, it preferably contains at least one kind of metal element selected from the group consisting of Al, Sc, Y, Gd, Yb and Lu. It more preferably contains at least one kind of metal element selected from the group consisting of Sc, Y and Gd. It particularly preferably contains at least Sc. In addition, $M^3$ may contain two or more kinds of elements selected from the aforementioned group in any combination and in any ratio.

In this context, "mainly represent" means that $M^3$ may include another element: insofar as the luminescent characteristics are not affected. Concretely, it means that the trivalent metal element included in $M^3$ is usually 95 mole percent or more, preferably 98 mole percent or more, and more preferably 99 mole percent or more. The upper limit is ideally 100 mole percent.

Preferable examples of $M^3$ can be cited as follows: Sc alone, combination of Sc and Y, combination of Sc and Al, and combination of Sc and Lu. Among them, Sc alone and combination of Sc and Y are particularly preferable.

It is preferable that $M^3$ elements include Sc because of higher emission intensity. In more concrete terms, it is preferable that Sc occupies usually 50 mole percent or more, preferably 60 mole percent or more, particularly preferably 70 mole percent or more of the constituent elements of $M^3$.

From the above-mentioned standpoints, it is preferable that phosphor A of the present invention includes at least one kind of element selected from the group consisting of Cr, Mn, Fe, Co, Ni, Cu, Ce, Pr, Nd, Sm, Eu, Tb, Dy, Ho, Er, Tm and Yb as $M^1$, at least one kind of metal element selected from the group consisting of Mg, Ca, Zn, Sr, Cd and Ba as $M^2$, and at least one kind of metal element selected from the group consisting of Al, Sc, Ga, Y, In, La, Gd, Yb and Lu as $M^3$. Particularly, it is preferable that, in the aforementioned formula [1], $M^1$ contains at least Ce, $M^2$ contains at least Ca and/or Sr, and $M^3$ contains at least Sc.

The host crystal of phosphor A of the present invention is generally a crystal of which composition formula is represented by composition formula $M^2M^3_2O_4$, which comprises $M^2$, a bivalent metal element, $M^3$, a trivalent metal element, and oxygen. Therefore, in its chemical composition ratio, b, c, and d in the formula [1] are generally 1, 2, and 4, respectively. However, in the present invention, b, c, and d in the formula [1] may not be 1, 2, and 4, respectively, depending on $M^1$, the activator element. Namely, it depends on, for example, whether $M^1$ is substituted for a crystal lattice of the metal elements ($M^2$ or $M^3$) or located at an interstice.

In the result, in the formula [1], b is a number of usually 0.8 or larger, preferably 0.9 or larger, more preferably 0.95 or larger, and usually 1.2 or smaller, preferably 1.1 or smaller, more preferably 1.05 or smaller. c is a number of usually 1.6 or larger, preferably 1.8 or larger, more preferably 1.9 or larger, and usually 2.4 or smaller, preferably 2.2 or smaller, more preferably 2.1 or smaller. d is a number of usually 3.2 or larger, preferably 3.6 or larger, more preferably 3.8 or larger, and usually 4.8 or smaller, preferably 4.4 or smaller, more preferably 4.2 or smaller. However, in the formula [1], each of a, b, c, and d is selected so that the electric charge balance of phosphor A of the present invention is kept to be neutral.

b, c, and d in the formula [1] are parameters defining the composition ratio of the host crystal of the present invention. In an ideal crystal, b=1, c=2, and d=4. However, as actual phosphor A of the present invention possibly contains various additives or lattice defects as well as the luminescent center element, b, c, and d may not be 1, 2, and 4, respectively. However, they usually fall within the aforementioned ranges. A crystal having a composition ratio that is out of the aforementioned ranges is difficult to be formed. In addition, when the charge composition is out of the aforementioned ranges, by-product of the phosphor (impurity phase) is generated, leading possibly to decrease in emission intensity.

Preferable concrete examples of the formula [1] include: $Ca_{0.995}Ce_{0.005}Sc_2O_4$, $Ca_{0.994}Ce_{0.006}Sc_2O_4$, $Ca_{0.993}Ce_{0.007}Sc_2O_4$, $Ca_{0.992}Ce_{0.008}Sc_2O_4$, $Sr_{0.1}Ca_{0.894}Ce_{0.006}Sc_2O_4$, $Sr_{0.05}Ca_{0.944}Ce_{0.006}Sc_2O_4$, $Sr_{0.1}Ca_{0.892}Ce_{0.008}Sc_2O_4$, $Sr_{0.05}Ca_{0.942}Ce_{0.008}Sc_2O_4$, $Ca_{0.992}Ce_{0.008}Sc_{1.95}Lu_{0.05}O_4$, $Ca_{0.992}Ce_{0.008}Sc_{1.9}Lu_{0.1}O_4$, $Ca_{0.992}Ce_{0.008}Sc_{1.95}Y_{0.05}O_4$, $Ca_{0.992}Ce_{0.008}Sc_{1.9}Y_{0.1}O_4$, $Ca_{0.992}Ce_{0.008}Sc_{1.95}Mg_{0.05}O_4$, $Ca_{0.992}Ce_{0.008}Sc_{1.9}Mg_{0.1}O_4$, $Sr_{0.1}Ca_{0.892}Ce_{0.008}Sc_{1.95}Lu_{0.05}O_4$, $Sr_{0.1}Ca_{0.892}Ce_{0.008}Sc_{1.9}Lu_{0.1}O_4$, $Sr_{0.05}Ca_{0.942}Ce_{0.008}Sc_{1.95}Lu_{0.05}O_4$, $Sr_{0.05}Ca_{0.942}Ce_{0.008}Sc_{1.9}Lu_{0.1}O_4$. Though, in all these compositions, the composition ratio of O (oxygen) takes the value of 4, it may be deviated from 4 within ±20% owing to deficient or excess in the oxygen.

$M^2$ and $M^3$ represent mainly bivalent and trivalent metal elements, respectively, as described earlier. However, just a small portion of $M^2$ and/or $M^3$, which are the constituent elements of phosphor A of the present invention, may be replaced by univalent, tetravalent or pentavalent metal element in order to adjust the electric charge balance or the like, insofar as it does not depart intrinsically from the scope of phosphor A of the present invention. Furthermore, phosphor A of the present invention may contain a minute amount of negative ion such as halogen element (F, Cl, Br, I), nitrogen, sulfur or selenium.

Phosphor A of the present invention contains at least two kinds of elements (hereinafter referred to as "flux component elements" as appropriate) selected from the group consisting of Li, Na, K, Rb, Cs, P, Cl, F, Br, I, Zn, Ga, Ge, In, Sn, Ag, Au, Pb, Cd, Bi and Ti. Among them, it is preferable that it contains at least two kinds of elements selected from the group consisting of Li, Na, K, Rb, Cs, P, Cl, F, Br, I, Zn, Ga, Ge, In, Sn, Ag and Au.

Among the elements exemplified above, Li, Na, K, Rb and Cs are categorized into alkali metal elements. When phosphor A of the present invention contains these alkali metal elements, its particle diameter tends to be larger. This may be because, for example, liquid or gas generated at high temperatures from the halide or oxide of these metal elements, which coexisted with the raw material of phosphor A of the present invention during heating in the manufacturing process, has the effect of promoting crystal growth. The smaller the ionic radius of the alkali metal element is, the more effect of promoting crystal growth it has. Concretely, Li is preferable.

When phosphor A of the present invention contains P, the dispersibility of the phosphor tends to be improved, and the particle shape thereof tends to become spherical. It is considered that the P forms a phosphate together with one or more other elements during heating in the manufacturing process of phosphor A of the present invention, turns to be liquid or gas at high temperatures, and then affects the phosphor.

Further, among the elements exemplified above, Cl, F, Br and I are categorized into halogen elements. When phosphor A of the present invention contains these halogen elements, its particle diameter tends to be larger. This may be because, for example, liquid or gas generated at high temperatures from the halogen compound (halide) with alkali metal, alkaline-earth metal or other metal element, which coexisted with the raw material of phosphor A of the present invention during heating in the manufacturing process, has the effect of promoting crystal growth. Among halogen elements, Cl is preferable from the standpoint of stability of its compound and low corrosivity against crucibles, furnace materials and the like.

Further, among the elements exemplified above, Zn, Ga, Ge, In, Sn, Ag and Au are elements that can be used as flux mainly in the form of oxides and halides, as described later in detail. When phosphor A of the present invention contains these elements, its particle diameter tends to be larger. Of these elements, Zn is preferable from the standpoint of its greater effect of increasing particle diameter.

The flux component elements and fluxes are selected based on the melting point, boiling point, sublimation point of the flux and the reactivity between the flux and the phosphor constituents. For producing phosphor A of the present invention, a flux that becomes liquid at high temperatures is preferably used, for example. Therefore, it is preferable that an alkali metal, alkaline-earth metal and phosphate anion are contained as flux component.

From the standpoint of both forming near spherical shape of phosphor A of the present invention and promoting its crystal growth, it is preferable that phosphor A of the present invention contains at least two kinds of elements selected from the group consisting of Li, K, P and Cl. On the other hand, from the standpoint of enlarging the weight-average median diameter of phosphor A of the present invention, it is preferable that phosphor A of the present invention contains at least one kind of element selected from the group consisting of Zn, Ga, Ge, In, Sn and K.

The flux component element can exist either inside or outside of the phosphor crystal phase (crystal lattice), but usually, it is preferable that it exists inside the crystal phase of the phosphor being included therein.

Further, phosphor A of the present invention may contain three or more kinds of these flux component elements.

In this context, a flux component element means an element corresponding to the flux to be described later. However, all of them do not necessarily originate from the flux, but they may be the elements mixed in the raw material or come to be mixed in the phosphor manufacturing process such as heating process, washing process, surface treatment and the like, which are described later.

There is no limitation on the concentration range of the flux component element contained in phosphor A of the present invention. However, it is usually 1 ppm or more, preferably 3 ppm or more, more preferably 10 ppm or more, and usually 5000 ppm or less, preferably 1000 ppm or less, more preferably 100 ppm or less. In this context, the aforementioned concentration of the flux component element means the total concentration of all the flux component elements contained in the phosphor. The flux component element contained with the aforementioned concentration range makes the particle diameter or shape of the phosphor particles preferable.

The preferable concentration range of each flux component element differs depending on the kind of the flux component element or the manufacturing condition of the washing process, surface treatment or the like.

For example, the preferred concentration range of Li contained in the crystal phase of phosphor A of the present invention is usually 1 ppm or more, preferably 2 ppm or more, more preferably 3 ppm or more, and usually 500 ppm or less, preferably 300 ppm or less, more preferably 100 ppm or less.

The preferred concentration range of K contained in phosphor A of the present invention is usually 1 ppm or more, preferably 3 ppm or more, more preferably 5 ppm or more, and usually 500 ppm or less, preferably 300 ppm or less, more preferably 100 ppm or less.

The preferred concentration range of P contained in phosphor A of the present invention is usually more than 0 ppm, preferably 50 ppm or more, more preferably 90 ppm or more, and usually 1000 ppm or less, preferably 800 ppm or less, more preferably 700 ppm or less.

The preferred concentration range of Cl contained in phosphor A of the present invention is usually more than 0 ppm, preferably 50 ppm or more, more preferably 100 ppm or more, and usually 1000 ppm or less, preferably 800 ppm or less, more preferably 600 ppm or less.

The preferred concentration range of Zn, Ga, Ge, In and Sn contained in phosphor A of the present invention is usually 1 ppm or more, preferably 5 ppm or more, more preferably 30 ppm or more, particularly preferably 50 ppm or more, and usually 500 ppm or less, preferably 300 ppm or less, more preferably 100 ppm or less. When phosphor A of the present invention contains two or more kinds of Zn, Ga, Ge, In and Sn, it is preferable that the total concentration of them falls within the aforementioned range.

A phosphor containing flux outside these ranges can not achieve the flux effect fully, and its shape may be far from spherical due to the aspect ratio larger than the desired value. In addition, too much flux component element may affect the characteristics of the phosphor or of the phosphor-containing composition. When the flux component exists outside of the phosphor crystal phase, there is no special limitation on the concentration range of the flux component element insofar as the advantageous effect of the present invention is not significantly impaired.

The concentration of the flux component in a phosphor can be measured as follows.

First, the phosphor is crushed. The crushing is performed to the extent that the weight-average median diameter $D_{50}$ of the phosphor falls within the range to be described later. Subsequently, soluble materials in the phosphor such as unreacted materials during manufacturing process are removed by washing with an acid such as hydrochloric acid or nitric acid and then washing with water. The water-washing is done to the extent that the electric conductivity of the supernatant fluid that is obtained by dispersing and settling the phosphor after the water-washing in 10-fold amount of water as ratio by weight is 5 mS/m or smaller. By carrying out elemental analysis of the phosphor satisfying the above requirement, the concentration of the flux component elements existing within the crystal phase is decided. The elemental analysis can be performed with a glow discharge mass spectrometry (GD-MS) in which the surface of the cathode consisting of the solid sample is sputtered by glow discharge and neutral particles emitted are ionized by collision with Ar or electrons in the plasma. Incidentally, the aforementioned crushing and washing with water can be omitted, when the phosphor, the measurement object, meets the aforementioned requirement without performing crushing and water washing.

[1-2. Characteristics of Phosphor A]
[1-2-1. Emission Spectrum of Phosphor A]

Phosphor A of the present invention is superior in luminescent characteristics at room temperatures to the previously known $SrY_2O_4$:Ce phosphor and the like. Phosphor A of the present invention usually has its maximum emission peak of the emission spectrum within the wavelength range of from 420 nm to 700 nm, when it is excited at a room temperature by the light having wavelength of 455 nm.

Phosphor A of the present invention is excellent in its characteristics particularly as blue green, green, yellow green and yellow phosphor. In those cases, phosphor A of the present invention is a phosphor having its maximum emission peak within the wavelength range of usually 485 nm or longer, preferably 500 nm or longer, more preferably 510 nm or longer, and usually 555 nm or shorter, preferably 535 nm or shorter, more preferably 525 nm or shorter, particularly preferably 520 nm or shorter. In this context, the room temperature means 25° C. in the present Description. When the maximum emission peak wavelength is too short, the color tends to be bluish. On the other hand, when it is too long, the color tends to be yellowish. In both cases, its characteristics as green light tends to deteriorate. When the maximum emission peak is located too far at the shorter wavelength side, its emission wavelength will overlap the luminous wavelength of the blue LED, which excites this phosphor with light of 420 nm to 485 nm wavelength. This may lead to unfavorable color rendering. On the other hand, when the maximum emission peak is located too far at the longer wavelength side, the blue green to green luminescence component lacks. This may also lead to unfavorable color rendering.

In the aforementioned emission spectrum of phosphor A of the present invention, the stronger its relative intensity of the above-mentioned maximum emission peak is, the more preferable. Actually, it is preferable that the relative intensity is 110 or larger, preferably 125 or larger, more preferably 140 or larger, and particularly preferably 150 or larger. In this context, the relative intensity of the emission peak of phosphor A of the present invention is expressed with the emission intensity of Ce-activated yttrium aluminium garnet phosphor (hereinafter referred to as "YAG:Ce" as appropriate) P46-Y3, manufactured by Kasei Optonix, Ltd., at the time of excitation with light of 455 nm wavelength taken as 100.

Further, the full width at half maximum of the peak of the emission peak, in the aforementioned emission spectrum of phosphor A of the present invention, is usually 90 nm to 120 nm.

The emission spectrum of phosphor A of the present invention, for example when $M^1$ is Ce, is not usually symmetrical, but it has a rise at right side (longer wavelength side) of the emission peak. This is because the luminescent center, $Ce^{3+}$, has two divided ground level (4f level), and therefore, the luminescence based on the transition of $Ce^{3+}$ from 5d level to 4f level includes, also in phosphor A of the present invention, two kinds of luminescences having slightly different energies being overlapped. As a result, the spectrum shows the above-mentioned rise. Incidentally, emission spectra originating from $Ce^{3+}$ do not always have such a rise. This is because two different luminescences overlapped are sometimes seen to have a single peak, owing to their intensity ratio, full width at half maximums, or the like.

For example when $M^1$ is Pr, the peak appears usually around the wavelength of 620 nm. When $M^1$ is Tb, the peak appears usually around the wavelength of 545 nm.

For example when a coactivator is used, a peak appears at the position depending on the kind of the coactivator. When Ce is used with a coactivator, a peak corresponding to the coactivator appears in addition to the Ce peak, which is around 515 nm wavelength.

For exciting phosphor A of the present invention with light having wavelength of 455 nm, a GaN-based light-emitting diode can be used, for example. The measurement of emission spectrum of phosphor A of the present invention and the calculation of its emission peak wavelength, relative peak intensity and full width at half maximum of the peak can be carried out by using a fluorescence spectrophotometer F4500 (manufactured by Hitachi, Ltd.) or a fluorescence measurement apparatus (manufactured by JASCO corporation) equipped with a 150-W xenon lamp as excitation light source and a multichannel CCD detector C7041 (manufactured by Hamamatsu Photonics K.K.) as spectrum measurement apparatus, for example.

[1-2-2. Crystal Structure of Host Crystal of Phosphor A]

The host crystal of phosphor A of the present invention is usually a crystal of which composition formula is represented by $M^2M^3_2O_4$, which consists of $M^2$, a bivalent metal element, $M^3$, a trivalent metal element, and oxygen. The crystal having a composition ratio represented by the formula above possesses usually any of the following space groups, $$Pnma, Fd\bar{3}m, P2_1/n, P2_1, P6_3, P2_1/c \qquad \text{[Chemical Formula I]}$$

depending on its constituent metal element. Among them, phosphor A of the present invention having a constitution including space group Pnma, namely, having a crystal phase of $CaFe_2O_4$-type crystal structure, is particularly preferable, because it then shows a green luminescence with high brightness. At this point, that crystal structure can be uniform or nonuniform. In other words, it is enough for phosphor A of the present invention to contain a crystal phase of $CaFe_2O_4$-type crystal structure in at least one portion of it. The content is preferably 50 weight % or more, more preferably 70 weight % or more, particularly preferably 90 weight % or more, and most preferably 100 weight %.

[1-2-3. Characteristics of Shape]

[Degree of Circularity]

Many of the particles of phosphor A of the present invention have nearly spherical shapes. More specifically, the ratio of the number of the phosphor particles of which degree of circularity is smaller than 85% is usually less than 10%, preferably 8% or less, and more preferably 7% or less. The upper limit of degree of circularity is ideally 100%. The lower limit of the above ratio of the number is ideally 0%. Phosphor A of the present invention exhibits appropriate dispersibility and packing density in practical use as well as high brightness because its particles are of nearly spherical shapes.

Degree of circularity can be measured as follows.

Before measuring the degree of circularity, the sample phosphor is dispersed by ultrasonic wave for 60 seconds using an ultrasonic washing machine (manufactured by Iuchi). Then the degree of circularity of the sample is measured using a flow particle image analyzer ("FPIA-2000", manufactured by SYSMEX CORPORATION). In addition, the average circularity can be calculated using this apparatus as follows. Namely, the particle image (picture) is taken for each particle, and then the projected area and peripheral length of the particles are decided from the particle images obtained by image processing. The circumference of the imaginary circle, which is assumed to have the same area as the projected area of the particle image, is calculated. Then the degree of circularity is calculated by dividing the circumference with the peripheral length of the particle. "The percentage of the number of the particles of which degree of circularity is smaller than 85%" is calculated as the ratio of the number of the particles having a degree of circularity which is smaller than 0.85 relative to the total number of the particles measured.

[Aspect Ratio]

Phosphor A of the present invention is characterized in its aspect ratio. Namely, the percentage of the number of the particles of which aspect ratio is 3 or smaller is usually 60% or more, preferably 70% or more, and more preferably 80% or more. There is no upper limit, but it is ideally 100%. The closer to 1 the aspect ratio is, the more preferable. Particles having aspect ratio of larger than 3 have rod shapes or acicular shapes, for example. Such shapes of particles are difficult to be dispersed in a liquid medium, and unevenness in coating and clogging in a dispenser tend to occur.

The percentage of the number of the particles of which aspect ratio is 3 or smaller is decided as follows. The photo of the phosphor is taken using a scanning electron microscope (for example, Hitachi S-4500, manufactured by Hitachi, Ltd.) usually at 500 to 5000-fold magnification. After randomly selecting 30 particles in one field of view of the micrograph obtained, their major axes and minor axes are measured with a ruler. Each aspect ratio is decided as the value of major axis/minor axis. Then the ratio of the particles having aspect ratio of 3 or smaller is calculated.

However, even a phosphor including large number of acicular particles of which average aspect ratio is usually larger than 3 can be coated, as phosphor-containing composition in which the phosphor is mixed with a liquid medium, occasionally with orientation that is well-aligned in the longitudinal direction.

The above-mentioned average aspect ratio is decided as follows. After randomly selecting 30 particles in one field of view of the micrograph, their major axes and minor axes are measured with a ruler. Each aspect ratio is decided as the value of major axis/minor axis. Then the average thereof is calculated.

[Powder Characteristics]

It is preferable that the weight-average median diameter (hereinafter referred to as "$D_{50}$" as appropriate) of phosphor A of the present invention is in the range of usually 5 μm or larger, preferably 10 μm or larger, more preferably 15 μm or larger, and usually 30 μm or smaller, preferably 20 μm or smaller. When $D_{50}$ is too small, the brightness tends to decrease and the phosphor particles tend to aggregate. On the other hand, $D_{50}$ is too large, unevenness in coating, clogging in a dispenser, or the like may occur.

From the same reason, it is preferable that phosphor A of the present invention contains as few coarse particles having particle diameter of 100 μm or larger as possible. It is more preferable that it contains as few coarse particles having particle diameter of 50 μm or larger as possible. Preferably, the contents of these coarse particles are substantially zero.

Moreover, it is preferable that the value of QD of phosphor A of the present invention is small. Concretely, it is preferable that it is usually 0.3 or smaller, more preferably 0.27 or smaller, and particularly preferably 0.24 or smaller. With large value of QD, namely with wide particle size distribution, the local distribution of phosphor A in the phosphor-containing composition to be described later may be changed, due to fast sedimentation of the large particles in the curing process of the composition.

The particle diameter in the present Description is a value obtained from the weight-standard particle size distribution curve. The weight-standard particle size distribution curve can be obtained from the measurement of the particle size distribution by laser diffraction/scattering method. Specifically, each substance (measurement object, namely, phosphor) is dispersed in water under the condition of 25° C. temperature and 70% humidity. Then particle size distribution is measured by a laser diffraction particle size analyzer (LA-300, manufactured by HORIBA, Ltd.) at particle diameter range of 0.1 μm to 600 μm. The value of particle diameter whose integrated value is 50% in this weight-standard particle size distribution curve is weight-average median diameter ($D_{50}$). QD is defined as "$QD=(D_{75}-D_{25})/(D_{75}+D_{25})$", where $D_{25}$ and $D_{75}$ are the values of the particle diameter at integrated values of 25% and 75%, respectively. A small value of QD means a narrow particle size distribution.

[Particle Shape and Single Particle Ratio]

An observation of the particle shapes of phosphor A of the present invention can tell that the phosphor has much rate of single particles therein. A single particle means a particle consisting of single particle.

Phosphor A of the present invention usually includes both single particles and other kind of particles. The ratio of single particles (single particle ratio) in phosphor A of the present invention is usually 70% or more, preferably 75% or more, and more preferably 80% or more, in number. There is no upper limit, but it is ideally 100%. High single particle ratio advantageously realizes uniform dispersibility of the phosphor when dispersing it in a sealing material such as a resin and also uniform luminescent properties.

There is no limitation on the means of observing the particle shape insofar as it is a microscope of an appropriate magnification. However, it is preferable to perform the observation using photos taken with a scanning electron microscope (SEM). From the standpoint of ease in observation, it is usually preferable to set the magnification at 1000 to 3000 times.

The single particle ratio can be calculated as follows. For example, 30 particles in one field of view of the scanning electron micrograph are randomly selected. The particles with and without a grain boundary induced by fusing in each particle image are separated, and then the number of each kind of the particles is counted. The single particle ratio can be calculated as the ratio of the particles without a grain boundary relative to this total number (namely, 30). A grain boundary means a line or a surface where single crystals having different crystal orientations are contacting. Concretely, a particle showing an apparent line inside by its SEM photo is counted as a particle with a grain boundary.

[1-2-4. Luminescent Color of Phosphor A]

Phosphor A of the present invention exhibits superior characteristics particularly when used as green or yellow green phosphor. In such a case, the color coordinates x and y, in CIE standard calorimetric system, of the luminescent color at the time of excitation with light of 455 nm wavelength are usually as follows. The color coordinate x is usually 0.320 or larger, preferably 0.330 or larger, particularly preferably 0.335 or larger, and usually 0.360 or smaller, preferably 0.350 or smaller, more preferably 0.345 or smaller, particularly preferably 0.339 or smaller. On the other hand, the color coordinate y is usually 0.570 or larger, preferably 0.580 or larger, and usually 0.600 or smaller, preferably 0.590 or smaller. The luminescent color out of the above-mentioned range may deteriorate the color purity of the phosphor as green or yellow green phosphor. The values of color coordinates x and y can be calculated from the emission spectrum of from 480 nm to 800 nm, in accordance with JIS Z8701.

[1-2-5. Excitation Spectrum of Phosphor A]

There is no limitation on the excitation spectrum of phosphor A of the present invention. However, it emits a visible light when excited by a light having either one of the following two wavelength ranges: usually 380 nm or longer, preferably 400 nm or longer, more preferably 420 nm or longer, and usually 500 nm or shorter, preferably 490 nm or shorter, more preferably 480 nm or shorter; and usually 220 nm or longer, preferably 230 nm or longer, more preferably 240 nm or longer, and usually 360 nm or shorter, preferably 330 nm or shorter, more preferably 320 nm or shorter. In addition, the peak of the excitation spectrum exists usually in the wavelength range of from 430 nm to 470 nm. Therefore, phosphor A of the present invention can convert lights in the visible light region, particularly in the blue region efficiently. As a result, the phosphor can be used preferably in combination with a semiconductor light emitting device emitting a visible light.

[1-2-6. Non-Luminous Object Color of Phosphor A]

The non-luminous object color of phosphor A of the present invention in $L^*$, $a^*$, $b^*$ color space at the room temperature (25° C.) is usually as follows.

Namely, $L^*$ is usually 100 or larger, preferably 102 or larger, and usually 110 or smaller, preferably 108 or smaller, particularly preferably 105 or smaller. When $L^*$ is too small, the luminescence of the phosphor may be weakened. The $L^*$ from the value of 102 to 105 inclusive is particularly preferable, because then the non-luminous object color is pale green, the temperature characteristics is excellent, and the fluorescence is well-balanced between the temperature characteristics and emission intensity.

$a^*$ is usually −30 or larger, preferably −28 or larger, and usually −15 or smaller, preferably −18 or smaller, more preferably −24 or smaller. Since too large $a^*$ has a tendency to lessen the entire luminous flux of the phosphor luminescence, $a^*$ is preferably small.

Further, $b^*$ is usually 45 or larger, preferably 50 or larger, particularly preferably 52 or larger, and usually 70 or smaller, preferably 60 or smaller. Since too small $b^*$ is unsuitable for improving the emission efficiency of the light emitting device produced using phosphor A of the present invention, $b^*$ is preferably large.

The non-luminous object color in $L^*$, $a^*$, $b^*$ color space is defined in JIS Z8729. Further, the non-luminous object color of phosphor A of the present invention can be measured with, for example, a commercially available apparatus for measuring non-luminous object color (such as CR-300 manufactured by MINOLTA).

In a phosphor, in many cases, the luminescent center element absorbs the excitation light and emits a light having a different wavelength from that of the excitation light absorbed. The non-luminous object colors of many kinds of phosphors, such as for a CRT, for a fluorescent lamp and the like, are white in their powder shapes, which means that there are very few that have distinct non-luminous object colors.

On the other hand, white light emitting devices utilizing a blue semiconductor light emitting device (blue LED) and a phosphor in combination have been developed recently. As a typical phosphor used for this white light emitting device, Ce-activated yttrium aluminium garnet (hereinafter referred to as "YAG:Ce", as appropriate) is known. In this white light emitting device, the phosphor is excited by the blue light from a blue LED and emits light of yellow, a complementary color of blue. Further, white light emitting devices have been developed in which a green and red phosphors are used in addition to YAG:Ce or the like for the sake of improving the color rendering of the white light emitting devices. Many of the phosphors used for these conventional white light emitting devices have distinct non-luminous object colors.

The cause of coloration of inorganic crystals can be considered to be either one of the following three.

(1) Coloration due to ligand field absorption band (crystalline field coloration)

(2) Coloration due to transition between molecular orbitals (3) Coloration due to transition within a substance having energy bands Of these, the coloration caused by (1) is due to the existence of elements having an electron state not filling inner shells completely, such as transition metal elements and rare-earth elements. Namely, the excitation state owing to unpaired electrons, originating from incompletely filled inner shells, corresponds to a visible light spectrum, and this leads to the coloration of a substance.

Therefore, it is considered that the coloration of phosphors is caused by the above (1), because luminescent center elements used in most of phosphors are transition metal elements or rare-earth elements, and host crystals, which contain no luminescent center elements, show no coloration.

From the above reason, it can be considered that the coloration unique to phosphors which can be observed in the non-luminous object colors of phosphors is caused by superimposing the reflected light having high spectral reflectance on the luminescence of the phosphor itself due to visible light absorption. When the non-luminous object color is indicated using L*, a*, b* color space, L* does not usually exceed 100 because generally an object that will not emit light by radiation of a light is treated. However, in phosphor A of the present invention, it may possibly exceed 100 because a light emitted by an excitation light radiated from a light source is superimposed on the reflected light.

Since an increased concentration of the luminescent center element in phosphor A of the present invention induces concentration quenching phenomenon, locally high concentration of the luminescent center element is not preferable from the standpoint of emission efficiency. On the other hand, in an area where the concentration of the luminescent center element is extremely low, the luminescence is weak because there are only few luminescent centers. Therefore, it is preferable that the luminescent center elements are distributed with appropriate and uniform concentration in the host crystal. However, uniform distribution of the luminescent center elements, which was included in the raw materials, in the phosphor crystal lattice is not generally secured. However, because the non-luminous object color is induced by crystalline field coloration, as described above, the non-luminous object color can tell the concentration of the luminescent center ions in the crystal. Namely, when the two phosphors, which were prepared by firing mixture of materials having the same proportion of a luminescent center element, have the same non-luminous object colors, it can be said that the distributions of their luminescent center elements in their crystals are the same. Namely, remarks mentioned above can not be inferred only from the emission spectrum, but can be clarified just after finding that the phosphor has a determined non-luminous object color.

In this way, non-luminous object color shows the state of existence of the luminescent center elements macroscopically, and therefore, specifying the luminescent color and non-luminous object color can determine the type of phosphor. Accordingly, it is preferable that the non-luminous object color, in the L*, a*, b* color space, of phosphor A of the present invention falls within the above-mentioned range. In summary, the appropriateness of the distribution of the luminescent center elements in a crystal can be judged by checking whether the non-luminous object color is within the above-mentioned range.

[1-2-7. Temperature Characteristics of Phosphor A]

Phosphor A of the present invention shows excellent temperature characteristics in a predetermined condition. Specifically, Br(125)/Br(25) and Br(160)/Br(25) satisfy the following formula [2] and/or formula [3] respectively, where Br(25), Br(125) and Br(160) are the brightnesses of phosphor A of the present invention when excited by a light having wavelength of 455 nm at 25° C., 125° C. and 160° C., respectively.

$$Br(125)/Br(25) \geq 0.7 \quad [2]$$

$$Br(160)/Br(25) \geq 0.5 \quad [3]$$

More specifically, Br(125)/Br(25) is usually 0.70 or larger, preferably 0.71 or larger, and more preferably 0.72 or larger. There is no special limitation on the upper limit, but usually it is 1.0 or smaller. On the other hand, Br(160)/Br(25) is usually 0.50 or larger, preferably 0.55 or larger, and more preferably 0.58 or larger. There is no special limitation on the upper limit, but usually it is 1.0 or smaller.

When a phosphor is used for a light emitting device, the temperature of the phosphor sometimes rises due to the heat from the light source ("first luminous body" to be described later). Particularly in a brighter light emitting device, which has been demanded in recent years, a light source having a high output level, such as a high-power LED, is sometimes used. Because of large heat generation of such a high-output light source, the temperature will rise up to a considerable level. In this case, when a phosphor having bad temperature characteristics is used for a light emitting device together with an LED or the like, the emission intensity decreases as the temperature of the operating phosphor rises. In addition, in such a case, the luminescent color of the light emitting device tends to shift due to the temperature change. In contrast, with a phosphor having good temperature characteristics, the emission intensity decrease and luminescence shift can be suppressed even when the temperature rises, which is preferable. In the present Description, such a decrease in emission intensity and shift in luminescent color associated with a temperature change are referred to as "temperature characteristics". A phosphor of which emission intensity decrease and luminescence shift with a temperature change are small is referred to as "a phosphor superior in the temperature characteristics".

In this way, in phosphor A of the present invention, there is a tendency of improvement in the temperature characteristics when the non-luminous object color of it falls within a specific range. However, a phosphor having a specific composition can achieve such an advantage. In the case of phosphor A of the present invention, when a in the formula [1] is smaller than 0.01 and larger than 0.003, this advantageous effect can be achieved. Since the phosphor composition (especially, the concentration of the luminescent center element) has a relationship with the luminescent color of the phosphor, it is also true that a phosphor having a specific luminescent color can achieve the improvement in the temperature characteristics or luminescent characteristics when it possesses a non-luminous object color in the aforementioned range. In other words, a phosphor having both the above-mentioned non-luminous object color and luminescent color can realize the advantageous effect of the present invention, which is improvement in temperature characteristics and luminescent characteristics.

Phosphor A of the present invention is superior in its temperature characteristics in a predetermined condition, as described above. Therefore, such phosphor A of the present invention can be preferably used for a light emitting device to be described later and the like.

The Br(25), Br(125) and Br(160) which are used for calculating the above-mentioned temperature characteristics can be measured, for example, using an emission spectrum measurement device of multi-channel spectrum analyzer MCPD7000 manufactured by Otsuka Electronics Co., Ltd., a brightness measurement apparatus of luminance calorimeter BM5A, a stage equipped with a cooling mechanism using a peltiert device and a heating mechanism using a heater, and a light source device equipped with a 150-W xenon lamp. In this case, the following operations are carried out concretely. A cell holding the phosphor sample is put on the stage, and the temperature is changed from 20° C. to 160° C. After verifying the surface temperature of the phosphor is held at 25° C.±1° C., 125° C.±1° C., or 160° C.±1° C., the emission spectrum of the phosphor is measured while excited with a light, which is separated using a diffraction grating, from the light source having wavelength of 455 nm. Then the brightness can be decided from the measured emission spectrum. At this point, as the measurement value of the surface temperature of the phosphor, a value that is corrected utilizing temperature values measured with a radiation thermometer and a thermocouple is used.

It is preferable that the brightness at 125° C., namely Br(125), and the brightness at 160° C., namely Br(160), are high. However, when another kind of phosphor is used in combination with a phosphor having excellent temperature characteristics such as one described above, it is preferable that the temperature characteristics of those phosphors are close to each other, from the standpoint of less color shift depending on the temperature.

[2. Phosphor B]

Phosphor B of the present invention has an elemental ratio represented by the formula [1'] below.

$$M^1_a M^2_b M^3_c O_d \quad [1']$$

(In the formula [1'], $M^1$ represents at least one kind of element selected from the group consisting of Cr, Mn, Fe, Co, Ni, Cu, Ce, Pr, Nd, Sm, Eu, Tb, Dy, Ho, Er, Tm and Yb, $M^2$ mainly represents a bivalent metal element, $M^3$ mainly represents a trivalent metal element, a represents a number in the range of $0.003 < a < 0.01$, b represents a number in the range of $0.8 \leq b \leq 1.2$, c represents a number in the range of $1.6 \leq c \leq 2.4$, and d represents a number in the range of $3.2 \leq d \leq 4.8$, respectively.)

[2-1. Composition of Phosphor B]

The composition of phosphor B of the present invention has a composition ratio of each element which is represented by the formula [1'] below. The major constituent elements of phosphor B of the present invention are the elements represented in the following formula [1']. Phosphor of the present invention may consist only of the elements shown in the formula [1'], but it usually contains any trace element (for example, an element originating from a flux to be described later) used as needed inside and/or outside of the phosphor crystal having a composition of the formula [1'] below.

$$M^1_a M^2_b M^3_c O_d \quad [1']$$

In the formula [1'], $M^1$, $M^2$, $M^3$, b, c and d are the same as those of the formula [1].

In the formula [1'], a represents a number in the range of larger than 0.003 and smaller than 0.01. At other points, a in the formula [1'] is the same as that in the formula [1]. Because a in phosphor B of the present invention is in the specific range as described above, such advantageous effects as improving the temperature characteristics without decreasing the luminescence brightness can be achieved. Further, phosphor B of the present invention does not necessarily contain a flux component element.

At other points than the above-mentioned, phosphor B of the present invention has the same composition as that of phosphor A of the present invention. However, it is preferable also for phosphor B of the present invention to contain a flux component element in the same way as phosphor A.

[2-2. Characteristics of Phosphor B]

The shapes of the particles of phosphor B of the present invention are not necessarily near spherical, but instead, the phosphor always exhibits excellent temperature characteristics. In this context, the concrete index of the temperature characteristics is the same as that explained in the section of phosphor A of the present invention.

At other points than the above-mentioned, phosphor B of the present invention has the same characteristics as those of phosphor A of the present invention. However, also phosphor B of the present invention possesses usually nearly spherical shapes in the same way as phosphor A of the present invention.

[3. Phosphor C]

Phosphor C of the present invention emits light at room temperature and has a crystal phase of $CaFe_2O_4$-type crystal structure, and the percentage of the number of the phosphor particles of which average circularity is smaller than 85% is 10% or less.

[3-1. Composition of Phosphor C]

There is no limitation on the composition of phosphor C of the present invention. However, it is preferable that it contains at least one kind of element selected from the group consisting of Cr, Mn, Fe, Co, Ni, Cu, Ce, Pr, Nd, Sm, Eu, Tb, Dy, Ho, Er, Tm and Yb, at least one kind of metal element selected from the group consisting of Mg, Ca, Zn, Sr, Cd and Ba, and at least one kind of metal element selected from the group consisting of Al, Sc, Ga, Y, In, La, Gd, Yb and Lu. Among them, it is more preferable for it to contain Ca and/or Sr as bivalent metal element, and Sc as trivalent metal element. Further, containing Ce as activator element is much more preferable. In addition, the composition of phosphor C of the present invention can be the same as that of phosphor A or phosphor B of the present invention.

[3-2. Characteristics of Phosphor C]

The luminescent characteristics of phosphor C of the present invention, which emits light at room temperature, is usually the same as that of phosphor A of the present invention.

In addition, phosphor C of the present invention possesses a crystal phase of $CaFe_2O_4$-type crystal structure. At this point, the above-mentioned crystal structure may be distributed either uniformly or nonuniformly. Accordingly, it is enough for phosphor C of the present invention to contain a crystal phase of $CaFe_2O_4$-type crystal structure in at least one portion of it. Further, the content of the crystal phase is the same as that of phosphor A of the present invention.

Many of the particles of phosphor C of the present invention have nearly spherical shapes, in the same way as in phosphor A of the present invention. More specifically, the ratio of the number of the phosphor particles of which degree of circularity is smaller than 85% is usually less than 10%. In this way, phosphor C of the present invention exhibits appropriate dispersibility and packing density in practical use as well as high brightness because of its nearly spherical particles.

At other points than the above-mentioned ones, phosphor C of the present invention usually has the same characteristics as phosphor A of the present invention. However, it is particularly preferable that the value of QD of phosphor C of the present invention is 0.24 or smaller. This can realize a phosphor having appropriate dispersibility and packing density in practical use as well as high brightness.

Incidentally, phosphor C of the present invention can be produced, for example, by means of heating material which contains two or more kinds selected from the group consisting of a halide of an alkaline-earth metal, a phosphate of an alkali metal, a halide of an alkali metal and a sulfate of an alkali metal.

[4. Phosphor D]

Phosphor D of the present invention emits light at room temperature, and has a crystal phase of $CaFe_2O_4$-type crystal structure, weight-average median diameter $D_{50}$ of 10 μm or larger and the value QD of 0.27 or smaller.

[4-1. Composition of Phosphor D]

There is no limitation on the composition of phosphor D of the present invention. However, it is preferable that it contains at least one kind of element selected from the group consisting of Cr, Mn, Fe, Co, Ni, Cu, Ce, Pr, Nd, Sm, Eu, Tb, Dy, Ho, Er, Tm and Yb, at least one kind of metal element selected from the group consisting of Mg, Ca, Zn, Sr, Cd and Ba, and at least one kind of metal element selected from the group consisting of Al, Sc, Ga, Y, In, La, Gd, Yb and Lu. Among them, it is more preferable for it to contain Ca and/or Sr as bivalent metal element, and Sc as trivalent metal element. Further, containing Ce as activator element is much more preferable. In addition, the composition of phosphor D of the present invention can be the same as that of phosphor A or phosphor B of the present invention.

[4-2. Characteristics of Phosphor D]

The luminescent characteristics of phosphor D of the present invention, which emits light at room temperature, is usually the same as that of phosphor A of the present invention.

In addition, phosphor D of the present invention possesses a crystal phase of $CaFe_2O_4$-type crystal structure. At this point, the above-mentioned crystal structure may be distributed either uniformly or nonuniformly. Accordingly, it is enough for phosphor D of the present invention to contain a crystal phase of $CaFe_2O_4$-type crystal structure in at least one portion of it. Further, the content of the crystal phase is the same as that of phosphor A of the present invention.

Further, the weight-average median diameter $D_{50}$ of phosphor D of the present invention is 10 μm or larger. In addition, the value of QD of phosphor D of the present invention is 0.27 or smaller. At other points, the powder characteristics of phosphor D of the present invention are the same as those of phosphor A of the present invention.

With this constitution of phosphor D of the present invention, a phosphor having appropriate dispersibility and packing density in practical use as well as high brightness, because of its nearly spherical particles, can be achieved.

At other points than the above-mentioned ones, phosphor D of the present invention usually has the same characteristics as phosphor A of the present invention.

Incidentally, phosphor D of the present invention can be produced, for example, by means of heating material containing a compound which forms a metal whose melting point or sublimation point is 1200° C. or lower by heating and/or a compound which forms an oxide of an alkali metal by heating.

[5. Phosphor E]

Phosphor E of the present invention has the maximum emission peak in the wavelength range of from 485 nm to 555 nm and a crystal phase of $CaFe_2O_4$-type crystal structure, wherein the percentage of the number of the particles of which aspect ratio is 3 or smaller is 60% or more.

[5-1. Composition of Phosphor E]

There is no limitation on the composition of phosphor E of the present invention. However, it is preferable that it contains at least one kind of element selected from the group consisting of Cr, Mn, Fe, Co, Ni, Cu, Ce, Pr, Nd, Sm, Eu, Tb, Dy, Ho, Er, Tm and Yb, at least one kind of metal element selected from the group consisting of Mg, Ca, Zn, Sr, Cd and Ba, and at least one kind of metal element selected from the group consisting of Al, Sc, Ga, Y, In, La, Gd, Yb and Lu. Among them, it is more preferable for it to contain Ca and/or Sr as bivalent metal element, and Sc as trivalent metal element. Further, containing Ce as activator element is much more preferable. In addition, the composition of phosphor E of the present invention can be the same as that of phosphor A or phosphor B of the present invention.

[5-2. Characteristics of Phosphor E]

Phosphor E of the present invention is a phosphor having its maximum emission peak within the wavelength range of usually 435 nm or longer, preferably 500 nm or longer, more preferably 510 nm or longer, and usually 555 nm or shorter, preferably 535 nm or shorter, more preferably 525 nm or shorter, particularly preferably 520 nm or shorter. When the maximum emission peak wavelength is too short, the color tends to be bluish. On the other hand, when it is too long, the color tends to be yellowish. In both cases, its characteristics as green light tends to deteriorate. When the maximum emission peak wavelength is located too far at the shorter wavelength side, its emission wavelength will overlap the luminous wavelength of the blue LED, which excites this phosphor with light of 420 nm to 485 nm wavelength. This may lead to unfavorable color rendering. On the other hand, when the maximum emission peak is located too far at the longer wavelength side, the blue green to green luminescence component lacks. This may also lead to unfavorable color rendering.

In addition, phosphor E of the present invention possesses a crystal phase of $CaFe_2O_4$-type crystal structure. At this point, the above-mentioned crystal structure may be distributed either uniformly or nonuniformly. Accordingly, it is enough for phosphor E of the present invention to contain a crystal phase of $CaFe_2O_4$-type crystal structure in at least one portion of it. Further, the content of the crystal phase is the same as that of phosphor A of the present invention.

Further, in phosphor E of the present invention, the percentage of the number of the particles of which aspect ratio is 3 or smaller is usually 60% or more of the entire particles, which is the same way as phosphor A of the present invention.

With this constitution of phosphor E of the present invention, a phosphor having appropriate dispersibility and packing density in practical use as well as high brightness, because of its nearly spherical particles, can be achieved.

At other points than the above-mentioned ones, phosphor E of the present invention usually has the same characteristics as phosphor A of the present invention.

Incidentally, phosphor E of the present invention can be produced, for example, by means of heating material containing at least two kinds of elements selected from the group consisting of Li, Na, K, Rb, Cs, P, Cl, F, Br, I, Zn, Ga, Ge, In, Sn, Ag, Au, Pb, Cd, Bi and Ti.

[6. Production Method of Phosphor]

The production method of phosphors A to E of the present invention will be explained in the following. In the following explanation, phosphors A to E of the present invention will be referred to simply as "phosphor of the present invention" when no distinction is made between them.

There is no special limitation on the production method of the phosphor of the present invention. Any method can be used insofar as the above-mentioned phosphor of the present invention can be obtained. For example, it can be produced by an ordinary solid state reaction. Concretely, a phosphor having a composition represented by the aforementioned formula [1] or formula [1'] can be produced as follows, for example. The material compound includes an $M^1$-source compound containing $M^1$, which is an activator element, $M^2$-source compound containing $M^2$, which is a bivalent metal element, and $M^3$-source compound containing $M^3$, which is a trivalent metal element. The pulverized and mixed material is prepared by a dry-type method, in which those material compounds are pulverized using a dry-type pulverizer (for example, hammer mill, roll mill, ball mill, jet mill and so on) and then mixed using a mixing apparatus (for example, ribbon blender, V type blender, Henschel mixer and so on), or conversely, they may be pulverized with a dry-type pulverizer after they are mixed. The pulverized and mixed material may be prepared also by a wet-type method. In such a method, those material compounds are thrown into a medium such as water, and then pulverized and mixed using a wet-type pulverizer such as a medium-stirring type pulverizer. Or otherwise, after those material compounds are pulverized using a dry-type pulverizer, the slurry, which is prepared by mixing the pulverized material thrown into water, is dried by such a method as spray dry. By firing the pulverized and mixed material obtained by heat treatment, the phosphor can be completed.

However, the phosphor is usually produced by applying heat treatment to the raw material containing the material compounds including constituent elements of the phosphor of the present invention and a flux to be described later (hereinafter, this production method will be referred to as "the production method of the present invention", as appropriate.)

[6-1. Material Compound]

As the material compound, compounds containing elements constituting the phosphor of the present invention (hereinafter referred to as "constituent elements of the phosphor" as appropriate) can be used. The examples include: oxide, hydroxide, carbonate, nitrate, sulfate, oxalate, carboxylate and halide which contain the constituent elements of the phosphor. Therefore, when the phosphor of the present invention possesses a composition mentioned earlier, oxide, hydroxide, carbonate, nitrate, sulfate, oxalate, carboxylate and halide of each $M^1$, $M^2$ and $M^3$, which are the elements constituting the phosphor can be used. Among them, since the phosphor of the present invention is an oxide phosphor, the material compounds that will become oxides by firing, such as oxide and hydroxide, can be used particularly preferably. In addition, it is preferable for the material compounds to be selected in consideration of the reactivity to the composite oxide (namely, the phosphor), no formation of $NO_x$, $SO_x$ and the like when firing, and the like. Further, for each of the elements constituting the phosphor of the present invention, the material compound can be used either as a single kind or as a mixture of two or more kinds in any combination and in any ratio.

When Ce is taken as an example of the activator element, the concrete examples of Ce-source compounds include: $Ce_2O_3$, $CeO_2$, $Ce(OH)_3$, $Ce(OH)_4$, $Ce_2(CO_3)_3$, $Ce(NO_3)_3$, $Ce_2(SO_4)_3$, $Ce(SO_4)_2$, $Ce_2(OCO)_6$, $Ce(OCOCH_3)_3$, $CeCl_3$, and $CeCl_4$.

When Mg, Ca and Sr are taken as examples of the bivalent metal element $M^2$, the concrete examples of $M^2$-source compounds corresponding to these elements are as follows. The examples of Mg-source compounds include: MgO, Mg(OH)$_2$, MgCO$_3$, Mg(OH)$_2$.3MgCO$_3$.3H$_2$O, Mg(NO$_3$)$_2$.6H$_2$O, MgSO$_4$, Mg(OCO)$_2$.2H$_2$O, Mg(OCOCH$_3$)$_2$.4H$_2$O, and MgCl$_2$. The examples of Ca-source compounds include: CaO, Ca(OH)$_2$, CaCO$_3$, Ca(NO$_3$)$_2$.4H$_2$O, CaSO$_4$.2H$_2$O, Ca(OCO)$_2$.H$_2$O, Ca(OCOCH$_3$)$_2$.H$_2$O, and CaCl$_2$. The examples of Sr-source compounds include: SrO, Sr(OH)$_2$, SrCO$_3$, Sr(NO$_3$)$_2$, Sr(OCO)$_2$, Sr(OCOCH$_3$)$_2$, and SrCl$_2$.

When Sc, Lu, Y and Al are taken as examples of the trivalent metal element $M^3$, the concrete examples of $M^3$-source compounds corresponding to these elements are as follows. The examples of Sc-source compounds include: $Sc_2O_3$, $Sc(OH)_3$, $Sc_2(CO_3)_3$, $Sc(NO_3)_3$, $Sc_2(SO_4)_3$, $Sc_2(OCO)_6$, $Sc(OCOCH_3)_3$, and $ScCl_3$. The examples of Lu-source compounds include: $Lu_2O_3$, $Lu_2(SO_4)_3$, and $LuCl_3$. The examples of Y-source compounds include: $Y_2O_3$, $Y(OH)_3$, $Y_2(CO_3)_3$, $Y(NO_3)_3$, $Y_2(SO_4)_3$, $Y_2(OCO)_6$, $Y(OCOCH_3)_3$, and $YCl_3$. The examples of Al-source compounds include: $Al_2O_3$, $Al(OH)_3$, AlOOH, $Al(NO_3)_3$.9H$_2$O, $Al_2(SO_4)_3$, and $AlCl_3$.

It is preferable that the weight-average median diameters $D_{50}$ of the above-mentioned material compounds to be used are in the range of from 7 μm to 20 μm, because the luminescent characteristics of the phosphor can be then improved.

It is preferable for the material compounds to be used after being changed into coprecipitated materials by means of coprecipitation. In the coprecipitated material, a part or all of the constituent elements of the phosphor are blended at the atomic level. The coprecipitation is usually carried out by combining material compounds containing different constituent elements of the phosphor. Therefore, the coprecipitated material obtained then contains two or more kinds of the constituent elements of the phosphor. By using the material compounds after they are coprecipitated, a phosphor in which the constituent elements of the phosphor are uniformly blended can be obtained, which leads to the realization of a phosphor with excellent emission intensity. Particularly when using a coprecipitated material containing a luminescent center element, a phosphor with more excellent emission intensity can be achieved because the luminescent center element can then be dispersed uniformly in the phosphor. In addition, by using the material compound after they are coprecipitated, it is easier for the non-luminous object color of the phosphor to fall within a preferable range (usually, it is $a^* \leq -24$).

In this context, coprecipitation is a method in which the elements dissolved in a solution, which is prepared by dissolving the material compounds in an appropriate solvent, are precipitated simultaneously using a precipitant that is different from the material compounds. The components included in the above-mentioned material compounds are then blended at the atomic level.

In order for the coprecipitated material to contain two or more kinds of the constituent elements of the phosphor as described above, usually two or more kinds of material compounds should be used.

There is no special limitation on the combination of the constituent elements of the phosphor to be included in the coprecipitated material. However, it is preferable that the solubility of the coprecipitated material, obtained as precipitates by the coprecipitation, falls within a predetermined range, from a practical standpoint. Accordingly, all the material compounds can not be coprecipitated practically, but only a combination of the material compounds corresponding to the specific constituent elements of the phosphor can be coprecipitated.

For example when the composition of the phosphor of the present invention that is obtained by the production method of the present invention is represented by the formula [1] or formula [1'], $M^1$ and $M^2$, the constituent elements of the phosphor, can be used for the coprecipitation. Among $M^1$; Ce, Pr, Nd, Sm, Eu, Tb, Dy, Ho, Er, Tm and Yb are preferable. Ce is particularly preferable. Among $M^2$; Sc, Y, La, Gd, Yb and Lu are preferable. Sc and Y are more preferable. Sc is particularly preferable.

Therefore, when the composition of phosphor of the present invention is represented by the formula [1] or formula [1'] and coprecipitated material is used, it is preferable to obtain coprecipitated material containing Sc and Ce by means of coprecipitating a material compound including Sc (Sc-source material) and a material compound including Ce (Ce-source compound). In this case, it is preferable that the coprecipitated material is prepared as an oxide that is obtained by heating the coprecipitate, which is usually retrieved as an oxalate. By using such kind of coprecipitated material as material compound a phosphor with superior characteristics can be realized.

There is no special limitation on the kind of the solvent used for the coprecipitation and any solvent can be used, insofar as it can dissolve the material compound and the coprecipitated material can be obtained. The examples of the solvent include: water, nitric acid, hydrochloric acid and sulfuric acid. These solvents may be used either as a single kind or as a mixture of two or more kinds in any combination and in any ratio.

In consideration of the solubility of the coprecipitated material which is obtained as the precipitate at the time of coprecipitation, the solvent is preferably selected as follows. Namely, the solubility of the material compound in the solvent to be used is usually 10 g/L or higher, preferably 20 g/L or higher, more preferably 30 g/L or higher. In addition, the solubility of the coprecipitated material formed in the solvent to be used is usually 1 g/L or lower, preferably 0.1 g/L or lower, more preferably 0.01 g/L or lower.

There is no limitation on the kind of precipitant to be used in the coprecipitation and any reagent can be used, insofar as the coprecipitated material can be obtained. The examples of this coprecipitating reagent include: oxalic acid, carbonic acid and ammonia. These coprecipitating reagents may be used either as a single kind or as a mixture of two or more kinds in any combination and in any ratio.

There is no limitation on the composition of the coprecipitated material obtained by the coprecipitation, insofar as it contains the constituent elements of the phosphor. However, according to the nature of the operation of coprecipitation, the coprecipitated material is obtained as a compound poorly soluble in the solvent. For example, it is obtained as an oxalate, hydroxide, carbonate, carboxylate or the like. The coprecipitated material can be obtained either as a single kind or as a mixture of two or more kinds in any combination and in any ratio, by the coprecipitation.

The coprecipitated material is preferably subjected to heat treatment to be described later after it is changed into a coprecipitation oxide by heat. In this way, the efficiency of the phosphor production can be enhanced.

The above-mentioned heating of the coprecipitated material is usually carried out in the presence of oxygen, preferably in the atmosphere. There is no limitation on the temperature condition during heating, insofar as the coprecipitated material can be oxidized. However, it is usually 800° C. or higher, preferably 900° C. or higher, more preferably 950° C. or higher, and usually 1500° C. or lower, preferably 1300° C. or lower, more preferably 1200° C. or lower. There is no limitation on the condition of pressure during heating, but heating is usually done under atmospheric pressure. There is no limitation on the heating period. However, it is usually 0.1 hour or longer, preferably 1 hour or longer, and usually 20 hours or shorter, preferably 10 hours or shorter.

It is preferable that the heating condition is adjusted so that the weight-average median diameter $D_{50}$ of the coprecipitated material falls within an appropriate range. A large weight-average median diameter $D_{50}$ of the coprecipitated material containing a trivalent metal element $M^3$ is particularly preferable, because then the particle diameter of the phosphor produced will be large and the luminescent characteristics such as brightness will be improved. More specifically, it is preferable that that the weight-average median diameter $D_{50}$ of the coprecipitated material is usually 7 µm or larger and preferably 10 µm or larger. The upper limit thereof is usually 20 µm or shorter, from the standpoint of reactivity.

Therefore, in the production method of the present invention, it is preferable that a coprecipitation oxide containing at least two kinds of constituent elements of the phosphor, which was obtained by heating a coprecipitated material prepared by coprecipitation, is used as material compound (namely, material for the phosphor). At this point, there is no special limitation on the combination of the constituent elements of the phosphor to be included in the coprecipitation oxide. However, when the phosphor represented by the afore-mentioned formula [1] or [1'] is produced, it is preferable for the coprecipitation oxide to contain at least each one or more kind of $M^1$ and $M^2$. Among them, it is preferable to contain Ce and Sc. In this way, a phosphor having particularly high characteristics can be realized.

[6-2. Mixing Method of Material]

The material compound is preferably subjected to a mixing treatment to become the pulverized and mixed material before the heat treatment. By the mixing treatment, the charged activator elements can be taken up into the crystal so that all of them can function efficiently. There is no limitation on the mixing treatment method and, for example, it can be done as follows. In a dry-type method, the material compounds are pulverized using a dry-type pulverizer, such as a hammer mill, roll mill, ball mill and jet mill, and then mixed using a mixing apparatus, such as a ribbon blender, V type blender and Henschel mixer. Or conversely, they may be pulverized with a dry-type pulverizer after they are mixed. In a wet-type method, those material compounds are thrown into a medium such as water, and then pulverized and mixed using a wet-type pulverizer such as a medium-stirring type pulverizer. Or otherwise, after those material compounds are pulverized using a dry-type pulverizer, the slurry, which is prepared by mixing the pulverized material thrown into water, is dried by such a method as spray dry.

[6-3. Heat Treatment]

The phosphor of the present invention can be obtained by applying heat treatment for firing the material compound. However, in the production method of the present invention, a flux is used as raw material together with the material compound, depending on the composition of the phosphor produced, shape and particle diameter of the phosphor particles. Therefore, it is preferable that raw material containing the material compound and the flux is subjected to the heating. The heat treatment is carried out with sufficient temperature and period for interdiffusion of each ion so as to promote the solid state reaction between the material compounds.

Concrete operation of the heat treatment is as follows: The material compound, held in a heat-resistant vessel, is heated up to a predetermined temperature.

There is no limitation on the heat-resistant vessel, and any kind can be used insofar as the intended phosphor can be obtained. For example, a crucible or a tray, made of alumina, quartz, silicon carbide, platinum or the like can be used. Among them, heat-resistant vessels made of highly purified alumina or platinum are preferably used, because they are low in reactivity with the mixture of material and therefore a phosphor of high purity and high luminescent characteristics can be obtained. A vessel made of platinum is particularly preferable. A vessel made of metal such as molybdenum or tungsten and a vessel made of boron nitride can also be used as the heat-resistant vessel preferably. An alumina vessel may possibly react with the mixture of material slightly, but it is preferable for its low cost and easy availability.

There is no limitation on the temperature condition during the heat treatment, insofar as the intended phosphor can be obtained. However, the maximum temperature to be attained during the heat treatment is usually 1200° C. or higher, preferably 1350° C. or higher, more preferably 1400° C. or higher, and usually 1800° C. or lower, preferably 1700° C. or lower, more preferably 1650° C. or lower. When the temperature is too low, the intended phosphor may not be synthesized due to insufficient solid state reaction between the mixture of materials. When the temperature is too high, an expensive firing furnace is needed and unnecessary firing energy may be consumed. A plurality of temperature conditions can be set at one heat treatment. Though it is usually preferable that the maximum temperature to be attained is held for a certain period, another process can be added in which a temperature lower than the maximum temperature to be attained is held for a certain period.

There is no limitation on the temperature rising rate during the heat treatment, insofar as the intended phosphor can be obtained. However, it is usually 0.5° C./min or faster, preferably 1° C./min or faster, and usually 20° C./min or slower, preferably 10° C./min or slower, more preferably 8° C./min or slower. When the temperature rising rate is too slow, an increased volatilizing volume of flux requires an excessive amount of flux, leading possibly to an excessive amount of energy needed. When it is too fast, defects may be formed in the crystal.

There is no limitation on the atmosphere during the heat treatment, insofar as the intended phosphor can be obtained. Heating is usually done in the air, or in a single kind of gas or a mixture of two or more kinds of gases such as oxygen, carbon monoxide, carbon dioxide, nitrogen, hydrogen and argon. However, a reducing atmosphere is preferable for the luminescent center element, of which valence can take two or more values, like Ce, and of which light-emitting ions have the same valence as that of the reducing side, to be activated stably in the host crystal for higher luminescent characteristics of the phosphor. Among them, hydrogen-containing nitrogen atmosphere is more preferable because the coloration of the host crystal of the resultant phosphor will then be clear green, which improves the luminescent characteristics remarkably. In addition, it is very effective to carry out a reheating treatment in a reducing atmosphere after the first heat treatment is done in an oxidizing atmosphere or a neutral atmosphere, for stabilizing the luminescent center ions in the host crystal. For example when the phosphor produced is represented by the formula [1] with $M^1$ being Ce, a heat treatment in a reducing atmosphere can stabilize the light-emitting Ce in the host crystal in the form of trivalent ions, namely $Ce^{3+}$. Furthermore, it is effective to perform heating in a reducing atmosphere two or more times for enhancing the characteristics.

There is no limitation on the period applying the heat treatment, insofar as the intended phosphor can be obtained. For example, it is preferable that the retention period at the maximum temperature to be attained is usually 10 minutes or longer, preferably 60 minutes or longer, more preferably 120 minutes or longer, and usually 24 hours or shorter, preferably 15 hours or shorter, more preferably 12 hours or shorter, particularly preferably 6 hours or shorter. When the heating period is too short, the particles of the phosphor may not grow, leading possibly to smaller particle diameters. When it is too long, a coarse particle may be formed.

There is no limitation on the condition of pressure during the heat treatment, insofar as the intended phosphor can be obtained. However, it is preferably around atmospheric pressure (0.1 MPa), more specifically, 0.09 MPa or higher and 0.11 MPa or lower.

The heat treatment can be carried out either at one time continuously or at divided, two or more times intermittently. When the heat treatment is carried out at two or more times dividedly, the firing conditions such as temperature, atmosphere, pressure and period are basically the same as those described earlier. The conditions can be changed between the first and the second and subsequent firings. In addition, when the heat treatment is performed at two or more times dividedly, it is effective to crush the content, which is taken out from the crucible, before the second heating and then fill it into the crucible again for another heating, for the sake of realizing a uniform phosphor. Further, at this time, it is preferable that a flux, to be described later, is added, depending on the kind of the flux.

[6-4. Flux]

In the production method of the present invention, it is preferable that two or more kinds of fluxes are coexisted in the reaction system in order to accelerate the crystal growth at the time of heat treatment. Though a flux usually means an additive accelerating a crystal growth, an additive inhibiting a crystal growth can also be used as flux. Further, two or more kinds of fluxes can be used in combination in any combination and in any ratio. When a flux accelerating a crystal growth is used alone, the crystal growth proceeds just in a specific crystal orientation and thus the particle shapes of the phosphor may be of large aspect ratios, like acicular shapes or flat-plate shapes. In that case, it is preferable to use, for example, an additive inhibiting a crystal growth in the longitudinal direction appropriately in combination with an additive accelerating a crystal growth, because it can keep small aspect ratios.

As the above-mentioned flux, one that functions in the form of a melt is usually used. In this way, the reaction between the melt, formed by the flux, and the material compounds of the phosphor can accelerate the crystal growth of the phosphor.

Therefore, it is preferable to use a flux of which melting point is lower than the temperature of the above-mentioned heat treatment and boiling point and sublimation point are higher than the temperature of the above-mentioned heat treatment. In other word, it is preferable to select a flux so that the above-mentioned heat treatment is carried out between the temperature range of from the melting point to the boiling point and sublimation point of the flux. This makes the flux a liquid melt during the heat treatment, which can make the flux act on the material compounds of the phosphor effectively.

From the above standpoints, it is preferable that the melting point of the flux is 1200° C. or lower. Further, it is preferable that the boiling point and the sublimation point of the flux are 1500° C. or higher.

When the temperature of the heat treatment is close to the boiling point of the flux, the chemical reactivity of the flux will be high, due to lowered viscosity of the melt, for example, but at the same time, the volatilization rate of the flux will increase. On the other hand, when the temperature of the heat treatment is close to the melting point of the flux, the chemical reactivity of the flux will be low, due to increased viscosity of the melt, for example, but at the same time, the volatilization rate of the flux component will decrease. From these standpoints, it is preferable to use a flux with high boiling point and melting point when the temperature of the heat treatment is set high, and it is preferable to use a flux with low boiling point and melting point when the temperature of the heat treatment is set low. Regarding a concrete range, it is preferable to use a flux with a boiling point higher than the temperature of the heat treatment just by 100° C. to 300° C. In other words, it is preferable to perform the above-mentioned heat treatment at the temperature lower than the boiling point of the flux just by 100° C. to 300° C.

It is preferable for fluxes to contain i) alkali metal, ii) alkaline-earth metal, iii) halide ion and iv) phosphate anion. The reason why an alkali metal and halide ion are preferable is that they have such advantageous effects as promoting the crystal growth and improving the crystallinity. The reason why an alkaline-earth metal is preferable is that the halide thereof is effective as a main component of the flux melt. The reason why a phosphate anion is preferable is that it has advantageous effect of improving the dispersibility of the phosphor obtained and advantageous effect of promoting the isotropic crystal growth (effect of lowering the aspect ratio). In this context, "promoting the crystal growth" means that the crystal will be a beautiful one having less crystal defects and high crystallinity. It is preferable to contain two or more kinds of fluxes, as described above. This is preferable also because all of the above-mentioned i) alkali metal, ii) alkaline-earth metal, iii) halide ion and iv) phosphate anion should be used as fluxes.

Preferable example of the flux includes a halide of an alkali metal or alkaline-earth metal. Among them, a halide containing a constituent element of the phosphor is particularly preferable. For example, $CaCl_2$ is preferable for a phosphor of which main component is Ca. In addition, as described above, a halide in which the temperature of the heat treatment falls between the melting point and boiling point thereof is preferably used. For example, since the melting point and the boiling point of $CaCl_2$ are 772° C. and 1600° C., the preferable temperature at which $CaSc_2O_4$:Ce is subjected to the heat treatment is between them.

Further, of the halides, fluorides and chlorides are particularly preferable.

preferable examples of the flux containing a phosphate anion include phosphate compounds of alkali metals or alkaline-earth metals. Among such phosphate compounds, phosphate compounds of which melting points are lower than the temperature of the heat treatment are preferably used, as described above. For example, the melting point of $Li_3PO_4$, which is one example of preferable phosphate compounds, is 837° C.

Other preferable examples of the flux containing a phosphate anion include various kinds of phosphates (phosphates, hydrogen phosphates, metaphosphates and pyrophosphates) of sodium or potassium. Of these, phosphates and hydrogen phosphates are preferable. Concretely, $Na_2HPO_4$, $NaH_2PO_4$, $K_2HPO_4$ and $KH_2PO_4$ are more preferable. Moreover, phosphates and hydrogen phosphates of alkaline-earth metals are also preferable examples. Of those, $Ca_3(PO_4)_2$, $Sr_3(PO_4)_2$, $CaHPO_4$ and $SrHPO_4$ are preferable.

In addition, compounds including, for example, Li, Na, K, Rb, Cs, P, Cl, F, Br or I are used as flux preferably. Therefore, preferable examples of the flux include, from the above-mentioned standpoints, halides of alkaline-earth metals, phosphates of alkali metals, halides of alkali metals and sulfates of alkali metals. The concrete examples thereof include: $CaCl_2$, $CaF_2$, $Li_3PO_4$, $KH_2PO_4$, KCl, $Li_2SO_4$ (or a hydrate thereof), $NaH_2PO_4$, $Na_2HPO_4$, $Na_3PO_4$, $Rb_3PO_4$, $Cs_3PO_4$, KF, KBr, KI, RbF, RbCl, RbBr, RbI, CsF, CsCl, CsBr and CsI. Among these, $CaCl_2$ can promote the crystal growth in the longitudinal direction. $Li_3PO_4$ can improve the crystallinity of the phosphor obtained and dispersibility of the phosphor in the sealing material such as resin, as well as inhibit the crystal growth in the longitudinal direction. $KH_2PO_4$, KCl and $Li_2SO_4$ can promote the total crystal growth, enhance the crystallinity, and lessen the lattice defects of the phosphor obtained. Less lattice defects can suppress transformation, gap formation and the like in the crystal lattice. Therefore, it is preferable that, among the fluxes exemplified above, two or more kinds selected from the group consisting of $CaCl_2$, $Li_3PO_4$, $KH_2PO_4$, KCl and $Li_2SO_4$ are used.

It is preferable to use two or more kinds of fluxes. In this case, a combination of a flux promoting the crystal growth and a flux inhibiting the crystal growth in the longitudinal direction (promoting the isotropic crystal growth) is preferable, in consideration of improving the handleability. Particularly, it is preferable that the main component of the flux is composed of a halide of alkali metal or alkaline earth metal.

Furthermore, it is preferable to use three or more kinds of fluxes in combination. For example, a combined use of $Li_3PO_4$, $CaCl_2$ and KCl can realize a phosphor of which particle diameter can be controlled, dispersibility is good, and luminescent characteristics is high. In this case, instead of KCl, another phosphate of alkali metal, such as $KH_2PO_4$, or a sulfate of alkali metal, such as $Li_2SO_4$ can be used. It is more preferable to add potassium carbonate and zinc oxide to the above-mentioned combination, as described later, because the weight-average median diameter of the resultant phosphor will be large and the brightness will be improved.

In addition, it is preferable to select flux compounds so that they contain two or more kinds of alkali metals. This is because the effect of flux will then increase, for example for the reason that the presence of two or more kinds of fluxes can lower the melting point of the fluxes. Among the combinations of alkali metals, the combination of Li and K is particularly preferable.

It is more preferable that a compound which forms a metal whose melting point or sublimation point is 1200° C. or lower by heating and/or a compound which forms an oxide of an alkali metal by heating are used as flux, in place of or preferably in addition to the above-mentioned flux. This is because the acceleration of transfer of the phosphor material compounds, induced by the flux melted or vaporized during firing, tends to promote the particle growth, enlargement of the weight-average median diameter and improvement in the brightness.

The above-mentioned compound which forms a metal whose melting point or sublimation point is 1200° C. or lower by heating means a compound that changes into a metal whose melting point or sublimation point is 1200° C. or lower by, for example, the heating at the time of the aforementioned heat treatment preferably in a reducing atmosphere. As a part or all of the compound which forms a metal whose melting point or sublimation point is 1200° C. or lower by heating, a metal whose melting point or sublimation point is 1200° C. or lower itself can be used.

The concrete examples of a metal whose melting point or sublimation point is 1200° C. or lower includes: Zn, Ga, Ge, In, Sn, Ag, Au, Pb, Cd, Bi and Ti. Of these, Zn, Ga, Ge, In, Sn, Ag and Au are particularly preferable because they are not toxic. More particularly, Zn, Ga, Ge, In and Sn are preferable.

The concrete examples of a compound that changes into a metal whose melting point or sublimation point is 1200° C. or lower by heating includes: oxides, hydroxides, nitrates, acetates, sulfates and the like of each metal of Zn, Ga, Ge, In, Sn, Ag, Au, Pb, Cd, Bi and the like. Among them, it is preferable to use oxides, in consideration of the kind and amount of the component formed by decomposition and the stability, deliquescence, hygroscopicity of the compound, easy availability of its high purity material and the like. As one example, the examples of the oxides include: ZnO, $Ga_2O$, $Ga_2O_3$, $GeO_2$, $In_2O_3$, $SnO_2$, $Ag_2O$, PbO, CdO, $Bi_2O_3$. Among these oxides, ZnO, $Ga_2O_3$, $GeO_2$, $In_2O_3$ and $SnO_2$ are preferably used from the standpoint of toxicity or the like. From the standpoint of increasing effect of weight-average median diameter, Zn or zinc compounds such as ZnO, $Zn(OH)_2$, $Zn(NO_3)_2$ and $ZnSO_4$ are more preferably used. Particularly preferable is ZnO. The reason why Zn is preferably used is that not only the melting point but also the boiling point of Zn metal is 1200° C. or lower (the boiling point of zinc is 907° C.) and thus it demonstrates the flux effect in the gaseous state, which leads to a remarkable increasing effect of the weight-average median diameter.

The compounds that change into metals whose melting points or sublimation points are 1200° C. or lower by heating can be used as a single kind thereof or as a mixture of two or more kinds in any combination.

On the other hand, the above-mentioned compound which forms an oxide of an alkali metal by heating means a compound that forms an oxide of an alkali metal by, for example, the heating at the time of the aforementioned heat treatment. As a part or all of the compound which forms an oxide of an alkali metal by heating, an oxide of an alkali metal itself can be used.

The examples of the compound which forms an oxide of an alkali metal by heating include: carbonates, nitrates, acetates and oxalates of alkali metals. Further, oxides of alkali metals themselves can be used. Among them, carbonates of alkali metals are preferably used because of their easy handling and easy availability of the high purity materials. Concrete examples of the alkali metal carbonates include $K_2CO_3$, $LiCO_3$, $Na_2CO_3$, $Rb_2CO_3$ and $Cs_2CO_3$. Of these, $K_2CO_3$, $Rb_2CO_3$ and $Cs_2CO_3$ are preferable. Particularly preferable is $K_2CO_3$.

The compounds which form oxides of alkali metals by heating can be used as a single kind thereof or as a mixture of two or more kinds in any combination.

Furthermore, regarding the above-mentioned compound which forms a metal whose melting point or sublimation point is 1200° C. or lower by heating and compound which forms an oxide of an alkali metal by heating, either one of them can be used, or both of them can be used in combination. Therefore, it is more preferable that one or more kinds selected from the group consisting of ZnO, $Ga_2O_3$, $GeO_2$, $In_2O_3$, $SnO_2$ and $K_2CO_3$ are used as flux, from the standpoint of enlarging the weight-average median diameter of the phosphor of the present invention. It is particularly preferable to use at least ZnO and/or $K_2CO_3$.

The degree to which the flux component element remains in the phosphor synthesized depends on the kind of the element which the flux includes or degree of washing, to be described later. The concentration of the above-mentioned flux component element in the phosphor, when the flux component element is Li, K, P, Cl, Zn, Ga, Ge, In or Sn, is as described earlier.

The timing of adding the flux in the reaction system subjected to the heat treatment, for making the flux coexist in the reaction system, is preferably before the heat treatment, when the heat treatment is carried out just once. When the heat treatment is carried out dividedly two or more times intermittently, the flux may be mixed in the material compound in advance, or may be mixed before the second or subsequent heat treatment. In such a case, the flux is added at two or more times dividedly. For example, it is possible that a part of the flux is mixed in the material compound in advance and the rest of the flux is added before the second or subsequent heat treatment.

Incidentally, a component other than material compounds and fluxes can be contained in the reaction system of the heat treatment, insofar as the phosphor of the present invention can be obtained.

[6-5. Other Treatments]

In the production method of the present invention, a treatment other than those described above can be performed at any timing.

For example, after the above-mentioned heat treatment, washing, drying, pulverization, classification and the like are performed, if necessary.

For pulverization treatment, pulverizers such as those cited for the above-mentioned mixing step of the material can be used. A wet-type pulverization can be carried out using, for example, water such as deionized water, organic solvent such as methanol and ethanol, alkaline aqueous solution such as ammonia water, aqueous solution of an inorganic acid such as hydrochloric acid, nitric acid and sulfuric acid, or aqueous solution of an organic acid such as acetic acid. Classification treatment is done by means of, for example, screening or elutriation. Or otherwise, it can be done using various classifiers such as an air current classifier or vibrating sieve. Particularly, a dry classification using a nylon mesh can be preferably used to obtain the phosphor of good dispersibility with weight-average median diameter of about 20 μm.

Washing treatment can be done using, for example, water such as deionized water, organic solvent such as ethanol, and alkaline aqueous solution such as ammonia water. Further, for example for the purpose of removing an impurity phase, such as a used flux, which is attached to the surface of the phosphor and improving the luminescent characteristics, water solution of inorganic acid such as hydrochloric acid, nitric acid and sulfuric acid or water solution of organic acid such as acetic acid can be used. In this case, it is preferable that, after washing with an acidic aqueous solution, an additional washing with water is carried out.

Regarding the degree of washing, it is preferable that the pH of the supernatant fluid that is obtained by leaving the washed phosphor, dispersed in 10-fold amount of water as ratio by weight, to stand for 1 hour is neutral (pH of around 5 to 9). This is because a deviation toward basicity or acidity may adversely affect the liquid medium, to be described later, or the like when the phosphor is mixed with the liquid medium.

The above-mentioned degree of washing can also be indicated by the electric conductivity of the supernatant fluid that is obtained by leaving the washed phosphor, dispersed in 10-fold amount of water as ratio by weight, to stand for 1 hour. The lower the electric conductivity is, the more preferable, from the standpoint of higher luminescent characteristics. However, also in consideration of the productivity, it is preferable to repeat the washing treatment until the electric conductivity is usually 10 mS/m or lower, preferably 5 mS/m or lower, and more preferably 4 mS/m or lower.

The method for measuring the electric conductivity is as follows. The phosphor particles, which have larger specific gravity than water, are allowed to precipitate spontaneously, by leaving them to stand for 1 hour after they are stirred in 10-fold amount of water as ratio by weight for a predetermined period of time, for example, 10 minutes. The electric conductivity of the supernatant fluid at that time may be measured using a conductance meter, "EC METER CM-30G", manufactured by DKK-TOA CORPORATION or the like. There is no special limitation on the water used for the washing treatment and measurement of the electric conductivity, but desalted water or distilled water is preferably used. Among them, the one having low electric conductivity is particularly preferable. Its electric conductivity should be usually 0.0064 mS/m or higher, and usually 1 mS/m or lower, preferably 0.5 mS/m or lower. The measurement of an electric conductivity is usually carried out at a room temperature (around 25° C.).

Classification treatment is done by means of, for example, screening or elutriation. Or otherwise, it can be done using various classifiers such as an air current classifier or vibrating sieve. Particularly, a dry classification using a nylon mesh can be preferably used to obtain the phosphor of good dispersibility with weight-average median diameter of about 20 μm.

It is preferable to perform a drying treatment, after the washing treatment. There is no particular limitation on the method of drying treatment. However, it is preferable to select an appropriate drying treatment method in accordance with the characteristics of the phosphor, if necessary. It can be performed by, for example, an ordinary heated drying, drying in vacuo, reduced pressure-drying, low-temperature drying such as freeze drying, spray drying or the like.

<Surface Treatment>

When the phosphor of the present invention, obtained in the above-mentioned procedure, is used to manufacture a light emitting device by the method described later, the surface of the phosphor may be subjected to a surface treatment as needed in which the surface is covered with some foreign compound, in order to improve its weather resistance such as moisture resistance or to improve its dispersibility in a resin in the phosphor-containing part of the light emitting device described later.

Examples of the substance which can be applied to the surface of the phosphor (hereinafter referred to as "surface treatment substance" as appropriate) include organic compound, inorganic compound and glass material.

Examples of the organic compound include thermofusible polymer such as acrylic resin, polycarbonate, polyamide and polyethylene, latex and polyorganosiloxane.

Examples of the inorganic compound include: metal oxides such as magnesium oxide, aluminum oxide, silicon oxide, titanium oxide, zirconium oxide, tin oxide, germanium oxide, tantalum oxide, niobium oxide, vanadium oxide, boron oxide, antimony oxide, zinc oxide, yttrium oxide, lanthanum oxide and bismuth oxide; metal nitrides such as silicon nitride and aluminum nitride; orthophosphates such as calcium phosphate, barium phosphate and strontium phosphate; and polyphosphate. A combination can be also used, in which at least one kind selected from the group consisting of lithium phosphate, sodium phosphate and potassium phosphate, and at least one kind selected from the group consisting of barium nitrate, calcium nitrate, strontium nitrate, barium chloride, calcium chloride and strontium chloride are combined. Among them, the combination of sodium phosphate and calcium nitrate is preferably used. When barium, calcium or strontium exists on the surface of the phosphor, the surface treatment can be performed just with a phosphate such as sodium phosphate.

Examples of the glass material include borosilicate, phosphosilicate and alkali silicate.

These surface treatment substances can be used either as a single kind or as a mixture of two or more kinds in any combination and in any ratio.

The surface-treated phosphor of the present invention has these surface treatment substances on its surface. The mode of existences of the surface treatment substances can be as follows, for example.

(i) The aforementioned surface treatment substances constitute a continuous layer and cover the surface of the phosphor of the present invention.

(ii) The aforementioned surface treatment substances are attached to the surface of the phosphor of the present invention as numerous micro particles and these micro particles cover the surface of the phosphor of the present invention.

It is preferable that the amount of the surface treatment substance which can cover or be attached to the surface of the phosphor of the present invention is, relative to the weight of the phosphor of the present invention, usually 0.1 weight % or more, preferably 1 weight % or more, more preferably 5 weight % or more, and usually 50 weight % or less, preferably 30 weight % or less, more preferably 15 weight % or less. When the amount of the surface treatment substance relative to that of the phosphor is too large, the luminescent characteristics of the phosphor may be impaired. When it is too small, the coverage of the surface may be insufficient, and the moisture resistance and dispersibility may not be improved.

It is preferable that the film thickness (layer thickness) of the surface treatment substance formed at the time of surface treatment is usually 10 nm or larger, preferably 50 nm or larger, and usually 2000 nm or smaller, preferably 1000 nm or smaller. When the layer is too thick, the luminescent characteristics of the phosphor may be impaired. When it is too small, the coverage of the surface may be insufficient, and moisture resistance and dispersibility may not be improved.

No particular limitation is imposed on the method of such surface treatment. An example can be the following coating treatment method using a metal oxide (silicon oxide).

The phosphor of the present invention is added to an alcohol such as ethanol, mixed and stirred. To this is added an alkaline aqueous solution such as ammonia water, followed by stirring. A hydrolyzable silicic acid alkyl ester such as tetraethyl orthosilicate is then added and the mixture is stirred. The solution obtained is allowed to stand for 3 minutes to 60 minutes, and then the supernatant containing silicon oxide particles which remain unattached to the surface of the phosphor is removed by pipetting or the like. Then, mixing in alcohol, stirring, allowing to stand and removal of the supernatant are repeated several times and, after a drying process under reduced pressure at 120° C. to 150° C. for 10 minutes to 5 hours, for example 2 hours, a surface-treated phosphor is obtained.

Other surface treatment methods of a phosphor include various known methods such as a method in which spherical silicon oxide fine powder is attached to the phosphor (Japanese Patent Laid-Open Publications No. Hei 2-209989 and No. Hei 2-233794), method in which a coating film of Si-compound is attached to the phosphor (Japanese Patent Laid-Open Publication No. Hei 3-231987), a method in which the surface of the phosphor is covered with polymer micro particles (Japanese Patent Laid-Open Publication No. Hei 6-314593), a method in which the phosphor is coated with organic, inorganic, glass and the like materials (Japanese Patent Laid-Open Publication No. 2002-223008), a method in which the surface of the phosphor is covered by means of chemical vapor reaction (Japanese Patent Laid-Open Publication No. 2005-82788) and a method in which particles of a metal compound is attached (Japanese Patent Laid-Open Publication No. 2006-28458).

Regarding post-treatments after the heat treatment, techniques generally known for known phosphors such as those used in, for example, cathode-ray tubes, plasma display panels, fluorescent lamps, fluorescent display tubes and X-ray intensifying screens can be used. These techniques can be selected depending on the object, purpose and the like.

According to the above-mentioned production method of the present invention, all of phosphors A to E of the present invention can be produced. Particularly, each of the phosphors has its tendency with respect to the production, as described in the following.

For example, when producing phosphor A of the present invention, it is particularly preferable to use a flux. This is because flux component element should be contained in the phosphor securely in this case.

For example when phosphor B of the present invention is produced, it is preferable to adjust the amount of $M^1$-source compound in a predetermined range that is narrower than those of the other phosphors. This is because the proportion of $M^1$ element in phosphor B is restricted to the narrower range than those of the other phosphors.

For example when phosphor C or phosphor E of the present invention is produced, it is preferable to use a flux including an alkali metal, alkaline-earth metal, halide ion and phosphate anion. This is because using these fluxes tends to achieve spherical shapes of resultant phosphor particles, namely, small aspect ratios of the phosphor particles.

For example when phosphor D of the present invention is produced, it is preferable to use, as flux, a compound that changes into a metal of which melting point or sublimation point is 1200° C. or lower by heating. This is because this kind of flux has tendency to increase the particle diameter of the resultant phosphor.

[7. Application of Phosphor]

The phosphor of the present invention can be used for any purpose that uses a phosphor. The phosphor of the present invention can be used singly or in any combination with another phosphor, which may be another kind of the present phosphor or a phosphor of another type, as a phosphor mixture.

The phosphor of the present invention can be used preferably for various light emitting devices (which are described as "the light emitting device of the present invention" later), particularly making the most of such characteristics that it can be excited by a blue light or a near-ultraviolet light. As the phosphor of the present invention is usually a green light emitting phosphor, for example by incorporating an excitation light source emitting blue light or ultraviolet light into the phosphor of the present invention, a light emitting device of blue green, green, or yellow green color can be produced. When incorporating an excitation light source emitting blue light and a phosphor emitting red light with the phosphor of the present invention, a white light emitting device can be produced. Also by incorporating an excitation light source emitting ultraviolet light, a phosphor emitting blue light and a phosphor emitting red light with the phosphor of the present invention, a white light emitting device can be produced.

The luminescent color of the light emitting device is not limited to white. By selecting the combination or content of the phosphors appropriately, light emitting devices emitting light of any color, such as warm white or pastel color, can be produced. The light emitting device thus obtained can be used for a lighting system or the illuminant portion (especially, back-lighting of a liquid crystal display) of an image display.

[8. Phosphor-Containing Composition]

The phosphor of the present invention can be used as a mixture with a liquid medium. Particularly when the phosphor of the present invention is used for a light emitting device or the like, it is preferably used as a dispersion in a liquid medium. The phosphor of the present invention that is dispersed in a liquid medium will be referred to as "the phosphor-containing composition of the present invention" as appropriate.

[8-1. Phosphor]

There is no limitation on the type of the phosphor of the present invention to be contained in the phosphor-containing composition of the present invention, and any of that can be selected from those described above. The phosphor of the present invention to be contained in the phosphor-containing composition of the present invention can be used as a single kind thereof or as a mixture of two or more kinds in any combination and in any ratio. Furthermore, in the phosphor-containing composition of the present invention, a phosphor other than the phosphor of the present invention can be contained, insofar as the advantage of the present invention is not significantly impaired.

[8-2. Liquid Medium]

There is no special limitation on the kind of a liquid medium used for the phosphor-containing composition of the present invention, insofar as the performance of the phosphor can be sufficient enough to achieve the object of the present invention. For example, any inorganic material and/or organic material can be used, insofar as it exhibits liquid characteristics under a desired use condition and lets the phosphor of the present invention be dispersed preferably without any unfavorable reaction.

Examples of the inorganic materials include metal alkoxide, ceramic precursor polymer, a solution obtained by hydrolytic polymerization of a solution containing metal alkoxide using a sol-gel method, or inorganic material obtained by combining such materials (such as an inorganic material containing siloxane bond).

Examples of the organic materials include thermoplastic resin, thermosetting resin and light curing resin. More specifically, the examples include: methacrylic resin such as polymethacrylate methyl; styrene resin such as polystyrene, styrene-acrylonitrile copolymer; polycarbonate resin; polyester resin; phenoxy resin; butyral resin; polyvinyl alcohol; cellulose resin such as ethyl cellulose, cellulose acetate and cellulose acetate butyrate; epoxy resin; phenol resin; and silicone resin.

Of these, a silicon-containing compound can be preferably used from the standpoint of high heat resistance, high light resistance and the like, particularly when the phosphor is used for a high-power light emitting device such as a lighting system.

Silicon-containing compound is a compound of which molecular contains a silicon atom. Examples thereof include organic materials (silicone materials) such as polyorganosiloxane, inorganic materials such as silicon oxide, silicon nitride and silicon oxynitride, glass materials such as borosilicate, phosphosilicate and alkali silicate. Among them, silicone materials are preferably used from the standpoint of ease in handling or the like.

The above-mentioned silicone material usually indicates organic polymers having a siloxane bond as the main chain. Examples thereof include compounds represented by the following formula (I) and/or mixtures of them.

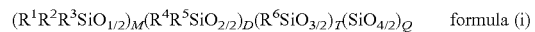

$$(R^1R^2R^3SiO_{1/2})_M(R^4R^5SiO_{2/2})_D(R^6SiO_{3/2})_T(SiO_{4/2})_Q \quad \text{formula (i)}$$

In the above formula (i), $R^1$ to $R^6$ can be the same as or different from each other, and are selected from the group consisting of organic functional group, hydroxyl group and hydrogen atom.

In addition, M, D, T and Q of the above-mentioned formula (I) are each number of 0 or greater and smaller than 1, and they satisfy M+D+T+Q=1.

For the silicone material used for sealing a semiconductor light emitting device, a liquid silicone material can be used, by being cured with heat or light, after the sealing.

When categorizing silicone materials based on the curing mechanism, they usually fall into such categories as addition polymerization-curable type, polycondensation-curable type, ultraviolet ray-curable type and peroxide vulcanized type. Of these, preferable are addition polymerization-curable type (addition type silicone resin) and condensation-curable type (condensing type silicone resin) and ultraviolet ray-curable type. In the following, addition type silicone material and condensing type silicone material will be explained.

Addition type silicone material represents a material in which polyorganosiloxane chain is cross-linked by means of organic additional bond. A typical example is a compound having a Si—C—C—Si bond as the crosslinking point, which can be obtained through a reaction between vinylsilane and hydrosilane in the presence of an addition type catalyst such as Pt catalyst. As such compounds, commercially available ones can be used. For example, concrete commercial names of an addition polymerization-curable type include "LPS-1400", "LPS-2410" and "LPS-3400", manufactured by Shin-Etsu Chemical Co., Ltd.

On the other hand, an example of a condensing type silicone material is a compound having an Si—O—Si bond as the crosslinking point, which can be obtained through hydrolysis and polycondensation of alkyl alkoxysilane.

Concrete examples include a polycondensate obtained by performing hydrolysis and polycondensation of compounds represented by the following general formula (ii) and/or (iii), and/or an oligomer thereof.

$$M^{m+}X_nY^1_{m-n} \quad (ii)$$

(In the formula (ii), M represents at least one element selected from silicon, aluminum, zirconium and titanium, X represents a hydrolyzable group, $Y^1$ represents a monovalent organic group, m represents an integer of 1 or larger representing the valence of M, and n represents an integer of 1 or larger representing the number of X groups, where m≧n.)

$$(M^{s+}X_tY^1_{s-t-1})_uY^2 \quad (iii)$$

(In the formula (iii), M represents at least one element selected from silicon, aluminum, zirconium and titanium, X represents a hydrolyzable group, $Y^1$ represents a monovalent organic group, $Y^2$ represents a u-valent organic group, s represents an integer of 1 or larger representing the valence of M, t represents an integer of 1 or larger and s−1 or smaller, and u represents an integer of 2 or larger.)

The condensing type silicone material may contain a curing catalyst. As the curing catalyst, a metal chelate compound can be used preferably, for example. The metal chelate compound preferably contains at least one of Ti, Ta and Zr, and more preferably contains Zr. The curing catalysts may be used either as a single kind thereof or as a mixture of two or more kinds in any combination and in any ratio.

Such condensing type silicone material used preferably includes, for example, semiconductor light-emitting device members disclosed in Japanese Patent Applications No. 2006-47274 to No. 2006-47277 (for example, Japanese Patent Laid-Open Publications (Kokai) No. 2007-112973 to No. 2007-112975 and Japanese Patent Laid-Open Publication (Kokai) No. 2007-19459) and Japanese Patent Application No. 2006-176468.

In the following, particularly preferable ones among condensing type silicone materials will be explained.

Silicone materials generally have such problems as low adhesiveness to the semiconductor light emitting device, the substrate at which the element is disposed, the package and the like. However, as a silicone material with especially high adhesion can be preferably cited a condensing type silicone material having the following characteristics [1] to [3].

[1] The silicon content is 20 weight % or more.

[2] In the solid Si-nuclear magnetic resonance spectrum (NMR), measured by a method to be described later in detail, it has at least one of Si-originated peaks of the following (a) and/or (b).

(a) A peak whose peak top position is in an area of a chemical shift of −40 ppm or more and 0 ppm or less, with reference to tetramethoxysilane, and whose full width at half maximum is 0.3 ppm or more and 3.0 ppm or less.

(b) A peak whose peak top position is in an area of a chemical shift of −80 ppm or more and less than −40 ppm, with reference to tetramethoxysilane, and whose full width at half maximum is 0.3 ppm or more and 5.0 ppm or less.

[3] The silanol content is 0.1 weight % or more and 10 weight % or less.

It is preferable that the silicone material in the present invention has the characteristic [1], among the above-mentioned characteristics [1] to [3]. It is more preferable that the silicone material has the above-mentioned characteristics [1] and [2]. It is particularly preferable that the silicone material has all the above-mentioned characteristics [1] to [3].

In the following, the above-mentioned characteristics [1] to [3] will be explained.

<Characteristic [1] (Silicon Content)>

The basic skeleton of a conventional silicone material is an organic resin such as an epoxy resin having carbon-carbon and carbon-oxygen bonds as its basic skeleton. In contrast, the basic skeleton of the silicone material preferable for the present invention is an inorganic siloxane bond which is the same as that of a glass (silicate glass). As is evident from the chemical bond comparison in Table 1 shown below, this siloxane bond has superior features as a silicone material, which are listed below.

(I) Light resistance is superior because the bond energy is large and thus pyrolysis and photolysis rarely occur.

(II) Electrically polarized slightly.

(III) The chain structure thereof has a high degree of freedom, leading to highly flexible structure and free rotation about the siloxane chain.

(IV) It is highly oxidized sc that further oxidization is impossible.

(V) It is high in electrical insulating properties.

TABLE 1

| [Chemical bond comparison table] | | | |
|---|---|---|---|
| Bond | Bond distance (Å) | Bond energy (kcal/mol) | Bond angle (°) |
| Si—O—Si | 1.64 | 108 | 130 to 160 |
| C—O—C | 1.43 | 86 | 110 |
| C—C—C | 1.54 | 85 | 109 |

From these features, it can be understood that a silicone material based on a skeleton in which siloxane bonds are connected three-dimensionally with a high degree of crosslinking is similar to minerals such as glass and rock and can form a protective film that is excellent in heat resistance and light resistance. Particularly, a silicone material having a methyl group as a substituent, is superior in light resistance, because it does not have an absorption range in the ultraviolet region and therefore photolysis is unlikely to occur.

The silicon content in the silicone material that is preferable for the present invention is usually 20 weight % or more. However, it is particularly preferably 25 weight % or more, and more particularly preferably 30 weight % or more. On the other hand, the upper limit thereof is usually 47 weight %, because the silicon content of a glass, consisting only of $SiO_2$, is 47 weight %.

The silicon content of a silicone material can be calculated based on the result of inductively coupled plasma spectrometry (hereinafter abbreviated as "ICP" when appropriate) analysis, carried out in accordance with, for example, a method described below.

{Measurement of Silicon Content}

A silicone material is kept in a platinum crucible in the air at 450° C. for 1 hour and then at 750° C. for 1 hour and at 950° C. for 1.5 hours for firing. After removal of carbon components, the small amount of residue obtained is added with a 10-fold amount or more of sodium carbonate, and then heated by a burner to melt it. Then the melted product is cooled and added with desalted water, being diluted to several ppm in silicon, while adjusting pH value to around neutrality using hydrochloric acid. And then ICP analysis is performed.

<Characteristic [2] (Solid Si-NMR Spectrum)>

When measuring the solid Si-NMR spectrum of a silicone material preferable for the present invention, at least one, preferably two or more of peaks can be observed in the aforementioned peak regions (a) and/or (b), originating from a silicon atom directly bonded with a carbon atom of an organic group.

Summarizing in terms of chemical shifts, in a silicone material preferable for the present invention, the full width at half maximum of the peak described in (a) is generally smaller than that of the peak of (b) described later, due to smaller constraints of molecular motion. Namely, it is in the range of usually 3.0 ppm or less, preferably 2.0 ppm or less, and usually 0.3 ppm or more.

On the other hand, the full width at half maximum of the peak described in (b) is in the range of usually 5.0 ppm or less, preferably 4.0 ppm or less, and usually 0.3 ppm or more, preferably 0.4 ppm or more.

If the full width at half maximum of a peak observed in the above chemical shift areas is too large, a state in which constraints of molecular motion are large and thus the distortion is large is created, leading possibly to forming a member inferior in heat resistance and weather resistance, and of which cracks are more likely to appear. For example when a lot of tetrafunctional silane is used or when large internal stress is generated by a rapid drying in the drying process, the range of the full width at half maximum will be larger than the above range.

If the full width at half maximum of the peak is too small, Si atoms existing in its environment are not involved in the siloxane crosslinking. In such a case, for example when trifunctional silane remains in a non-crosslinked state, the obtained member may be inferior in heat resistance and weather resistance to materials formed mainly of siloxane bonds.

However, even if a peak, of the above-mentioned range of the full width at half maximum, is observed in an area of −80 ppm or more in a silicone material containing a small amount of Si component in a large amount of organic components, the heat resistance, light resistance and coating properties may not be excellent.

The chemical shift value of a silicone material preferable for the present invention can be calculated based on the results of a solid Si-NMR measurement performed by, for example, a method described below. Also, the measured data (the full width at half maximum, silanol amount and so on) is analyzed by a method in which each peak is divided and extracted by the waveform separation analysis or the like utilizing, for example, the Gauss function or Lorentz function.

{Solid Si-NMR Spectrum Measurement and Calculation of the Silanol Content}

When measuring the solid Si-NMR spectrum of a silicone material, the solid Si-NMR spectrum measurement and the waveform separation analysis are performed under the following conditions. Further, the full width at half maximum of each peak is determined, for the silicone material, based on the obtained waveform data. In addition, the silanol content is determined by comparing the ratio (%) of silicon atoms in silanol to all silicon atoms, decided from the ratio of peak areas originating from silanol to all peak areas, with the silicon content ratio analyzed separately.

{Device Conditions}

Device: Infinity CMX-400 nuclear magnetic resonance spectroscope, manufactured by Chemagnetics Inc.

$^{29}$Si resonance frequency: 79.436 MHz
Probe: 7.5 mm φ CP/MAS probe
Temperature: Room temperature
Rotational frequency of sample: 4 kHz
Measurement method: Single pulse method
$^1$H decoupling frequency: 50 kHz
$^{29}$Si flip angle: 90°
$^{29}$Si 90° pulse width: 5.0 μs
Repetition time: 600 s
Total count: 128 times
Observation width: 30 kHz
Broadening factor: 20 Hz
Authentic sample: tetramethoxysilane For a silicone material, 512 points are taken in as measured data and zero-filled to 8192 points, before Fourier transformation is performed.

{Waveform Separation Analysis Method}

For each peak of the spectrum after Fourier transformation, an optimization calculation is performed by the nonlinear least square method using the center position, height and full width at half maximum of a peak shape, created by a Lorentz waveform, Gauss waveform or a mixture of both, as variable parameters.

For identification of a peak, refer to AIChE Journal, 44(5), p. 1141, 1998 or the like.

<Characteristic [3] (Silanol Content)>

The silanol content of a silicone material preferable for the present invention is in the range of usually 0.1 weight % or more, preferably 0.3 weight % or more, and usually 10 weight % or less, preferably 8 weight % or less, more preferably 5 weight % or less. When the silanol content is small, the silicone material varies little over time and can be superior in long-term performance stability, as well as in low hygroscopicity and low moisture permeability. However, no silanol content results only in poor adhesion, and therefore, there is such appropriate range of the silanol content as described above.

The silanol content of a silicone material can be decided by such method as described before for {Solid Si-NMR spectrum measurement and calculation of the silanol content} in <Characteristic [2] (solid Si-NMR spectrum)>, for example. In such a method, the ratio (%) of silicon atoms in silanol relative to all silicon atoms is determined from the ratio of peak areas originating from silanol relative to all peak areas by means of the solid Si-NMR spectrum measurement, and then, the silanol content can be calculated by comparing the determined silicon ratio with the silicon content analyzed separately.

Since a silicone material preferable for the present invention contains an appropriate amount of silanol, which is bound to a polar portion, usually existing on the device surface, through hydrogen bond, the adhesion develops. The polar portion includes, for example, a hydroxyl group and oxygen in a metalloxane bond.

In addition, a silicone material preferable for the present invention usually forms, due to dehydration condensation, a covalent bond with a hydroxyl group on the device surface when heated in the presence of an appropriate catalyst, leading to a development of still firmer adhesion.

With too much content of silanol, on the other hand, thickening in the system may make the coating difficult, and also, with increased activity, the occurrence of curing before low-boiling point components volatilize by heating may induce a foaming and an increase in internal stress, which may result in crack generations.

[8-3. Content of Liquid Medium]

There is no special limitation on the content of the liquid medium, insofar as the advantage of the present invention is not significantly impaired. However, it is usually 50 weight % or more, preferably 75 weight % or more, and usually 99 weight % or less, preferably 95 weight % or less, to the whole phosphor-containing composition of the present invention. Even a large amount of liquid medium does not induce any problems particularly, but in order to achieve desired color coordinate, color rendering index, emission efficiency or the like when it is used for a semiconductor light emitting device, it is preferable that the liquid medium is used usually in the above-mentioned proportion. With too small amount of the liquid medium, on the other hand, its handling may be difficult due to too little fluidity.

The liquid medium serves mainly as binder, in the phosphor-containing composition of the present invention. The liquid medium can be used either as a single kind or as a mixture of two or more kinds in any combination and in any ratio. For example, when a silicon-containing compound is used for the purpose of high heat resistance or light resistance, other thermosetting resin such as epoxy resin can be included to the extent that the durability of the silicon-containing compound will not be impaired. In such a case, it is preferable that the content of the other thermosetting resin is usually 25 weight % or lower, preferably 10 weight % or lower, to the whole amount of the liquid medium, which serves as the binder.

[8-4. Other Component]

In the phosphor-containing composition of the present invention, other components can be contained in addition to the phosphor and liquid medium, insofar as the advantage of the present invention is not significantly impaired. The other components may be used either as a single kind thereof or as a mixture of two or more kinds in any combination and in any ratio.

[9. Light Emitting Device]

The light emitting device of the present invention (hereinafter referred to as "the light emitting device" as appropriate) comprises a first luminous body (excitation light source) and a second luminous body which emits visible light when irradiated with light from the first luminous body. The light emitting device comprises one or more kinds of the phosphor of the present invention as the first phosphor in the second luminous body.

As the phosphor of the present invention, the phosphor that emits fluorescences of a green region (hereinafter referred to as "the green phosphor of the present invention" as appropriate) when irradiated with light from the excitation light source is usually used. Specifically, a phosphor having its emission peak in the range of from 485 nm to 555 nm is preferably used as the green phosphor of the present invention, for constituting a light emitting device. The green phosphor of the present invention can be used either as any single kind thereof or as a mixture of two or more kinds in any combination and in any ratio.

The use of the green phosphor of the present invention can make the light emitting device of the present invention high in emission efficiency, with respect to the light from an excitation light source (first luminous body) of from ultraviolet to blue region. This light emitting device shows superior characteristics when used for a white light emitting device such as a lighting system, or a light source for a liquid crystal display.

Preferable examples of the green phosphor of the present invention used for the light emitting device of the present invention include the aforementioned examples of the phosphor of the present invention described in the sections regarding the phosphor of the present invention, and phosphors used in each Example of the section [Example] described later.

There is no particular limitation on the structure of the light emitting device of the present invention and any known device configuration can be adopted, except that it comprises the first luminous body (excitation light source) and utilizes at least the phosphor of the present invention as the second luminous body. Concrete examples of the device configuration will be described later.

The emission spectrum peak in the green region, of the light emitting device of the present invention, preferably exists in the wavelength range of from 515 nm to 535 nm.

The emission spectrum of the light emitting device of the present invention can be measured in a room of which temperature is kept at 25±1° C. with energization of 20 mA, using a software for measuring color and illumination intensity, manufactured by Ocean Optics, Inc., and a spectroscope of USB2000 series (integrating sphere version). From this emission spectrum data in the wavelength region of 380 nm to 780 nm, can be calculated the chromaticity value (x, y, z) as color coordinates of XYZ calorimetric system, defined in JIS Z8701. In this case, the relational expression of $x+y+z=1$ holds. In the present Description, the aforementioned XYZ calorimetric system is occasionally referred to as XY calorimetric system and the value thereof is usually represented as (x,y).

Emission efficiency can be determined by calculating the total luminous flux from the results of emission-spectrum measurement using a light emitting device mentioned earlier and then dividing the lumen value (lm) obtained with the power consumption (W). The power consumption can be obtained as the product of the current value and the voltage value, which is measured using True RMS Multimeters Model 187 and 189 manufactured by Fluke Corporation during 20-mA energization.

Particularly the white light emitting device, among the light emitting devices of the present invention, can be obtained with a known device configuration. More specifically, an excitation light source such as described later is used as the first luminous body, and known phosphors, such as a phosphor emitting red fluorescence (hereinafter referred to as "red phosphor" as appropriate), a phosphor emitting blue fluorescence (hereinafter referred to as "blue phosphor" as appropriate), a phosphor emitting yellow fluorescence (hereinafter referred to as "yellow phosphor" as appropriate), which are described later, are used in arbitral combination, in addition to a green phosphor such as described before.

In this context, the white color of the white light emitting device includes all of (Yellowish) White, (Greenish) White, (Bluish) White, (Purplish) White and White, which are defined in JIS Z8701. Of these, preferable is White.

[9-1. Configuration of Light Emitting Device (Luminous Body)]

(First Luminous Body)

The first luminous body of the light emitting device of the present invention emits light for exciting the second luminous body to be described later.

The first luminous body has no particular limitation on its luminous wavelength, insofar as it overlaps the absorption wavelength of the second luminous body to be described later, and therefore, various luminous bodies with a wide range of luminous wavelength regions are applicable. Usually a luminous body having luminous wavelength of from ultraviolet region to blue region is used. Among them, particularly preferable are luminous bodies having luminous wavelength of from near-ultraviolet region to blue region.

It is preferable that the luminous wavelength of the first luminous body usually has a concrete value of 200 nm or longer. Among them, it is preferable that, when a near-ultraviolet light is used as the excitation light, a luminous body with a peak luminous wavelength of usually 300 nm or longer, preferably 330 nm or longer, more preferably 360 nm or longer, and usually 420 nm or shorter is used. When a blue light is used as the excitation light, it is preferable that a luminous body with a peak luminous wavelength of usually 420 nm or longer, preferably 430 nm or longer, and usually 500 nm or shorter, preferably 480 nm or shorter is used. Both of these conditions are required from the standpoint of color purity of the light emitting device.

As the first luminous body, a semiconductor light emitting device is generally used. Concretely, an LED, semiconductor laser diode (hereinafter, abbreviated as "LD" as appropriate) or the like can be used. Other examples of the luminous body that can be used as the first luminous body include an organic electroluminescence light emitting device, inorganic electroluminescence light emitting device or the like. However, the luminous body that can be used as the first luminous body is not restricted to those exemplified in the present Description.

Among them, a GaN-based LED and GaN-based LD, using a GaN-based compound semiconductor, are preferable for the first luminous body. This is because a GaN-based LED and GaN-based LD have light output and external quantum efficiency far greater than those of an SiC-based LED and the like that emit the same range of light and therefore they can give very bright luminescence with very low electric power when used in combination with the above-mentioned phosphor. For example, when applying current load of 20 mA, a GaN-based LED and GaN-based LD usually have emission intensity 100 times or higher than that of an SiC-based ones. As GaN-based LED or GaN-based LD, one having an $Al_xGa_yN$ luminous layer, GaN luminous layer or $In_xGa_yN$ luminous layer is preferable. Among the GaN-based LEDs, one having an $In_xGa_yN$ luminous layer is particularly preferable due to its remarkably high emission intensity, and among the GaN-based LDs, one having a multiple quantum well structure of the $In_xGa_yN$ layer and GaN layer is particularly preferable also due to its remarkably high emission intensity.

In the above description, the X+Y usually takes a value in the range of 0.8 to 1.2. A GaN-based LED having a such kind of luminous layer that is doped with Zn or Si or without any dopant is preferable for the purpose of adjusting the luminescent characteristics.

A GaN-based LED contains, as its basic components, a such kind of luminous layer, p layer, n layer, electrode and substrate. Among them, a GaN-based LED having such a heterostructure as sandwiching the luminous layer with n type and p type of $Al_xGa_yN$ layers, GaN layers, $In_xGa_yN$ layers or the likes is preferable, from the standpoint of high emission efficiency. Moreover, the one whose heterostructure is replaced by a quantum well structure is more preferable because it can show higher emission efficiency.

The first luminous body can be used either as a single one or as a mixture of two or more of them in any combination and in any ratio.

(Second Luminous Body)

The second luminous body of the light emitting device of the present invention is a luminous body which emits visible light when irradiated with light from the above-mentioned first: luminous body. It comprises the aforementioned phosphor of the present invention (green phosphor) as the first phosphor, as well as the second phosphor (red phosphor, blue phosphor, orange phosphor and the like) to be described later as appropriate depending on its use of the like. The second luminous body is formed, for example, so that the first and the second phosphors are dispersed in a sealing material.

There is no special limitation on the composition of the other phosphor than the phosphor of the present invention, which is used in the second luminous body. Examples include compounds incorporating a host crystal, such as a metal oxide typified by $Y_2O_3$, $YVO_4$, $Zn_2SiO_4$, $Y_3Al_5O_{12}$ and $Sr_2SiO_4$, a metal nitride typified by $Sr_2Si_5N_8$, phosphate typified by $Ca_5(PO_4)_3Cl$, a sulfide typified by ZnS, SrS and CaS and an oxysulfide typified by $Y_2O_2S$ and $La_2O_2S$, with an activation element or coactivation element, such as an ion of a rare earth metal including Ce, Pr, Nd, Pm, Sm, Eu, Tb, Dy, Ho, Er, Tm or Yb, or a metal ion of Ag, Cu, Au, Al, Mn or Sb.

Preferable examples of the host crystal include sulfides such as (Zn, Cd)S, $SrGa_2S_4$, SrS and ZnS; oxysulfides such as $Y_2O_2S$; aluminates such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CeMgAl_{11}O_{19}$, $(Ba,Sr,Mg)O.Al_2O_3$, $BaAl_2Si_2O_8$, $SrAl_2O_4$, $Sr_4Al_{14}O_{25}$ and $Y_3Al_5O_{12}$; silicates such as $Y_2SiO_5$ and $Zn_2SiO_4$; oxides such as $SnO_2$ and $Y_2O_3$; borates such as $GdMgB_5O_{10}$ and $(Y,Gd)BO_3$; halophosphates such as $Ca_{10}(PO_4)_6(F,Cl)_2$ and $(Sr,Ca,Ba,Mg)_{10}(PO_4)_6Cl_2$; and phosphates such as $Sr_2P_2O_7$ and $(La, Ce)PO_4$.

No particular limitation is imposed on the element compositions of the above-mentioned host crystal, and activation element or coactivation element. Partial substitution with an element of the same group is possible. Any phosphor obtained can be used so long as it absorbs light in the near-ultraviolet to visible region and emits visible light.

More concretely, those listed below can be used as phosphor. However, the lists are just examples and phosphors that can be used in the present invention are not limited to those examples. In the following examples, phosphors with different partial structure are shown abbreviated as a group for the sake of convenience, as mentioned earlier.

(First Phosphor)

The second luminous body in the light emitting device of the present invention contains at least the above-mentioned phosphor of the present invention as the first phosphor. The phosphor of the present invention can be used either as a single kind or as a mixture of two or more kinds in any combination and in any ratio. In addition, the first phosphor may contain, in addition to the phosphor of the present invention, a phosphor (a combined same-color phosphor) emitting a fluorescence of the same color as that of the phosphor of the present invention. As the phosphor of the present invention is usually a green phosphor, another kind of green phosphor can be used as the first phosphor in combination with the phosphor of the present invention.

As such green phosphor, any kind of them can be used, insofar as the advantage of the present invention is not significantly impaired. Concrete examples of such green phosphor include an europium-activated alkaline-earth silicon oxynitride phosphor represented by $(Mg,Ca,Sr,Ba)Si_2O_2N_2$:Eu, which is constituted by fractured particles having a fractured surface and emits light in the green region.

Other examples of such green phosphor include: Eu-activated aluminate such as $Sr_4Al_{14}O_{25}$:Eu and $(Ba,Sr,Ca)Al_2O_4$:Eu; Eu-activated silicate such as $(Sr,Ba)Al_2Si_2O_8$:Eu, $(Ba,Mg)_2SiO_4$:Eu, $(Ba,Sr,Ca,Mg)_2SiO_4$:Eu and $(Ba,Sr,Ca)_2(Mg,Zn)Si_2O_7$:Eu, $(Ba,Ca,Sr,Mg)_9(Sc,Y,Lu,Gd)_2(Si,Ge)_6O_{24}$:EU; Ce,Tb-activated silicate such as $Y_2SiO_5$:Ce,Tb; Eu-activated borophosphate such as $Sr_2P_2O_7$—$Sr_2B_2O_5$:Eu; Eu-activated halosilicate such as $Sr_2Si_3O_8$—$2SrCl_2$:Eu; Mn-activated silicate such as $Zn_2SiO_4$:Mn; Tb-activated aluminate such as CeMgAl$_{11}$O$_{19}$:Tb and Y$_3$Al$_5$O$_{12}$:Tb; Tb-activated silicate such as Ca$_2$Y$_8$(SiO$_4$)$_6$O$_2$:Tb and La$_3$Ga$_5$SiO$_{14}$:Tb; Eu,Tb,Sm-activated thiogalate such as (Sr,Ba,Ca)Ga$_2$S$_4$:Eu, Tb,Sm; Ce-activated aluminate such as Y$_3$(Al,Ga)$_5$O$_{12}$:Ce and (Y,Ga,Tb,La,Sm,Pr,Lu)$_3$(Al,Ga)$_5$O$_{12}$:Ce; Ce-activated silicate such as Ca$_3$Sc$_2$Si$_3$O$_{12}$:Ce and Ca$_3$(Sc,Mg,Na,Li)$_2$Si$_3$O$_{12}$:Ce; Ce-activated oxide such as CaSc$_2$O$_4$:Ce; Eu-activated oxynitride such as Eu-activated β-sialon; Eu,Mn-activated aluminate such as BaMgAl$_{10}$O$_{17}$:Eu,Mn; Eu-activated aluminate such as SrAl$_2$O$_4$:Eu; Tb-activated oxysulfide such as (La,Gd,Y)$_2$O$_2$S:Tb; Ce,Tb-activated phosphate such as LaPO$_4$:Ce,Tb; sulfide such as ZnS:Cu,Al and ZnS:Cu,Au, Al; Ce,Tb-activated borate such as (Y,Ga,Lu,Sc,La)BO$_3$:Ce, Tb, Na$_2$Gd$_2$B$_2$O$_7$:Ce,Tb and (Ba,Sr)$_2$(Ca,Mg,Zn)B$_2$O$_6$:K, Ce,Tb; Eu,Mn-activated halosilicate such as Ca$_8$Mg(SiO$_4$)$_4$Cl$_2$:Eu,Mn; Eu-activated thioaluminate or thiogallate such as (Sr,Ca,Ba)(Al,Ga,In)$_2$S$_4$:Eu; Eu,Mn-activated halosilicate such as (Ca,Sr)$_8$(Mg,Zn)(SiO$_4$)$_4$Cl$_2$:Eu,Mn; and Eu-activated oxynitride such as M$_3$Si$_6$O$_9$N$_4$:Eu and M$_3$Si$_6$O$_{12}$N$_2$:Eu (here, M represents alkaline earth metal element).

Also applicable as the green phosphor are fluorescent dyes such as pyridine-phthalimide condensed derivative, benzoxadinone compound, quinazolinone compound, coumarine compound, quinophthalone compound, naphthalimide compound, and organic phosphors such as terbium complex.

The green phosphor exemplified above can be used either as a single kind or as a mixture of two or more kinds in any combination and in any ratio.

It is preferable that the first phosphor used for the light emitting device of the present invention has an emission-peak wavelength $\lambda_p$ (nm) in the range of usually longer than 500 nm, particularly 510 nm or longer, further particularly 515 nm or longer, and usually 550 nm or shorter, particularly 542 nm or shorter, further particularly 535 nm or shorter. When the emission-peak wavelength $\lambda_p$ is too short, the color tends to be bluish green. On the other hand, when it is too long, the color tends to be yellowish green. In both cases, the characteristics of its green light may deteriorate.

In addition, it is preferable that the first phosphor of the present invent-on used for the light emitting device of the present invention has a full width at half maximum (hereinafter abbreviated as "FWHM" as appropriate) of the emission peak, in the above-mentioned emission spectrum, in the range of usually 90 nm or wider, and usually 120 nm or narrower. When the full width at half maximum, FWHM, is too narrow, the emission intensity may decrease. When it is too wide, the color purity may decrease.

(Second Phosphor)

The second luminous body of the light emitting device of the present invention may contain one or more kinds of other phosphors (namely, second phosphors) in addition to the above-mentioned first phosphor, depending on the purpose. The second phosphor is a phosphor having a different emission-peak wavelength from that of the first phosphor. Such second phosphor is usually used for the purpose of adjusting the color tone of light emission of the second luminous body. Therefore, mostly a phosphor having a different-color fluorescence from the first phosphor is used as the second phosphor. Since a green phosphor is usually used for the first phosphor, as described above, a phosphor other than a green phosphor, such as an orange or red phosphor, blue phosphor or yellow phosphor, is used as the second phosphor.

It is preferable that the weight-average median diameter of the second phosphor used for the light emitting device of the present invention is in the range of usually 10 μm or larger, preferably 12 μm or larger, and usually 30 μm or smaller, preferably 25 μm or smaller. When the weight-average median diameter is too small, the brightness tends to decrease and the phosphor particles tend to aggregate. On the other hand, the weight-average median diameter is too large, unevenness in coating, clogging in a dispenser or the like tend to occur.

(Orange or Red Phosphor)

When an orange or red phosphor is used as the second phosphor, any kind of orange or red phosphor can be used, insofar as the advantage of the present invention is not significantly impaired. It is preferable that the emission-peak wavelength of the orange or red phosphor is in the range of usually 570 nm or longer, preferably 580 nm or longer, more preferably 585 nm or longer, and usually 780 nm or shorter, preferably 700 nm or shorter, more preferably 680 nm or shorter.

Examples of such orange or red phosphor include an europium-activated alkaline earth silicon nitride phosphor represented by (Mg,Ca,Sr,Ba)$_2$Si$_5$N$_8$:Eu, which is constituted by fractured particles having red fractured surfaces and emits light in red region, and an europium-activated rare-earth oxychalcogenide phosphor represented by (Y,La,Gd,Lu)$_2$O$_2$S:Eu, which is constituted by growing particles having a nearly spherical shapes typical of regular crystal growth and emits light in red region.

Also applicable in the present embodiment is a phosphor containing oxynitride and/or oxysulfide which include at least one element selected from the group consisting of Ti, Zr, Hf, Nb, Ta, W and Mo, described in Japanese Patent Laid-Open Publication (Kokai) No. 2004-300247, and containing an oxynitride having an α-sialon structure in which all or part of Al elements are replaced by Ga elements. These are phosphors which contain oxynitride and/or oxysulfide.

Other examples of the red phosphor include: Eu-activated oxysulfide such as (La,Y)$_2$O$_2$S:Eu; Eu-activated oxide such as Y(V,P)O$_4$:Eu and Y$_2$O$_3$:Eu; Eu,Mn-activated silicate such as (Ba,Mg)$_2$SiO$_4$:Eu,Mn and (Ba,Sr,Ca,Mg)$_2$SiO$_4$:Eu,Mn; Eu-activated tungstate such as LiW$_2$O$_8$:Eu, LiW$_2$O$_8$:Eu,Sm, Eu$_2$W$_2$O$_9$, Eu$_2$W$_2$O$_9$:Nb, Eu$_2$W$_2$O$_9$:Sm; Eu-activated sulfide such as (Ca,Sr)S:Eu; Eu-activated aluminate such as YAlO$_3$:Eu; Eu-activated silicate such as Ca$_2$Y$_8$(SiO$_4$)$_6$O$_2$:Eu, LiY$_9$(SiO$_4$)$_6$O$_2$:Eu, (Sr,Ba,Ca)$_3$SiO$_5$:Eu and Sr$_2$BaSiO$_5$:Eu; Ce-activated aluminate such as (Y,Gd)$_3$Al$_5$O$_{12}$:Ce and (Tb,Gd)$_3$Al$_5$O$_{12}$:Ce; Eu-activated oxide, nitride or oxynitride such as (Mg,Ca,Sr,Ba)$_2$Si$_5$(N,O)$_8$:Eu, (Mg,Ca,Sr,Ba)Si(N,O)$_2$:Eu and (Mg,Ca,Sr,Ba)AlSi(N,O)$_3$:Eu; Ce-activated oxide, nitride oxynitride such as (Mg,Ca,Sr,Ba)AlSi(N,O)$_3$:Ce; Eu,Mn-activated halophosphate such as (Sr,Ca,Ba,Mg)$_{10}$(PO$_4$)$_6$Cl$_2$:Eu,Mn; Eu,Mn-activated silicate such as Ba$_3$MgSi$_2$O$_8$:Eu,Mn and (Ba,Sr,Ca,Mg)$_3$(Zn,Mg)Si$_2$O$_8$:Eu, Mn; Mn-activated germanate such as 3.5MgO.0.5MgF$_2$.GeO$_2$:Mn; Eu-activated oxynitride such as Eu-activated α-sialon; Eu,Bi-activated oxide such as (Gd,Y,Lu,La)$_2$O$_3$:Eu,Bi; Eu,Bi-activated oxysulfide such as (Gd,Y,Lu,La)$_2$O$_2$S:Eu,Bi; Eu,Bi-activated vanadate such as (Gd,Y,Lu,La)VO$_4$:Eu,Bi; Eu, Ce-activated sulfide such as SrY$_2$S$_4$:Eu, Ce; Ce-activated sulfide such as CaLa$_2$S$_4$:Ce; Eu,Mn-activated phosphate such as (Ba,Sr,Ca)MgP$_2$O$_7$:Eu, Mn and (Sr,Ca,Ba,Mg,Zn)$_2$P$_2$O$_7$:Eu,Mn; Eu,Mn-activated tungstate such as (Y,Lu)$_2$WO$_6$:Eu,Mo; Eu,Ce-activated nitride such as (Ba,Sr,Ca)$_x$Si$_y$N$_z$:Eu,Ce (x,y,z being an integer of 1 or larger); Eu,Mn-activated halophosphate such as (Ca,Sr,Ba,Mg)$_{10}$(PO$_4$)$_6$(F,Cl,Br,OH):Eu,Mn; and Ce-activated silicate such as ((Y,Lu,Gd,Tb)$_{1-x-y}$Sc$_x$Ce$_y$)$_2$(Ca,Mg)$_{1-r}$(Mg,Zn)$_{2+r}$Si$_{z-q}$Ge$_q$O$_{12+\delta}$.

Also applicable as the red phosphor are the following examples: red organic phosphor consisting of rare-earth ion complex containing anions of such as β-diketonate, β-diketone, aromatic carboxylic acid or Bronsted acid as ligands, perylene pigment (for example, dibenzo{[f,f']-4,4',7,7'-tetraphenyl}diindeno[1,2,3-cd:1',2',3'-lm]perylene) anthraquinone pigment, lake pigment, azo pigment, quinacridone pigment, anthracene pigment, isoindoline pigment, isoindolinone pigment, phthalocyanine pigment, triphenylmethane series basic dye, indanthrone pigment, indophenol pigment, cyanine pigment and dioxazine pigment.

Among them, it is preferable that the red phosphor contains $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu, $(La,Y)_2O_2S$:Eu or Eu complex. It is more preferable that it contains $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu, $(La,Y)_2O_2S$:Eu, β-diketone Eu complex such as $Eu(dibenzoylmethane)_3$.1,10-phenanthroline complex or carboxylic acid Eu complex. Of these, especially preferable are $(Ca,Sr,Ba)_2Si_5(N,O)_8$:Eu, $(Sr,Ca)AlSiN_3$:Eu and $(La,Y)_2O_2S$:Eu.

Among the above examples, a phosphor that can be preferably used as the orange phosphor is $(Sr,Ba)_3SiO_5$:Eu.

(Blue Phosphor)

When a blue phosphor is used as the second phosphor, any kind of blue phosphor can be used, insofar as the advantage of the present invention is not significantly impaired. At this point, it is preferable that the emission-peak wavelength of the blue phosphor is in the range of usually 420 nm or longer, preferably 430 nm or longer, more preferably 440 nm or longer, and usually 490 nm or shorter, preferably 480 nm or shorter, more preferably 470 nm or shorter, still more preferably 460 nm or shorter.

Examples of the blue phosphor include europium-activated barium magnesium aluminate phosphors represented by $(Ba,Sr, Ca)MgAl_{10}O_{17}$:Eu, which is constituted by growing particles having a nearly hexagonal shape typical of regular crystal growth and emits light in the blue region, europium-activated calcium halphosphate phosphors represented by $(Mg,Ca,Sr,Ba)_5(PO_4)_3(Cl,F)$:Eu, which is constituted by growing particles having a nearly spherical shape typical of regular crystal growth and emits light in the blue region, europium-activated alkaline earth chloroborate phosphors represented by $(Ca,Sr,Ba)_2B_5O_9Cl$:Eu, which is constituted by growing particles having a nearly cubic shape typical of regular crystal growth and emits light in the blue region, and europium-activated alkaline earth aluminate phosphors represented by $(Sr,Ca,Ba)Al_2O_4$:Eu or $(Sr,Ca,Ba)_4Al_{14}O_{25}$:Eu, which is constituted by fractured particles having fractured surfaces and emits light in the blue green region.

Other examples of the blue phosphor include: Sn-activated phosphate such as $Sr_2P_2O_7$:Sn; Eu-activated aluminate such as $(Sr,Ca,Ba)Al_2O_4$:Eu or $(Sr,Ca,Ba)_4Al_{14}O_{25}$:Eu, $BaMgAl_{10}C_{17}$:Eu, $(Ba,Sr,Ca)MgAl_{10}O_{17}$:Eu, $BaMgAl_{10}O_{17}$:Eu,Tb,Sm and $BaAl_8O_{13}$:Eu; Ce-activated thiogalate such as $SrGa_2S_4$:Ce and $CaGa_2S_4$:Ce; Eu,Mn-activated aluminate such as $(Ba,Sr,Ca)MgAl_{10}O_{17}$:Eu,Mn; Eu-activated halophosphate such as $(Sr,Ca,Ba,Mg)_{10}(PO_4)_6Cl_2$:Eu and $(Ba,Sr,Ca)_5(PO_4)_3(Cl,F,Br,OH)$:Eu,Mn,Sb; Eu-activated silicate such as $BaAl_2Si_2O_8$:Eu, $(Sr,Ba)_3MgSi_2O_8$:Eu; Eu-activated phosphate such as $Sr_2P_2O_7$:Eu; sulfide such as ZnS:Ag and ZnS:Ag,Al; Ce-activated silicate such as $Y_2SiO_5$:Ce; tungstate such as $CaWO_4$; Eu,Mn-activated borophosphate such as $(Ba,Sr,Ca)BPO_5$:Eu,Mn, $(Sr,Ca)_{10}(PO_4)_6 \cdot nB_2O_3$:Eu and $2SrO \cdot 0.84P_2O_5 \cdot 0.16B_2O_3$:Eu; Eu-activated halosilicate such as $Sr_2Si_3O_8 \cdot 2SrCl_2$:Eu; Eu-activated oxynitride such as $SrSi_9Al_{19}ON_{31}$:Eu and $EuSi_9Al_{19}ON_{31}$; and Ce-activated oxynitride such as $La_{1-x}Ce_xAl(Si_{6-z}Al_z)(N_{10-z}O_z)$ (here, x and z are numbers satisfying $0 \leq x \leq 1$ and $0 \leq z \leq 6$, respectively) and $La_{1-x-y}Ce_xCa_yAl(Si_{6-z}Al_z)(N_{10-z}O_z)$ (here, x, y and z are numbers satisfying $0 \leq x \leq 1$, $0 \leq y \leq 1$ and $0 \leq z \leq 6$, respectively).

Also applicable as the blue phosphor are, for example, fluorescent dyes such as naphthalimide compound, benzoxazole compound, styryl compound, coumarine compound, pyrazoline compound and triazole compound, and organic phosphors such as thulium complex.

Among them, it is preferable that the blue phosphor contains $(Ca,Sr,Ba)MgAl_{10}O_{17}$:Eu, $(Sr,Ca,Ba,Mg)_{10}(PO_4)_6(Cl,F)_2$:Eu or $(Ba,Ca,Mg,Sr)_2SiO_4$:Eu. It is more preferable that it contains $(Ca,Sr,Ba)MgAl_{10}O_{17}$:Eu, $(Sr,Ca,Ba,Mg)_{10}(PO_4)_6 (Cl,F)_2$:Eu or $(Ba,Ca,Sr)_3MgSi_2O_8$:Eu. It is still more preferable that it contains $BaMgAl_{10}O_{17}$:Eu, $Sr_{10}(PO_4)_6(Cl,F)_2$:Eu or $Ba_3MgSi_2O_8$:Eu. Of these, $(Sr,Ca,Ba,Mg)_{10}(PO_4)_6Cl_2$:Eu or $(Ca,Sr,Ba)MgAl_{10}O_{17}$:Eu is particularly preferable in uses for a lighting system and a display.

(Yellow Phosphor)

When a yellow phosphor is used as the second phosphor, any kind of yellow phosphor can be used, insofar as the advantage of the present invention is not significantly impaired. It is preferable that the emission-peak wavelength of the yellow phosphor is in the range of usually 530 nm or longer, preferably 540 nm or longer, more preferably 550 nm or longer, and usually 620 nm or shorter, preferably 600 nm or shorter, more preferably 580 nm or shorter.

Examples of the yellow phosphor include various phosphors of such as oxide, nitride, oxynitride, sulfide and oxysulfide.

Particularly preferable examples include garnet phosphors having garnet structures, represented by $RE_3M_5O_{12}$:Ce (here, RE indicates at least one element selected from the group consisting of Y, Tb, Gd, Lu and Sm, M indicates at least one element selected from the group consisting of Al, Ga and Sc) and $M^a_3M^b_2M^c_3O_{12}$:Ce (here, $M^a$, $M^b$ and $M^c$ are divalent, trivalent and tetravalent metal element respectively), for example; orthosilicate phosphors represented by $AE_2M^dO_4$:Eu (here, AE indicates at least one element selected from the group consisting of Ba, Sr, Ca, Mg and Zn, $M^d$ indicates Si and/or Ge), for example; oxynitride phosphors in which a part of the oxygen, contained in the above types of phosphors as constituent element, are substituted by nitrogen; and Ce-activated nitride phosphors having $CaAlSiN_3$ structures such as $AEAlSiN_3$:Ce (here, AE indicates at least one element selected from the group consisting of Ba, Sr, Ca, Mg and Zn).

Also applicable as the yellow phosphor are: Eu-activated phosphors including sulfides such as $CaGa_2S_4$:Eu, $(Ca,Sr)Ga_2S_4$:Eu and $(Ca,Sr)(Ga,Al)_2S_4$:Eu and oxynitrides having SiAlON structure such as $Ca_x(Si,Al)_{12}(O,N)_{16}$:Eu; and Eu-activated or Eu, Mn-coactivated halogenated borate such as $(M_{1-a-b}Eu_aMn_b)_2(BO_3)_{1-p}(PO_4)_pX$ (here, M represents one or more kinds of elements selected from the group consisting of Ca, Sr and Ba, X represents one or more kinds of elements selected from the group consisting of F, Cl and Br, and a, b and p are numbers satisfying $0001 \leq a \leq 0.3$, $0 \leq b \leq 0.3$ and $0 \leq p \leq 0.2$, respectively).

Other examples of the yellow phosphor include fluorescent dyes such as brilliant sulfoflavine FF (Colour Index Number 56205), basic yellow HG (Colour Index Number 46040), eosine (Colour Index Number 45380) and rhodamine 6G (Colour Index Number 45160).

(Combination of Second Phosphors)

The above-mentioned second phosphors can be used either as a single kind or as a mixture of two or more kinds in any combination and in any ratio. There is no special limitation on the ratio between the first phosphor and the second phosphor, insofar as the advantage of the present invention is not significantly impaired. Accordingly, the amount of the second phosphors used, as well as the combination and the mixing ratio of the phosphors used as the second phosphor, can be set arbitrarily according to the use or the like of the light emitting device.

Whether the above-described second phosphors (orange or red phosphors, blue phosphors, yellow phosphors, or the like) are used or not and what kind of them are used, in the light emitting device of the present invention, can be decided as appropriate depending on the use of the light emitting device. For example when the light emitting device of the present invention is constructed so that it is used as green light emitting device, it usually requires only the first phosphor (green phosphor) without any second phosphor.

On the other hand, when the light emitting device of the present invention is constructed so that it is used as white light emitting device, it would be better to combine the first luminous body, the first phosphor (green phosphor) and the second phosphor appropriately, for synthesizing the desired white color. Concrete examples of the preferable combination of the first luminous body, the first phosphor and the second phosphor, when the light emitting device of the present invention is constructed so that it is used as white light emitting device, include the following ones (i) to (iii).

(i) A blue luminous body (blue LED or the like) as the first luminous body, a green phosphor (the phosphor of the present invention or the like) as the first phosphor, and a red phosphor as the second phosphor are used. In this case, as red phosphor, one or more than one kind of red phosphor selected from the group consisting of (Sr,Ca)AlSiN$_3$:Eu is preferable.

(ii) A near-ultraviolet luminous body (near-ultraviolet LED or the like) as the first luminous body, a green phosphor (the phosphor of the present invention or the like) as the first phosphor, and a combination of a blue phosphor and a red phosphor as the second phosphor, are used. In this case, as blue phosphor, one or more than one kind of blue phosphor selected from the group consisting of (Ba,Sr,Ca)MgAl$_{10}$O$_{17}$:Eu and (Mg,Ca,Sr,Ba)$_5$(PO$_4$)$_3$(Cl,F):Eu is preferable. As red phosphor, one or more than one kind of red phosphor selected from the group consisting of (Sr, Ca)AlSiN$_3$:Eu and La$_2$O$_2$S:Eu is preferable. It is particularly preferable to use a near-ultraviolet LED, the phosphor of the present invention, BaMgAl$_{10}$O$_{17}$:Eu as blue phosphor, and (Sr,Ca)AlSiN$_3$:Eu as red phosphor, in combination.

(iii) A blue luminous body (blue LED or the like) as the first luminous body, a green phosphor (the phosphor of the present invention or the like) as the first phosphor, and an orange phosphor as the second phosphor are used. In this case, as orange phosphor is preferably used (Sr,Ba)$_3$SiO$_5$:Eu.

Preferable concrete examples of the combination of phosphors in the case of the above-mentioned (i) are listed in Table 2.

TABLE 2

[Examples of phosphor combination]

| first luminous body | second luminous body | |
|---|---|---|
| | first phosphor | other phosphor |
| blue LED | phosphor of the present invention | CaAlSiN$_3$:Eu |
| | | SrAlSiN$_3$:Eu |
| | | (Ca$_{1-x}$, Sr$_x$)AlSiN$_3$:Eu (0 < x < 1) |
| | | (Ca$_{0.2}$, Sr$_{0.8}$)AlSiN$_3$:Eu |
| | | CaAlSiN$_3$:Eu and (Ca$_{1-x}$, Sr$_x$)AlSiN$_3$:Eu (0 < x < 1) |
| | | Ca$_2$Si$_5$N$_8$:Eu |
| | | Sr$_2$Si$_5$N$_8$:Eu |
| | | (Sr, Ba, Ca, Mg)Si$_5$N$_8$:Eu |
| | | (Ca$_{1-x}$, Sr$_x$)S:Eu (0 ≦ x ≦ 1) |
| | | (Sr, Ba, Ca)$_3$SiO$_5$:Eu |
| | | (Ba, Sr, Ca, Mg)$_2$SiO$_4$:Eu, Mn |
| | | (Mg, Ca, Sr, Ba)SiN$_2$:Eu |

In the above-listed combinations, additional use of another green phosphor such as (Ba,Sr)$_2$SiO$_4$:Eu or Sr$_2$GaS$_4$:Eu, as shown in Table 3 below, can realize a light emitting device for a light source of a liquid crystal back-lighting, which is superior particularly in balance between the color tone and emission intensity.

TABLE 3

[Examples of phosphor combination]

| first luminous body | second luminous body | | |
|---|---|---|---|
| | first phosphor | other phosphor (1) | other phosphor (2) |
| blue LED | phosphor of the present invention | (Ba, Sr)$_2$SiO$_4$:Eu and/or Sr$_2$GaS$_4$:Eu | CaAlSiN$_3$:Eu<br>SrAlSiN$_3$:Eu<br>(Ca$_{1-x}$, Sr$_x$)AlSiN$_3$:Eu (0 < x < 1)<br>(Ca$_{0.2}$, Sr$_{0.8}$)AlSiN$_3$:Eu<br>CaAlSiN$_3$:Eu and<br>(Ca$_{1-x}$, Sr$_x$)AlSiN$_3$:Eu (0 < x < 1)<br>Ca$_2$Si$_5$N$_8$:Eu<br>Sr$_2$Si$_5$N$_8$:Eu<br>(Sr, Ba, Ca, Mg)Si$_5$N$_8$:Eu<br>(Ca$_{1-x}$, Sr$_x$)S:Eu (0 ≦ x ≦ 1)<br>(Sr, Ba, Ca)$_3$SiO$_5$:Eu<br>(Ba, Sr, Ca, Mg)$_2$SiO$_4$:Eu, Mn<br>(Mg, Ca, Sr, Ba)SiN$_2$:Eu |

The phosphor of the present invention can be used as a mixture with another phosphor (in this context, "mixture" does not necessary mean to blend the phosphors with each other, but means to use different kinds of phosphors in combination). Among them, the combined use of phosphors described above will provide a preferable phosphor mixture. There is no special limitation on the kind or the ratio of the phosphors mixed.

(Sealing Material)

The above-mentioned first and/or second phosphors are usually used by being dispersed in a liquid medium, which serves as a sealing material, in the light emitting device of the present invention.

Examples of that liquid medium include the same ones as described in the aforementioned sections regarding phosphor-containing composition.

The liquid medium may contain a metal element that can be a metal oxide having high refractive index, for the purpose of adjusting the refractive index of the sealing member. Examples of a metal oxide having high refractive indexes include Si, Al, Zr, Ti, Y, Nb and B. These metal elements can be used as a single kind or as a mixture of two or more kinds in any combination and in any ratio.

There is no special limitation on the state of existence of such metal elements, insofar as the transparency of the sealing member does not deteriorate. For example, they may exist as a uniform glass layer of metalloxane bonds or as particles in the sealing member. When they exist in a state of particles, the structure inside the particles may be either amorphous or crystal structure. However, for higher refractive index, the crystal structure is preferable. In such a case, the particle diameter thereof is usually equal to or smaller than the luminous wavelength of a semiconductor light emitting device, and preferably 100 nm or smaller, more preferably 50 nm or smaller, particularly preferably 30 nm or smaller, in order not to impair the transparency of the sealing member. The above-mentioned metal elements in a state of particles contained in the sealing member can be obtained by means of adding, to a silicone material, such particles as silicon oxide, aluminium oxide, zirconium oxide, titanium oxide, yttrium oxide, niobium oxide or the like, for example.

Furthermore, the above-mentioned liquid medium may be further added with a known additive such as diffusing agent, filler, viscosity modifier and UV absorbing agent. These additives can be used either as a single kind or as a combination of two or more kinds in any combination and in any ratio.

[9-2. (Other) Configurations of Light Emitting Device]

There is no special limitation on the other configuration of the light emitting device of the present invention, insofar as it comprises the above-mentioned first luminous body and second luminous body. However, it usually comprises a frame on which the above-mentioned first luminous body and second luminous body are located. The location is configured so that the second luminous body is excited (namely, the first and second phosphors are excited) by the light emitted from the first luminous body to emit light and the lights from the first luminous body and/or from the second luminous body are radiated to the outside. At this point, it is not always necessary for the first and second phosphors to be contained in the same layer. Each of different colored phosphors may be contained in the different layer from each other. For example, a layer containing the second phosphor can be laminated on a layer containing the first phosphor.

The light emitting device of the present invention may also utilize a member other than the above-mentioned excitation light source (the first luminous body), the phosphor (the second luminous body) and a frame. As an example, the aforementioned sealing material can be cited. The sealing material can be used for, in addition to dispersing the phosphor (the second luminous body), adhering the excitation light source (the first luminous body), the phosphor (the second luminous body) and the frame to each other, in the light emitting device.

[9-3. Embodiment of Light Emitting Device]

The light emitting device of the present invention will be explained in detail below with reference to a concrete embodiment. However, it is to be noted that the present invention is by no means restricted to the following embodiment and any modifications can be added thereto insofar as they do not depart from the scope of the present invention.

FIG. 1 is a schematic perspective view illustrating the positional relationship between the first luminous body, which functions as the excitation light source, and the second luminous body, constructed as the phosphor-containing part containing a phosphor, in an example of the light emitting device of the present invention. In FIG. 1, the numeral 1 indicates a phosphor-containing part (second luminous body), the numeral 2 indicates a surface emitting type GaN-based LD as an excitation light source (first luminous body), and the numeral 3 indicates a substrate. In order to configure them so that they are in contact with each other, the LD (2) and the phosphor-containing part (second luminous body) (1), prepared separately, may be made contact with each other in their surfaces by means of adhesive or the like, or otherwise, a layer of the phosphor-containing part (second luminous body) may be formed (molded) on the emission surface of the LD (2). With such configurations, the LD (2) and the phosphor-containing part (second luminous body) (1) can be kept contact with each other.

With such device configurations, light quantity loss, induced by a leakage of light emitted from the excitation light source (first luminous body) and reflected on the layer surface of the phosphor-containing part (second luminous body) to outside, can be avoided, which makes possible enhancement in emission efficiency of the entire device.

Figure 2A:
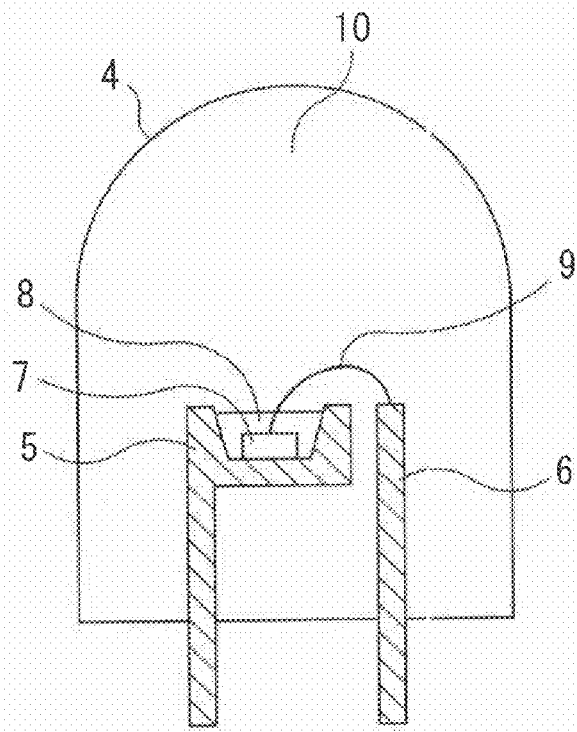
FIG. 2(a) and FIG. 2(b) are schematic sectional views illustrating an example of the light emitting device comprising an excitation light source (first luminous body) and a phosphor-containing part (second luminous body).

FIG. 2(*a*) shows a typical example of a light emitting device generally called a shell type. It is a schematic sectional view illustrating an example of the light emitting device comprising an excitation light source (first luminous body) and a phosphor-containing part (second luminous body). In this light emitting device (4), the numeral 5, numeral 6, numeral 7, numeral 8, numeral 9 and numeral 10 indicate a mount lead, inner lead, excitation light source (first luminous body), phosphor-containing resinous part, conductive wire and mold member, respectively.

FIG. 2(*b*) shows a typical example of a light emitting device generally called a surface-mount type. It is a schematic sectional view illustrating an example of the light emitting device comprising an excitation light source (first luminous body) and a phosphor-containing part (second luminous body). In the Figure, the numeral 22, numeral 23, numeral 24, numeral 25 and numerals 26, 27 indicate an excitation light source (first luminous body), a phosphor-containing resinous part as phosphor-containing part (second luminous body), a frame, a conductive wire and electrodes, respectively.

[9-4. Application of Light Emitting Device]

There is no special limitation on the application of the light emitting device of the present invention, and therefore it can be used in various fields where a usual light emitting device is used. However, owing to its high color rendering, it can be particularly preferably used as a light source of a lighting system or an image display.

[9-4-1. Lighting System]

The application of the light emitting device of the present invention to a lighting system can be carried out by incorporating a light emitting device such as described earlier into a known lighting system as appropriate. A surface-emitting lighting system (11), shown in FIG. 3, in which the aforementioned light emitting device (4) is incorporated, can be cited as an example.

Figure 3:
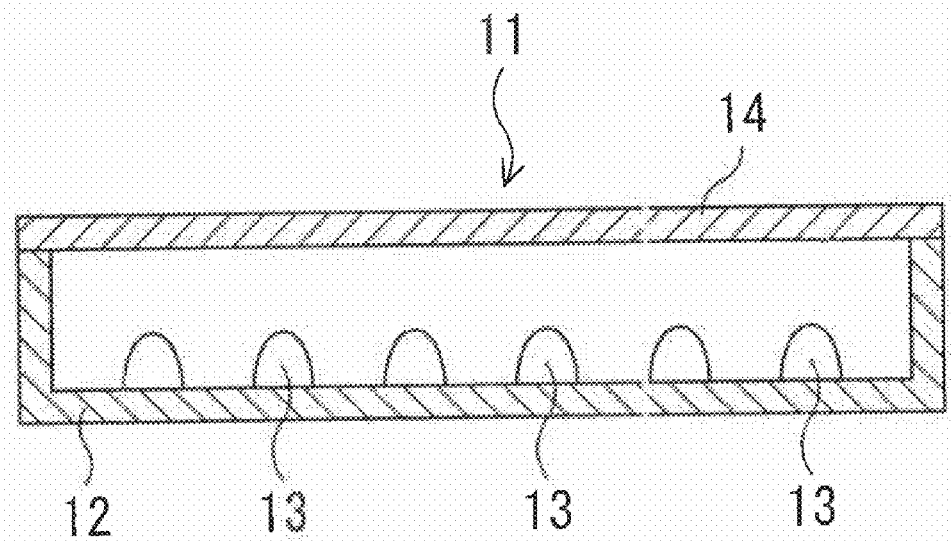
FIG. 3 is a sectional view schematically illustrating an embodiment of the lighting system of the present invention.

FIG. 3 is a sectional view schematically illustrating an embodiment of the lighting system of the present invention. As shown in this FIG. 3, the surface-emitting lighting system comprises a large number of light emitting devices (13) (corresponding to the aforementioned light emitting device (4)) on the bottom surface of a rectangular holding case (12), of which inner surfaces are made to be opaque ones such as white smooth surfaces, and a power supply, circuit or the like (not shown in the figure) for driving the light emitting devices (13) outside the holding case (12). In addition, it comprises a milky-white diffusion plate (14), such as an acrylic plate, at the place corresponding to the cover part of the holding case (12), for homogenizing the light emitted.

When the surface-emitting lighting system (11) is driven by means of applying a voltage to the excitation light source (the first luminous body) of the light emitting device (13), light is emitted from the light source and the aforementioned phosphor in the phosphor-containing resinous part, which serves as phosphor-containing part (the second luminous body), absorbs a part of the emitted light and emits visible light. On the other hand, the blue light that is not absorbed in the phosphor is mixed with the visible light to form a light emission with high color rendering, and then the mixed light passes through the diffusion plate (14) to be radiated in the upward direction of the figure. Consequently, an illumination light with a brightness that is uniform within the surface of the diffusion plate (14) of the holding case (12) can be obtained.

[9-4-2. Image Display]

When the light emitting device of the present invention is used as a light source in an image display, there is no limitation on the concrete configuration of the image display. However, it is preferable to be used together with a color filter. For example, a color image display, which is a kind of image display, utilizing a color liquid-crystal display element can be formed by combining the above-mentioned light emitting device as back-lighting, an optical shutter utilizing a liquid crystal, and a color filter having red, green and blue picture elements.

EXAMPLE

The present invention will be described in more detail below by referring to examples. However, it is to be understood that the present invention is by no means limited by the following examples insofar as they do not depart from the scope of the invention.

Example Group I

I-1

Methods of Measurements

[Method for Measuring Non-Luminous Object Color]

The non-luminous object colors were measured using a calorimeter CR-300, manufactured by MINOLTA, using D65 as the standard illuminant. The sample was filled into a circular cell and the surface thereof was smoothed. Then the measurement was performed with the smoothed surface pushed onto the measuring portion of the calorimeter.

[Method for Measuring Emission Spectrum]

The emission spectrum was measured by using a fluorescence measurement apparatus (manufactured by JASCO corporation) equipped with an excitation light source of 150-W xenon lamp and a spectrum measurement apparatus of multichannel CCD detector, C7041 (manufactured by Hamamatsu Photonics K.K.). The light from the excitation light source was passed through a grating monochromator with focal length of 10 cm so as to isolate the light having wavelength of 455 nm, and the isolated excitation light was radiated onto the phosphors via optical fibers. The light emitted from the phosphor at the time of irradiation with the excitation light was separated using a grating monochromator with focal length of 25 cm, and the emission intensity of each wavelength of the light was measured using the spectrum measurement apparatus at the wavelength range of from 300 nm to 800 nm. Through a signal processing by a personal computer, such as sensitivity correction, the emission spectrum was obtained. The measurement was performed with the slit width of the receiving spectroscope being specified at 1 nm and at a room temperature.

[Measurement of Wavelength and Intensity of Maximum Emission Peak]

The maximum emission peak wavelength was read out from the obtained emission spectrum. The maximum emission peak intensity was represented by the relative amount with the maximum emission-peak intensity of YAG:Ce phosphor, P46-Y3, manufactured by Kasei Optonix, Ltd., taken as 100.

[Measurement of Color Coordinate and Brightness]

Color coordinates x and y of XYZ calorimetric system, defined in JIS Z8701, were calculated from the data of the emission spectrum in the wavelength region of from 480 nm to 800 nm by a method in accordance with JIS Z8724. The brightness was expressed by the relative amount in the same way as the maximum emission peak intensity with the brightness of YAG:Ce phosphor, P46-Y3, manufactured by Kasei Optonix, Ltd., taken as 100.

[Measurement of Particle Size Characteristics]

The particle size characteristics was measured using a laser diffraction/scattering particle size distribution analyzer, LA-300, manufactured by HORIBA, Ltd., at a room temperature. The value of particle diameter whose integrated value is 50% in the weight-standard particle size distribution curve was adopted as the weight-average median diameter $D_{50}$. In addition, $QD=(D_{75}-D_{25})/(D_{75}+D_{25})$ was calculated, with the values of particle diameter whose integrated values are 25% and 75% respectively being adopted as $D_{25}$ and $D_{75}$.

[Measurement of Aspect Ratio]

The percentage of the number of the particles of which aspect ratio is 3 or smaller was decided as follows. The photo of the phosphor was taken using a scanning electron microscope (for example, Hitachi S-4500, manufactured by Hitachi, Ltd.) at 500 to 5000-fold magnification. After randomly selecting 30 particles in one field of view of the micrograph obtained, their major axes and minor axes were measured with a ruler. Each aspect ratio was decided as the value of "major axis/minor axis". Then the ratio of the particles having aspect ratio of 3 or smaller was calculated.

[Measurement of Single Particle Ratio]

30 particles in one field of view of the micrograph were randomly selected. The particles with and without a grain boundary induced by fusing in each particle image were separated, and then the number of each group of the particles was counted. The single particle ratio was calculated as the ratio of the particles without a grain boundary relative to the total number (namely, 30).

[Analysis of Chemical Composition]

The quantitative analysis of the trace elementals was performed with a glow discharge mass spectrometry (GD-MS) in which the surface of the cathode consisting of the solid sample was sputtered by glow discharge and neutral particles emitted were ionized by collision with Ar or electrons in the plasma.

[Measurement of the Ratio of the Particles of which Degree of Circularity is Smaller than 85%]

Before measuring the degree of circularity, the sample phosphor was dispersed by ultrasonic wave for 60 sec using a ultrasonic washing machine (manufactured by Iuchi). Then the degree of circularity of the sample was measured using a flow particle image analyzer ("FPIA-2000", manufactured by SYSMEX CORPORATION). The method of calculating the average circularity using this apparatus was as follows. Namely, the particle image (picture) was taken for each particle, and then the projected area and peripheral length of the particles were decided from the particle images obtained by an image processing. The circumference of the imaginary circle, which is assumed to have the same area as the projected area of the particle image, was calculated. Then the degree of circularity was calculated by dividing the circumference with the peripheral length of the particle. "The percentage of the number of the particles of which degree of circularity is smaller than 85%" was calculated as the ratio of the number of the particles having a degree of circularity which is smaller than 0.85 relative to the total number of the particles measured. The smaller this value is, the larger the ratio of the particles having near spherical shapes is.

I-2

Examples I-1 to I-6 and Comparative Examples I-1 to I-4

In each Example and Comparative Example, each phosphor material was weighed out by a known method so that the mixed composition would be $CaSc_2O_4$:Ce. $CaCO_3$ was used as Ca-source. $Sc_2O_3$ was used as Sc-source. $CeO_2$ was used as Ce-source.

The materials weighed out were blended sufficiently and transferred into an alumina crucible having a lid. After the crucible was kept at 1450° C. in the air under atmospheric pressure for 1 hour and then cooled, it was taken out from the furnace. After adding the flux components, lithium phosphate ($Li_3PO_4$), calcium chloride ($CaCl_2$), potassium chloride (KCl), potassium hydrogenphosphate ($KH_2PO_4$) and $Li_2SO_4 \cdot H_2O$, to the obtained fired product and blending them well, it was transferred into an alumina crucible again.

After it was heated at 1450° C. in a hydrogen-containing (4 volume %) nitrogen atmosphere under atmospheric pressure for 10 hours, the fired product was cooled and retrieved.

The fired product was added with an alumina ball of 3-mm diameter and HCl of 1-mol/L concentration, and then subjected to a ball mill. This was washed with HCl of 1.3-mol/L concentration. Subsequently, it was washed with water and, at the same time, subjected to elutriation, thereby removing the micro particles and coarse particles.

The Ce content of the obtained phosphor was measured by means of ICP-MS (inductively-coupled plasma mass spectrometry). The results are shown in Table 4.

In addition, such luminescent characteristics of the obtained phosphor as maximum emission peak wavelength, color coordinates, maximum emission-peak intensity and brightness were measured, in accordance with the above-mentioned measurement methods. The results are shown in Table 4.

In addition, with respect to the obtained phosphors, the powder characteristics including particle size characteristics (weight-average median diameter $D_{50}$ and QD), average aspect ratio, ratio of the particles whose aspect ratio is smaller than 3 in the total particles, single particle ratio and ratio of the particles whose degree of circularity is smaller than 85% were measured. The results are shown in Table 5.

Furthermore, with respect to the representative examples (Examples I-1, I-2 and Comparative Example I-4) among the obtained phosphors, the elemental analyses of each Li, K, P and Cl contained in the phosphors were carried out by means of GD-MS. The results are shown in Table 5.

Figure 4:
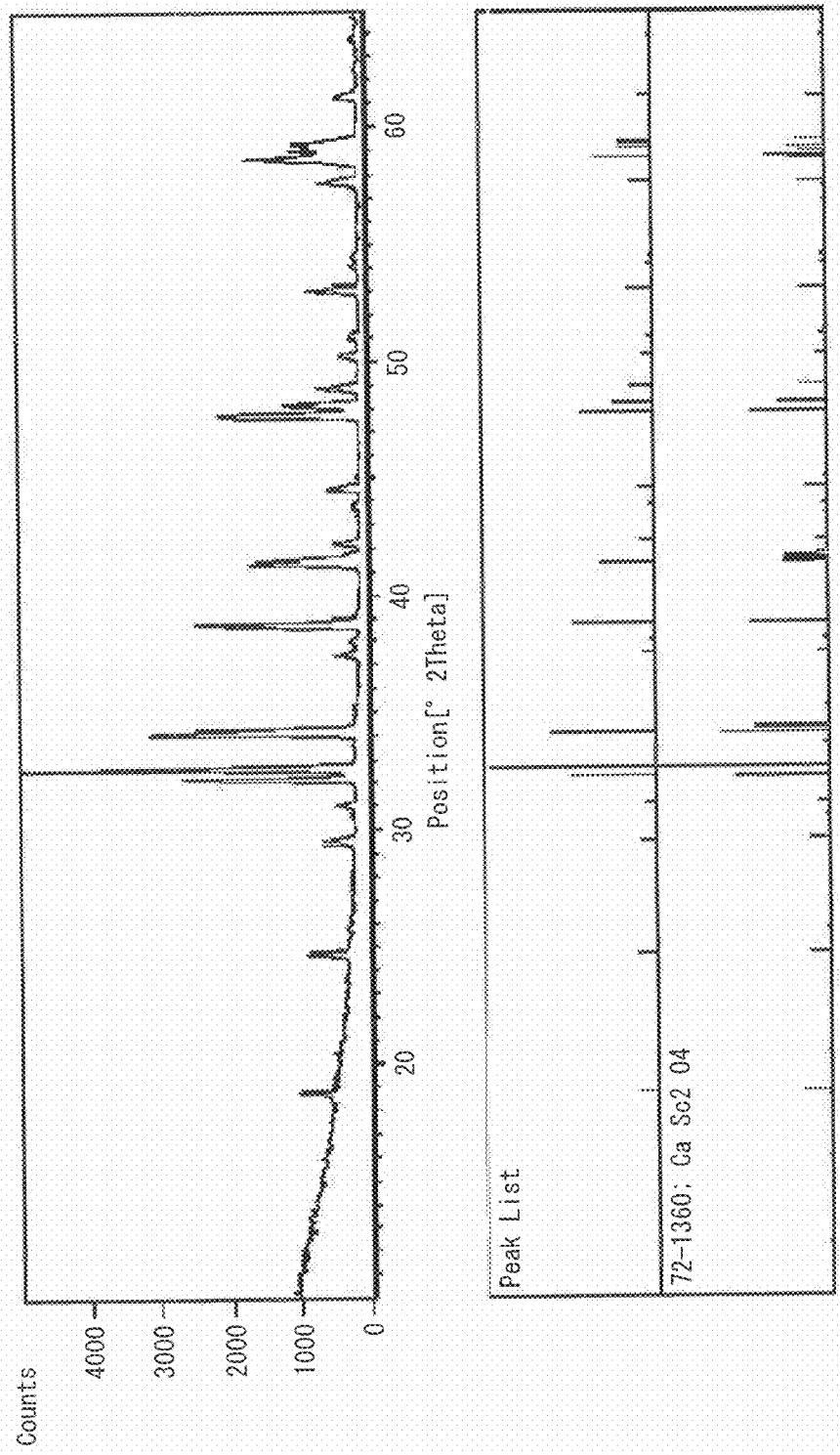
FIG. 4 is a graph showing an X-ray diffraction measurement result of Example I-1 of the present invention.

The result of measuring the X-ray diffraction pattern of the phosphor obtained in Example I-1 is shown in FIG. 4. In FIG. 4, the top graph shows the raw data of the measurement result. The upper one of the two, bottom graphs, shows the positions and intensities of the peaks, obtained by a peak detection from the measurement result. The lower one of the two, bottom graphs shows the positions and intensities of the peaks of No. 72-1360 ($CaSc_2O_4$) in JCPDS-ICDD PDF (Joint Committee on Powder Diffraction Standards-International Centre for Diffraction Data Powder Diffraction File; a standard chart file of powder X-ray diffraction). It is evident that the obtained phosphor has the same structure as $CaSc_2O_4$, which is known to have $CaFe_2O_4$-type structure, because the peak positions and the intensities shown in the upper and lower graphs of the two, bottom graphs, are almost the same. Though there may be a small amount of change in lattice constant, presence of crystal defect, and distortion of the structure in the phosphor of the present invention due to addition of Ce, luminescent center element, they can be still judged to be of the same structure when comparing their powder X-ray diffraction patterns. Furthermore, it is evident that a crystal phase (phosphor phase) other than that of the same structure as $CaSc_2O_4$, namely, impurity phase, is not contained in the phosphor of the present invention, from the reason that there are no peaks appearing, in the upper pattern of the bottom graphs, which do not exist in the lower pattern of the bottom graphs.

Examples I-1 to I-6 are phosphors fired with predetermined fluxes. The particle shapes of their obtained phosphors are nearly spherical. In contrast, Comparative Example I-1 is a case with no flux added, Comparative Example I-4 is a case with flux of only $CaF_2$ added, and Comparative Examples I-2 and I-3 are cases with flux of only $CaCl_2$ added.

Figure 5:
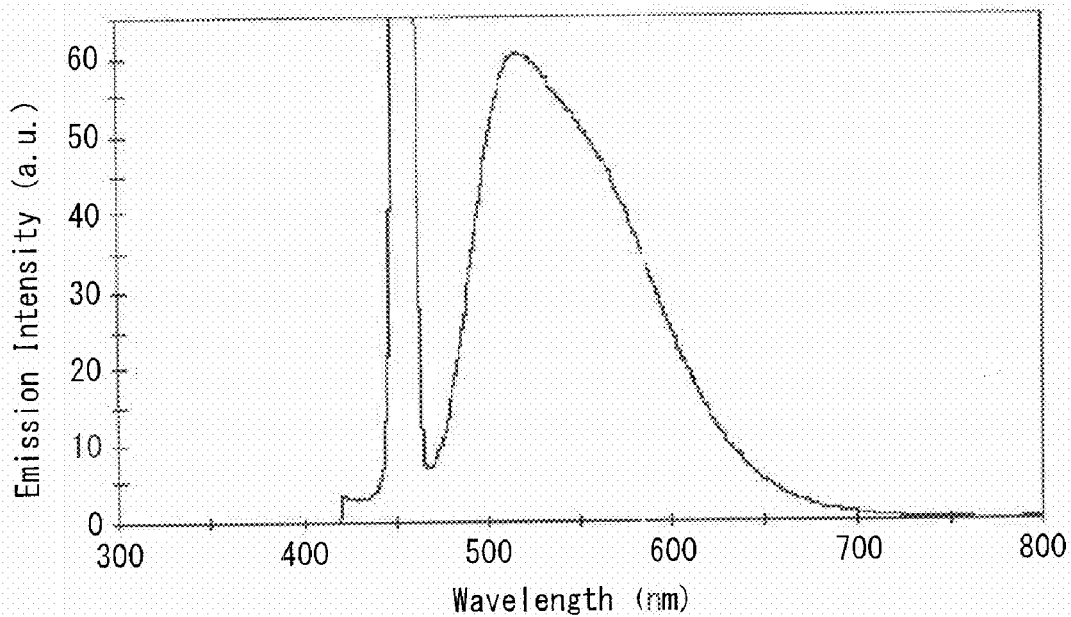
FIG. 5 is a graph showing the emission spectrum of the phosphor prepared in Example I-1 of the present invention.

FIG. 5 shows the emission spectrum of the phosphor obtained in Example I-1.

TABLE 4

[Amounts of fluxes used and luminescent characteristics]

| | Ce activation amount | flux | | | | | | luminesent characteristics | | | | |
|---|---|---|---|---|---|---|---|---|---|---|---|---|
| | | CaCl$_2$ | CaF$_2$ | Li$_3$PO$_4$ | KH$_2$PO$_4$ | KCl | Li$_2$SO$_4$·H$_2$O | maximum emission peak wavelength | color coordinate | | maximum emission peak intensity | brightness |
| | mol | weight % | weight % | weight % | weight % | weight % | weight % | nm | x | y | % | % |
| Example I-1 | 0.01 | 12 | 0 | 5 | 0 | 2 | 0 | 516 | 0.341 | 0.585 | 158 | 136 |
| Example I-2 | 0.01 | 12 | 0 | 5 | 0 | 0 | 2 | 515 | 0.341 | 0.584 | 157 | 134 |
| Example I-3 | 0.01 | 12 | 0 | 4 | 4 | 0 | 0 | 516 | 0.341 | 0.584 | 150 | 130 |
| Example I-4 | 0.005 | 10 | 0 | 4 | 4 | 0 | 0 | 514 | 0.336 | 0.587 | 155 | 130 |
| Example I-5 | 0.006 | 10 | 0 | 4 | 4 | 0 | 0 | 514 | 0.337 | 0.586 | 156 | 131 |
| Example I-6 | 0.008 | 10 | 0 | 4 | 4 | 0 | 0 | 515 | 0.339 | 0.586 | 156 | 131 |
| Comparative Example I-1 | 0.01 | 0 | 0 | 0 | 0 | 0 | 0 | 516 | 0.339 | 0.586 | 136 | 115 |
| Comparative Example I-2 | 0.01 | 20 | 0 | 0 | 0 | 0 | 0 | 515 | 0.339 | 0.583 | 123 | 104 |
| Comparative Example I-3 | 0.01 | 25 | 0 | 0 | 0 | 0 | 0 | 514 | 0.339 | 0.582 | 122 | 104 |
| Comparative Example I-4 | 0.01 | 0 | 0.5 | 0 | 0 | 0 | 0 | 514 | 0.341 | 0.583 | 140 | 220 |

TABLE 5

[powder characteristics and flux residual component]

| | powder characteristics | | | | | | flux residual component | | | |
|---|---|---|---|---|---|---|---|---|---|---|
| | particle size characteristics | | | aspect ratio ratio of 3 or smaller | single particle ratio | ratio of the particles whose degree of circularity is smaller than 85% | Li | K | P | Cl |
| | D$_{50(\mu m)}$ | QD | average | (%) | % | % | ppm | ppm | ppm | ppm |
| Example I-1 | 7.6 | 0.22 | 1.8 | 90 | 85 | 6.8 | 3.2 | 24 | 180 | 400 |
| Example I-2 | 7.7 | 0.22 | 1.8 | 90 | 80 | 5.6 | 3.5 | 84 | 170 | 600 |
| Example I-3 | 8.8 | 0.23 | 2 | 80 | 85 | 7.2 | — | — | — | — |
| Example I-4 | 8 | 0.22 | 2 | 80 | 80 | 7.0 | — | — | — | — |
| Example I-5 | 8.5 | 0.22 | 2 | 80 | 80 | 7.0 | — | — | — | — |
| Example I-6 | 8.2 | 0.23 | 2 | 80 | 80 | 6.0 | — | — | — | — |
| Comparative Example I-1 | 15 | 0.28 | indefinite | unmeasurable | 5 | 38.5 | — | — | — | — |
| Comparative Example I-2 | 9 | 0.25 | 3 | 50 | 80 | 19.9 | — | — | — | — |
| Comparative Example I-3 | 10 | 0.29 | 3.5 | 40 | 80 | 11.4 | — | — | — | — |
| Comparative Example I-4 | 10.3 | 0.3 | indefinite | unmeasurable | 5 | 12.6 | 0.07 | 10 | 0.8 | 140 |

I-3

Example I-7: White LED

Figure 2B:
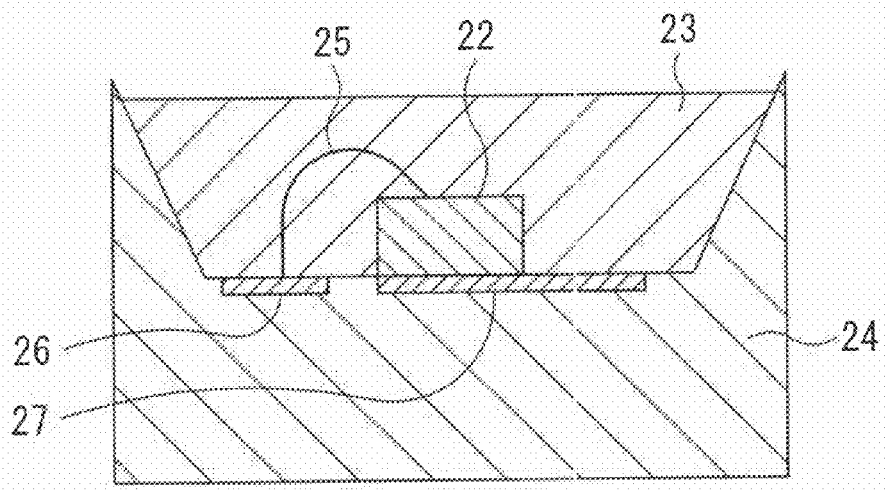

A white light emitting device shown in FIG. 2(b) was produced using a green phosphor obtained in Example I-1 and a red phosphor, $Ca_{0.992}Eu_{0.008}AlSiN_3$, according to the following procedure.

As the first luminous body, a blue LED [22] (C460-MB290-S0100, manufactured by Cree, Inc., having MB grade and light output of 8.0 mW to 11.0 mW) having emission wavelength of 455 nm to 460 nm was used. The blue LED [22] was bonded to the terminal [27] disposed at the bottom of the recess in the frame [24] by means of die bonding using silver paste as adhesive. Then, the blue LED [22] and the electrode [26] of the frame [24] were connected using a gold wire [25], a kind of wire having diameter of 25 µm.

The mixed phosphors consisting of the above-mentioned two kinds of phosphors (the green phosphor and the red phosphor) were blended sufficiently with a silicone resin (JCR6101UP, manufactured by Dow Corning Toray Co., Ltd.) in the ratios described below, and then this mixture consisting of the mixed phosphors and the silicone resin (namely, phosphor-containing composition) was poured inside the recess of the above-mentioned frame [24].

green phosphor:red phosphor=89:11 (weight ratio)
sum of the phosphors:silicone resin=7:100 (weight ratio)

The mixture was maintained at 150° C. for 2 hours so as to cure the silicone resin, thereby forming the phosphor-containing part [23]. A surface-mount white light emitting device was thus produced. In the explanation of the present Example, the reference numerals of the parts corresponding to those in FIG. 2(b) are shown in "[ ]".

Figure 6:
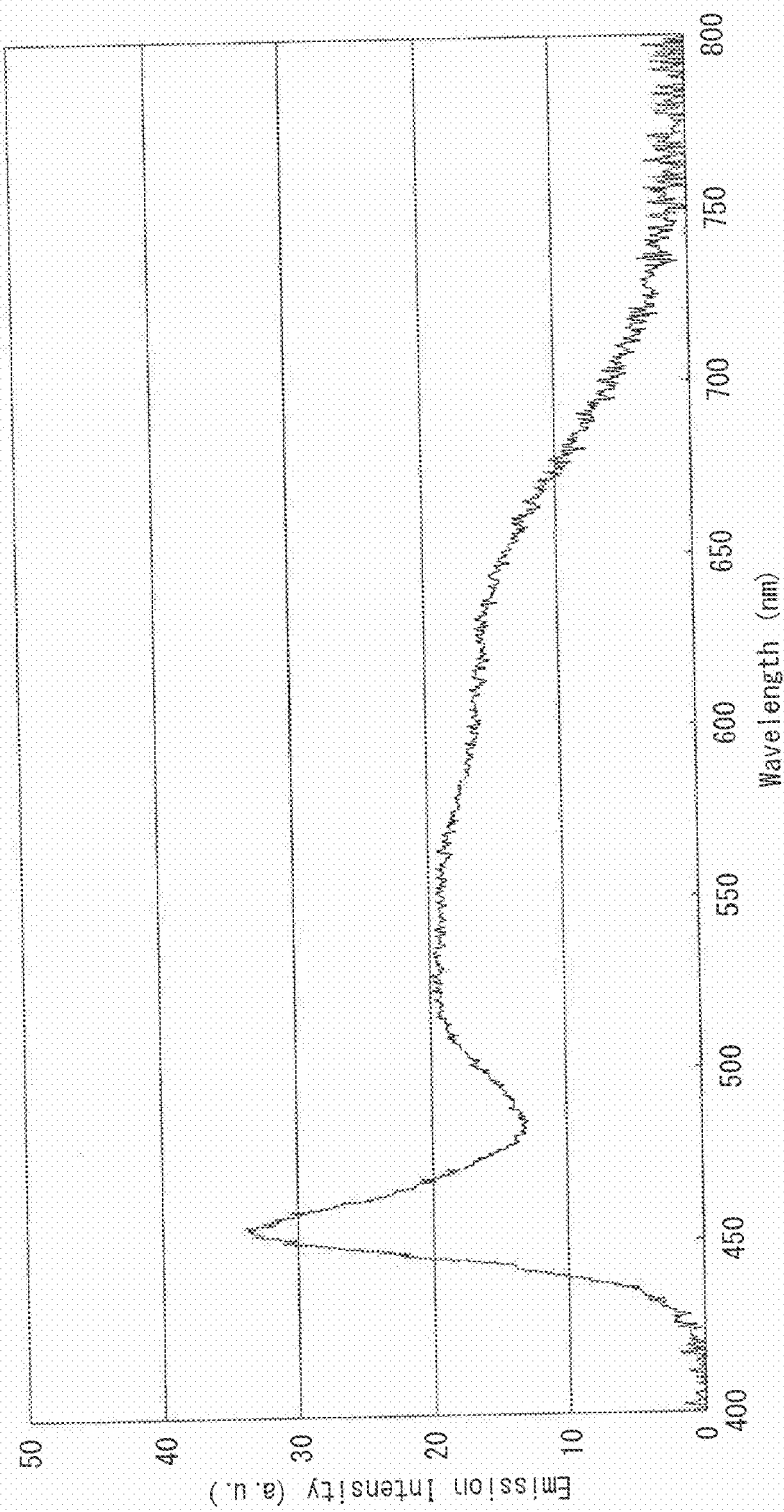
FIG. 6 is a graph showing the emission spectrum of the surface-mount white light emitting device produced in Example I-7 of the present invention.

The emission spectrum of the produced surface-mount white light emitting device was measured. The result is shown in FIG. 6.

I-4

Observation Using Scanning Electron Microscope

The phosphor prepared in Comparative Example I-1 was observed using a scanning electron microscope. The photo, to be used as the substitute of a drawing, of the observed image is shown in FIG. 7.

In addition, the phosphor prepared in Comparative Example I-4 was observed using a scanning electron microscope. The photo, to be used as the substitute of a drawing, of the observed image is shown in FIG. 8.

Figure 7:
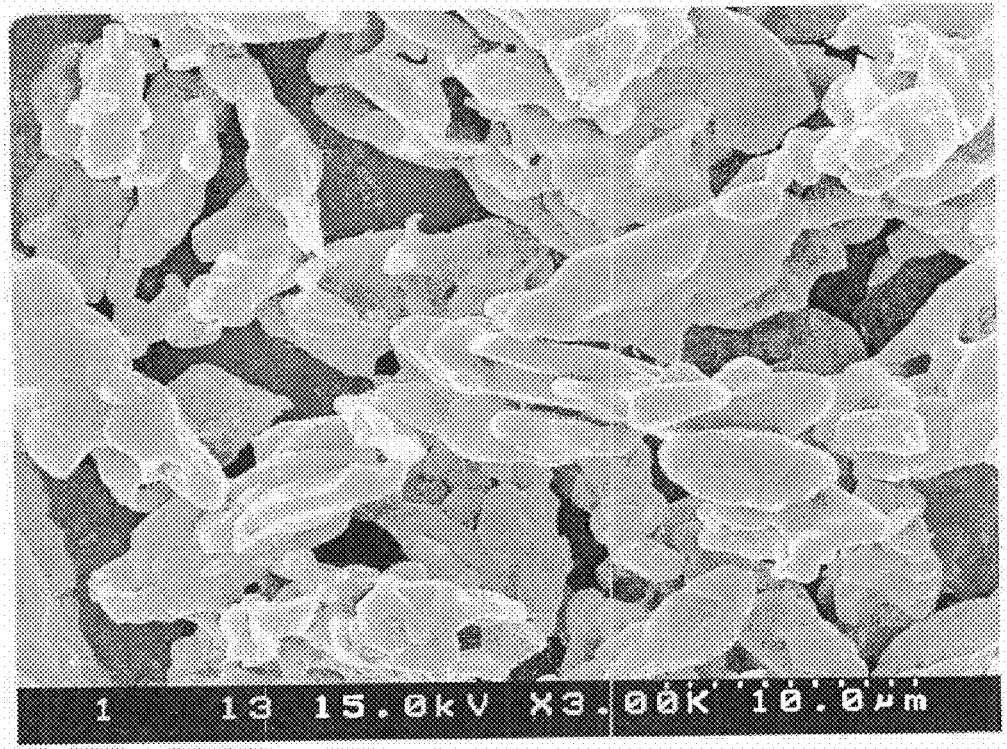
FIG. 7 is a photo, which substitutes for a drawing, showing an image of the phosphor prepared in Comparative Example I-1, which is observed by a scanning electron microscope.
Figure 8:
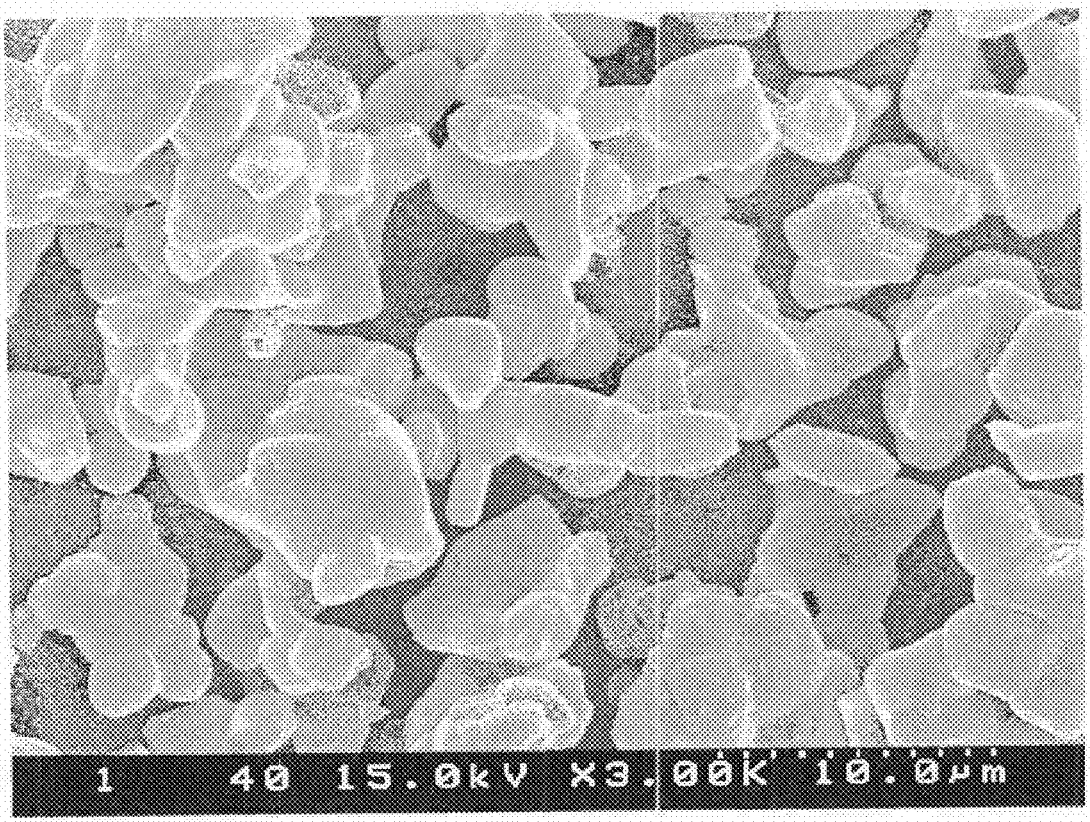
FIG. 8 is a photo, which substitutes for a drawing, showing an image of the phosphor prepared in Comparative Example I-4, which is observed by a scanning electron microscope.

As is evident from FIG. 7 and FIG. 8, the shapes of the particles of the phosphors prepared in these Comparative Examples are indefinite due to fusing.

Figure 9:
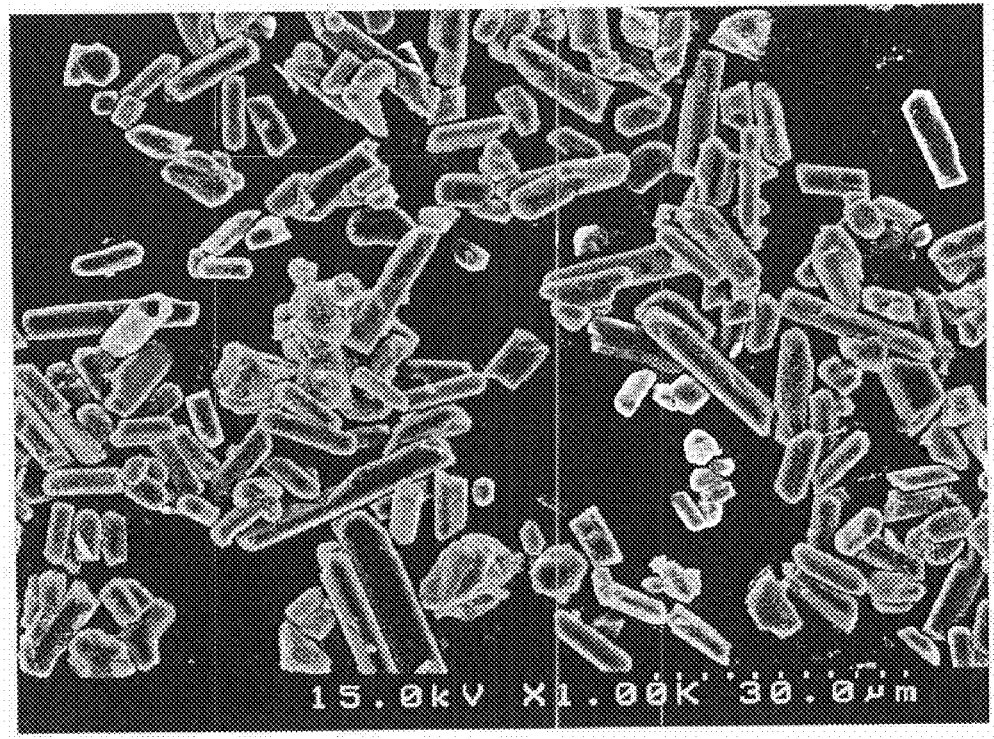
FIG. 9 is a photo, which substitutes for a drawing, showing an image of the phosphor prepared in Comparative Example I-3, which is observed by a scanning electron microscope.

Further, the phosphor prepared in Comparative Example I-3 was observed using a scanning electron microscope. The photo, to be used as the substitute of a drawing, of the observed image is shown in FIG. 9. As is evident from FIG. 9, the shapes of the particles of the phosphor prepared in Comparative Example I-3 are slender.

Figure 10A:
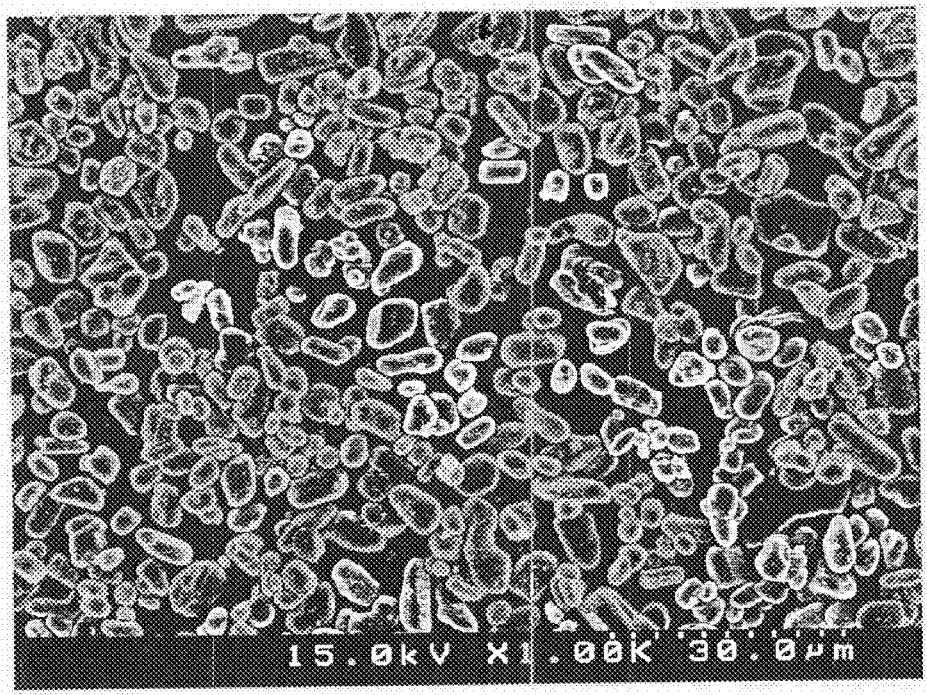
FIG. 10(a) is a photo, which substitutes for a drawing, showing an image of the phosphor prepared in Example I-5 of the present invention, which is observed by a scanning electron microscope.
Figure 10B:
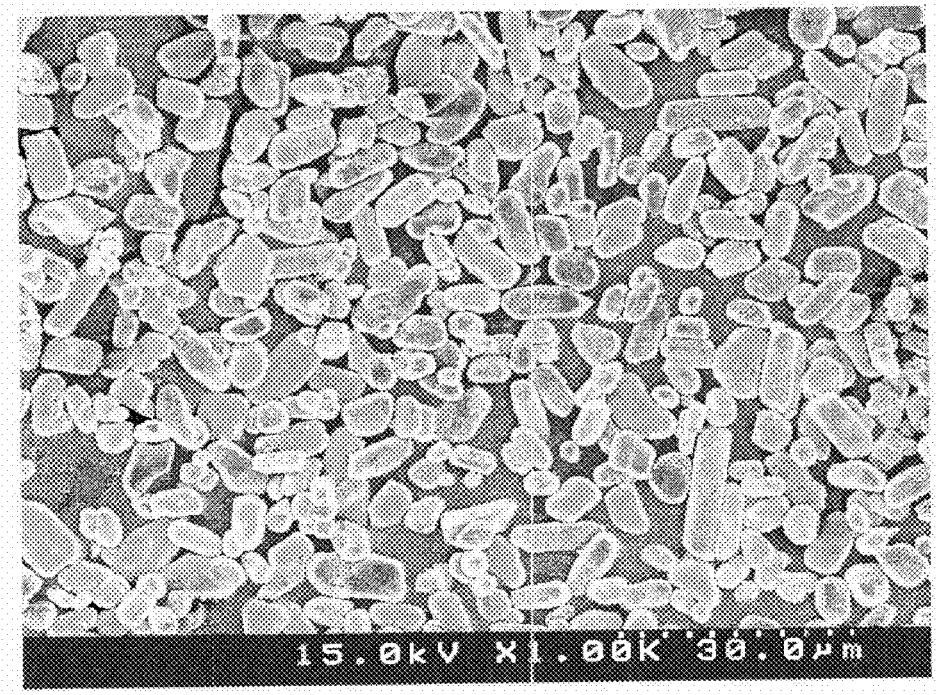
FIG. 10(b) is a photo, which substitutes for a drawing, showing an image of the phosphor prepared in Example I-6 of the present invention, which is observed by a scanning electron microscope.

In contrast, the phosphors prepared in Examples I-5 and I-6 were observed using a scanning electron microscope, respectively. The photos, to be used as the substitutes of drawings, of the observed images are shown in FIG. 10(a) and FIG. 10(b). FIG. 10(a) corresponds to the phosphor of Example I-5, and FIG. 10(b) corresponds to the phosphor of Example I-6. As is evident from FIG. 10(a) and FIG. 10(b), in the phosphors of the present invention, the particles are hardly fused with each other and mostly exist as single particles.

Examples I-8 to I-12

To 115 g of a commercially obtained coprecipitation oxide, $(Sc_{1.9336}Ce_{0.0664})_2O_3$, was added 1035 g of $Sc_2O_3$, and they were blended sufficiently. The mixture obtained was considered to be a material oxide of which molar ratio was 1.9934:0.0066, namely, $(Sc_{1.9934}Ce_{0.0066})_2O_3$ (formula weight of 140.2).

$CaCO_3$, $SrCO_3$, ZnO, $K_2CO_3$ and the above-mentioned material oxide were weighed out so that the ratio between Ca, Sr, Sc, Ce, Zn and K would be the ratios of the charge compositions shown in Table 6, and mixed well. Each mixing molar ratio and total weight of the material were as shown in Table 6. The obtained mixture of material was transferred into an alumina crucible, and then it was heated at 1400° C. in the air for 5 hours. To the fired product obtained was added $CaCl_2$, $Li_3PO_4$ and KCl, in proportions shown in Table 6, and then pulverized and blended sufficiently by a dry method. The mixture obtained was filled into an alumina crucible, and heated at 1450° C. for 12 hours allowing a nitrogen gas containing hydrogen (nitrogen:hydrogen=96:4 (volume ratio)) of atmospheric pressure to flow.

The obtained fired product was taken out after cooled, and then pulverized coarsely. It was transferred into a glass container together with an alumina ball having 3-mm diameter and HCl of 0.5 mol/L, and subjected to a ball mill (60 rpm, 4 hours). After separating the alumina ball and the slurry of the fired product, the coarse particles were removed from the slurry by passing it through NXX25 nylon mesh (with opening of 63 micron). Then, this slurry was added with HCl (1 mol/L) and stirred, followed by being left to stand at a predetermined period. Subsequently, the supernatant fluid was ejected. In this context, the predetermined period is time necessary for precipitating particles of 6 µm or larger (which can be calculated based on Stokes' law).

After adding another HCl (1 mol/l) to this slurry, the above-mentioned operations of stirring, standing and decantation (ejection of the supernatant fluid) were repeated twice. Then, similar operations were repeated, using water in place of HCl, until the electric conductivity of the supernatant fluid was 5 mS/m or lower. To this was added ammonium phosphate aqueous solution and then calcium nitrate aqueous solution, thereby forming a coat of calcium phosphate on the surface of the phosphor. In the end, the slurry was dehydrated by means of suction filtration. This was dried by a 120° C. dryer for 10 hours. The obtained powder was passed through NXX13 nylon mesh (with opening of 100 µm). The phosphor was thereby produced. The characteristics of the obtained phosphor were measured in accordance with the aforementioned methods and the results thereof are shown in Table 6.

TABLE 6

| | charge composition | | | | | flux | | | | |
|---|---|---|---|---|---|---|---|---|---|---|
| | | | | | total weight of material g | add before primary firing | | add after primary firing | | |
| | Ca mol | Sr mol | Ce mol | Sc mol | | K (K$_2$CO$_{3/2}$) mol | Zn (ZnO) mol | CaCl$_2$ weight % | Li$_3$PC$_4$ weight % | KCl weight % |
| Example I-8 | 1.02 | 0 | 0.007 | 1.993 | 170 | 0 | 0 | 15 | 5 | 1 |
| Example I-9 | 1 | 0.05 | 0.007 | 1.993 | 124 | 0 | 0 | 15 | 5 | 1 |
| Example I-10 | 0.95 | 0.05 | 0.007 | 1.993 | 123 | 0 | 0.05 | 15 | 5 | 1 |
| Example I-11 | 1 | 0.05 | 0.007 | 1.993 | 124 | 0.01 | 0 | 15 | 5 | 1 |
| Example I-12 | 0.96 | 0.08 | 0.007 | 1.993 | 124 | 0.01 | 0 | 15 | 5 | 1 |
| Example I-13 | 1.05 | 0 | 0.0066 | 1.9934 | 121 | 0 | 0 | 15 | 5 | 1 |
| Example I-14 | 0.95 | 0.05 | 0.0066 | 1.9934 | 197 | 0 | 0.05 | 15 | 5 | 1 |
| Example I-15 | 0.95 | 0.05 | 0.0066 | 1.9934 | 198 | 0.01 | 0.05 | 15 | 5 | 1 |
| Example I-16 | 0.95 | 0.05 | 0.0066 | 1.9934 | 198 | 0.01 | 0.05 | 15 | 5 | 0 |
| Example I-17 | 0.96 | 0.04 | 0.0066 | 1.9934 | 196 | 0.01 | 0.04 | 15 | 5 | 1 |
| Example I-18 | 0.94 | 0.06 | 0.0066 | 1.9934 | 198 | 0.01 | 0.06 | 15 | 5 | 1 |
| Example I-19 | 0.93 | 0.06 | 0.0066 | 1.9934 | 248 | 0.01 | 0.06 | 13 | 5 | 1 |
| Example I-20 | 0.94 | 0.05 | 0.0065 | 1.9935 | 248 | 0.01 | 0.06 | 13 | 5 | 1 |
| Example I-21 | 0.93 | 0.06 | 0.0065 | 1.9935 | 249 | 0.01 | 0.06 | 13 | 5 | 1 |
| Example I-22 | 0.93 | 0.06 | 0.007 | 1.993 | 249 | 0.01 | 0.06 | 13 | 5 | 1 |
| Example I-23 | 0.93 | 0.06 | 0.0085 | 1.9915 | 198 | 0.01 | 0.06 | 13 | 5 | 1 |
| Example I-24 | 0.93 | 0.06 | 0.01 | 1.99 | 199 | 0.01 | 0.06 | 13 | 5 | 1 |
| Example I-25 | 1 | 0 | 0.0065 | 1.9935 | 90 | 0.01 | 0.2 | 13 | 5 | 1 |

| | luminescent characteristics | | | |
|---|---|---|---|---|
| | maximum emission peak wavelength | color coordinate | | maximum emission peak intensity | brightness |
| | nm | x | y | % | % |
| Example I-8 | 515 | 0.337 | 0.585 | 143 | 120 |
| Example I-9 | 516 | 0.337 | 0.586 | 149 | 125 |
| Example I-10 | 516 | 0.340 | 0.586 | 158 | 134 |
| Example I-11 | 515 | 0.336 | 0.586 | 150 | 125 |
| Example I-12 | 516 | 0.336 | 0.586 | 149 | 125 |
| Example I-13 | 516 | 0.337 | 0.588 | 152 | 128 |
| Example I-14 | 514 | 0.339 | 0.586 | 160 | 136 |
| Example I-15 | 518 | 0.340 | 0.586 | 160 | 136 |
| Example I-16 | 516 | 0.338 | 0.586 | 160 | 135 |
| Example I-17 | 515 | 0.339 | 0.586 | 159 | 135 |
| Example I-18 | 517 | 0.340 | 0.586 | 163 | 138 |
| Example | 516 | 0.338 | 0.585 | 166 | 137 |

TABLE 6-continued

| | | | | | |
|---|---|---|---|---|---|
| Example I-19 | 516 | 0.337 | 0.586 | 171 | 140 |
| Example I-20 | 516 | 0.337 | 0.586 | 167 | 137 |
| Example I-21 | 516 | 0.338 | 0.586 | 171 | 140 |
| Example I-22 | 516 | 0.342 | 0.586 | 177 | 146 |
| Example I-23 | 517 | 0.344 | 0.585 | 168 | 142 |
| Example I-24 | 515 | 0.336 | 0.585 | 150 | 124 |
| Example I-25 | | | | | |

In addition, SEM photos of the obtained phosphors were taken. From the photo, the average aspect ratio of the particles and the ratio of the particles whose aspect ratio was 3 or smaller were calculated by methods described before. The particle size characteristics (weight-average median diameter $D_{50}$ and QD), single particle ratio and ratio of the particles of which degree of circularity was smaller than 85% were also measured by methods described before. Those results are shown in Table 7 altogether. It is evident that all of the phosphors of Examples I-8 to I-12 have high proportions of particles having 3 or smaller aspect ratio, which indicates they are all correspond to the phosphor of the present invention.

emission-peak intensity tend to be. Therefore, it is considered that addition of ZnO or $K_2CO_3$ accelerates the crystal growth and enlarges the particle diameter, which leads to improvements in the brightness and emission-peak intensity.

Examples I-13 to I-25

Phosphors were prepared in the same condition as Example I-8, except that the charge compositions of raw materials and the proportions of compounds added as fluxes were set at the values shown in Table 6. The characteristics of the obtained phosphors were measured in accordance with the aforementioned ways, and the results thereof are shown in Table 6 and Table 7.

It is evident that, from the results of Examples I-13 and I-14, adding Sr and Zn, in addition to $CaCl_2$, $Li_3PO_4$, and KCl, can enlarge the particle diameter (weight-average median diameter) and improve the brightness. It is also evident that, from the results of Examples I-14 and I-15, adding of $K_2CO_3$ can enlarge the particle diameter again. It is also evident that, from the results of Examples I-15 and I-16, adding of KCl leads to an enlarged particle diameter.

TABLE 7

| | Powder Characteristics | | | | |
|---|---|---|---|---|---|
| | particle size characteristics | | aspect ratio | | single particle ratio % | ratio of the particles whose degree of circularity is smaller than 85% % |
| | $D_{50}$ μm | Q.D. | average | ratio of 3 or smaller % | | |
| Example I-8 | 7 | 0.24 | 2.1 | 90 | 70 | 8.5 |
| Example I-9 | 5.8 | 0.25 | 2.1 | 87 | 80 | 8.8 |
| Example I-10 | 11.9 | 0.22 | 2.2 | 83 | 93 | 12.9 |
| Example I-11 | 7.1 | 0.23 | 2.8 | 77 | 77 | 11.7 |
| Example I-12 | 8.5 | 0.21 | 2.2 | 93 | 77 | 12.4 |
| Example I-13 | 7.1 | 0.23 | 1.9 | 93 | 83 | 4.1 |
| Example I-14 | 12.2 | 0.22 | 1.8 | 97 | 83 | 6.3 |
| Example I-15 | 14.3 | 0.22 | 1.9 | 90 | 90 | 9.0 |
| Example I-16 | 11.9 | 0.22 | 1.8 | 93 | 80 | 8.9 |
| Example I-17 | 14.1 | 0.22 | 1.9 | 90 | 90 | 8.7 |
| Example I-18 | 13.8 | 0.23 | 2.2 | 93 | 90 | 11.2 |
| Example I-19 | 14 | 0.22 | 1.8 | 93 | 70 | 19.8 |
| Example I-20 | 13.5 | 0.22 | 1.8 | 93 | 70 | 18.0 |
| Example I-21 | 13.5 | 0.22 | 1.8 | 93 | 80 | 15.2 |
| Example I-22 | 13.7 | 0.22 | 1.8 | 97 | 87 | 16.7 |
| Example I-23 | 15.4 | 0.22 | 1.9 | 93 | 93 | 11.5 |
| Example I-24 | 15.8 | 0.22 | 1.7 | 97 | 70 | 14.3 |
| Example I-25 | 12.6 | 0.22 | 1.9 | 97 | 77 | 14.7 |

It is evident that, from the results of Examples I-9 and I-10, adding ZnO, in addition to $CaCl_2$, $Li_3PO_4$, and KCl, can enlarge the particle diameter (weight-average median diameter). It is also evident that, from the results of Examples I-9 and I-11, adding $K_2CO_3$ before the primary firing, in addition to $CaCl_2$, $Li_3PO_4$, and KCl, can also enlarge the particle diameter. Furthermore, it is evident that, from the results of Examples I-11 and I-12, an increased charge amount of Sr tends to enlarge the particle diameter.

Furthermore, it is evident that, from the results of Examples I-8 to I-12, the larger the weight-average median diameter of the phosphor is, the higher the brightness and In addition, in all of Examples I-17 to I-24, in which Sr, $K_2CO_3$ and ZnO are added, the superior phosphors having excellent luminescent characteristics such as brightness and smaller aspect ratios.

From the above results, it can be considered that the addition of Sr, $K_2CO_3$ and ZnO can achieve such advantageous effects as enlarging the particle diameter and improving the brightness, even when each of them is added solely in the raw material. However, it is evident that mixing of two or three kinds selected from the group consisting of Sr, $K_2CO_3$ and ZnO in the raw material tends to enlarge the particle diameter and enhance the brightness much more.

Among the obtained phosphors, those in Examples I-20, I-23 and I-25 were measured for their amounts of trace elements contained by means of GD-MS (glow discharge mass spectrometry). The results are shown in Table 8 and Table 9.

TABLE 8

|   | Li ppm | F ppm | Na ppm | Mg ppm | P ppm | S ppm | Cl ppm | K ppm | Fe ppm | Zn ppm | Sr ppm | Y ppm |
|---|---|---|---|---|---|---|---|---|---|---|---|---|
| Example I-20 | 98 | <5 | 2 | 12 | 660 | 0.91 | 130 | 12 | 34 | 9.8 | 3600 | 10 |
| Example I-23 | 84 | <5 | 2.2 | 19 | 600 | 1 | 55 | 8.4 | 39 | 6.1 | 4300 | 41 |
| Example I-25 | 17 | <5 | 3.4 | 20 | 100 | 16 | 150 | 10 | 15 | 69 | 200 | 6.6 |

TABLE 9

|   | Zr ppm | Cd ppm | Sn ppm | Ba ppm | Ce ppm | Eu ppm | Yb ppm | Hf ppm | Pb ppm | Bi ppm | Th ppm | U Ppm |
|---|---|---|---|---|---|---|---|---|---|---|---|---|
| Example I-20 | 0.84 | <5 | <1 | 0.56 | 8500 | 0.53 | 4.1 | <0.1 | <0.5 | <0.1 | <0.5 | <0.5 |
| Example I-23 | 3 | <5 | <1 | 0.98 | 12000 | 2.1 | 4.3 | <0.1 | <0.5 | <0.1 | <0.5 | <0.5 |
| Example I-25 | 15 | <5 | <1 | 1.5 | 5500 | 2.4 | 3.6 | 0.44 | <0.5 | <0.1 | <0.5 | <0.5 |

SEM photos of the obtained phosphors were taken. From the photo, the average aspect ratio of the particles, the ratio of the particles whose aspect ratio was 3 or smaller, and the like were calculated by the methods described before. The results are shown in Table 7 altogether. It is evident that all of the phosphors of Examples I-13 to I-25 have high proportions of particles having 3 or smaller aspect ratio, which indicates they all correspond to the phosphor of the present invention.

Figure 11:
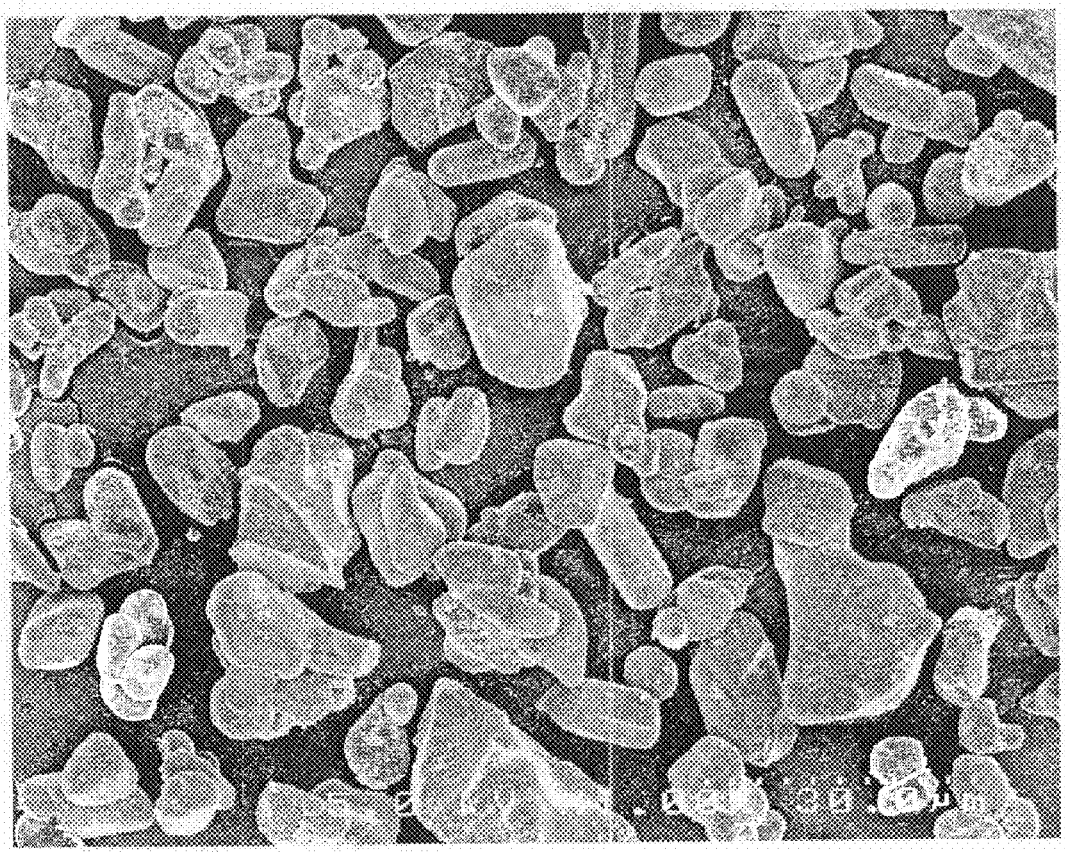
FIG. 11 is a photo, which substitutes for a drawing, showing an SEM photo of the phosphor prepared in Example I-20 of the present invention.
Figure 12:
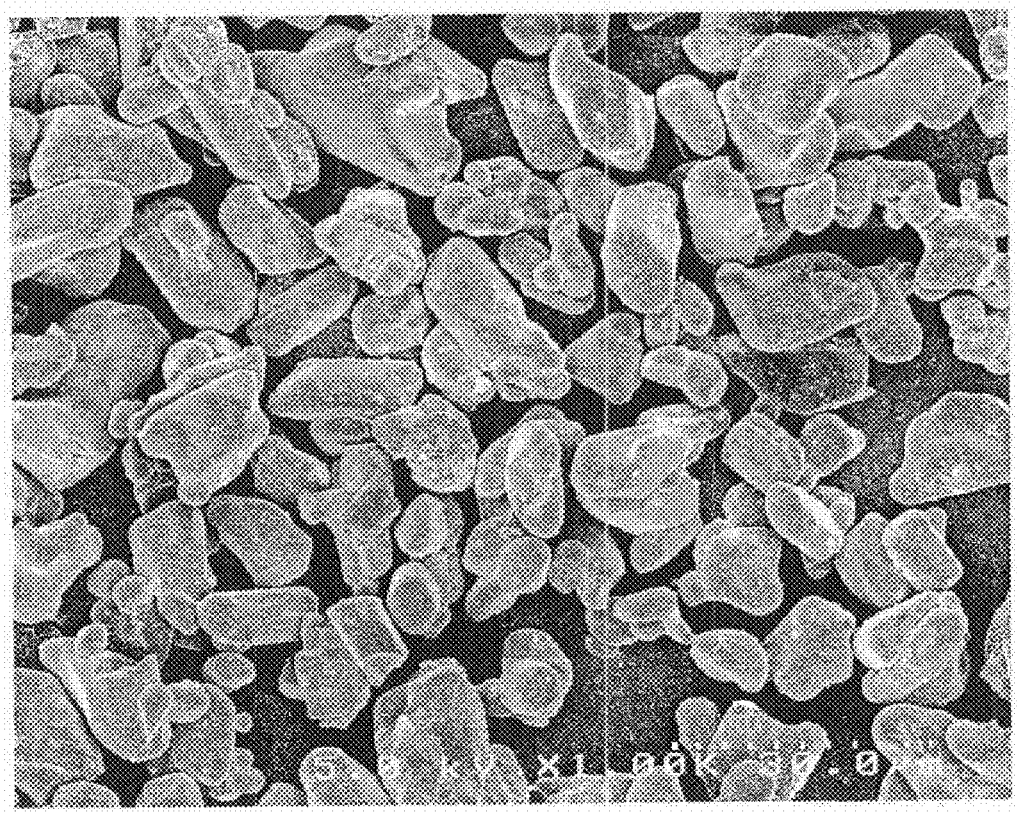
FIG. 12 is a photo, which substitutes for a drawing, showing an SEM photo of the phosphor prepared in Example I-22 of the present invention.
Figure 13:
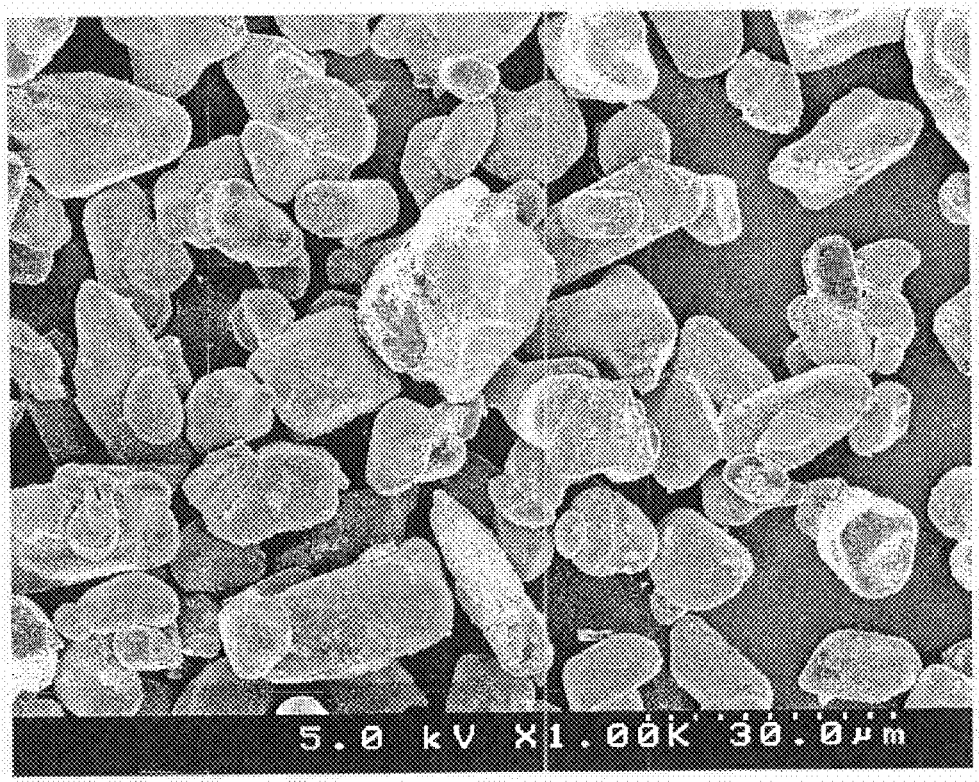
FIG. 13 is a photo, which substitutes for a drawing, showing an SEM photo of the phosphor prepared in Example I-24 of the present invention.
Figure 14:
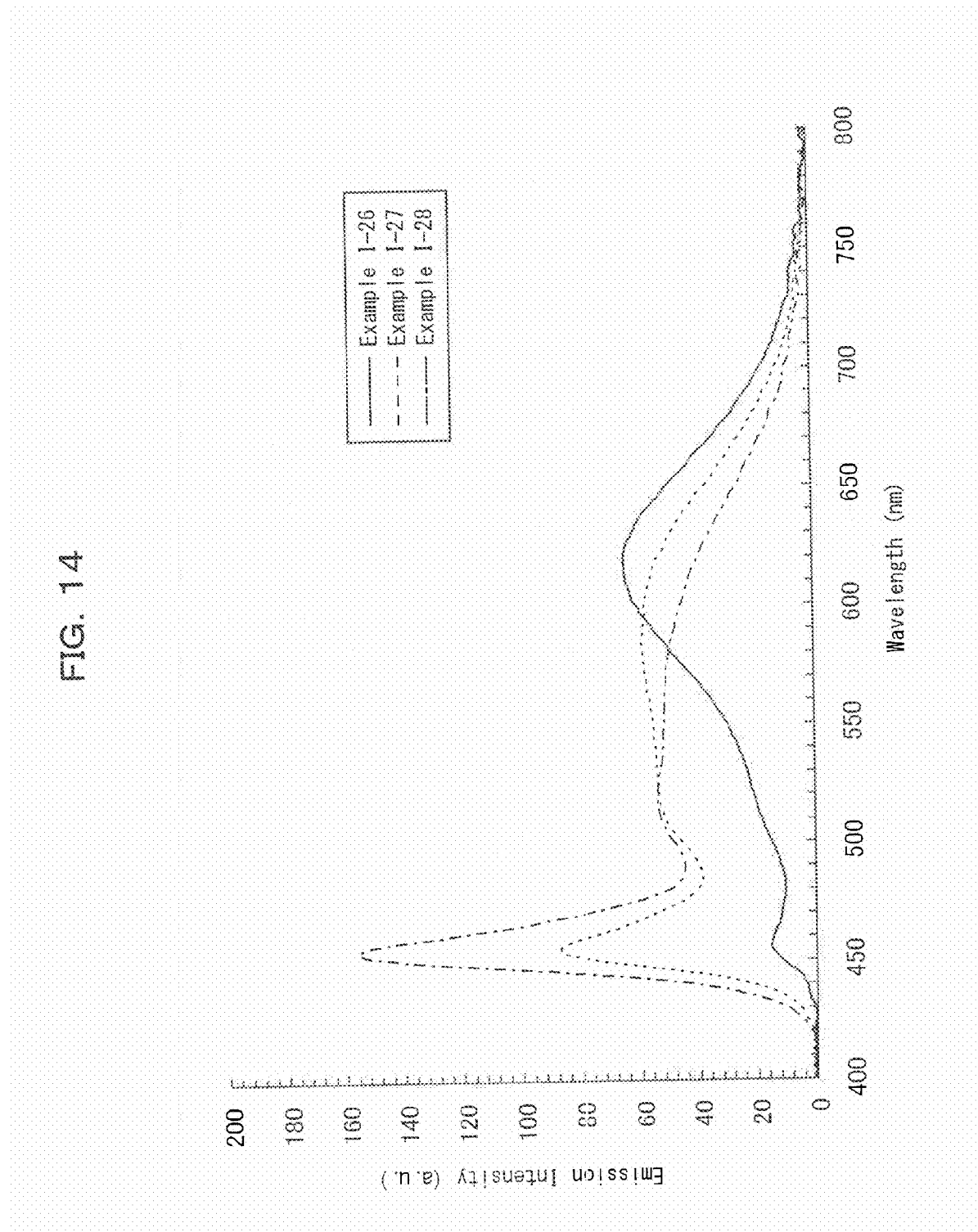
FIG. 14 is a graph showing the emission spectra measured for the surface-mount white light emitting devices produced in Examples I-26 to I-28 of the present invention.
Figure 15:
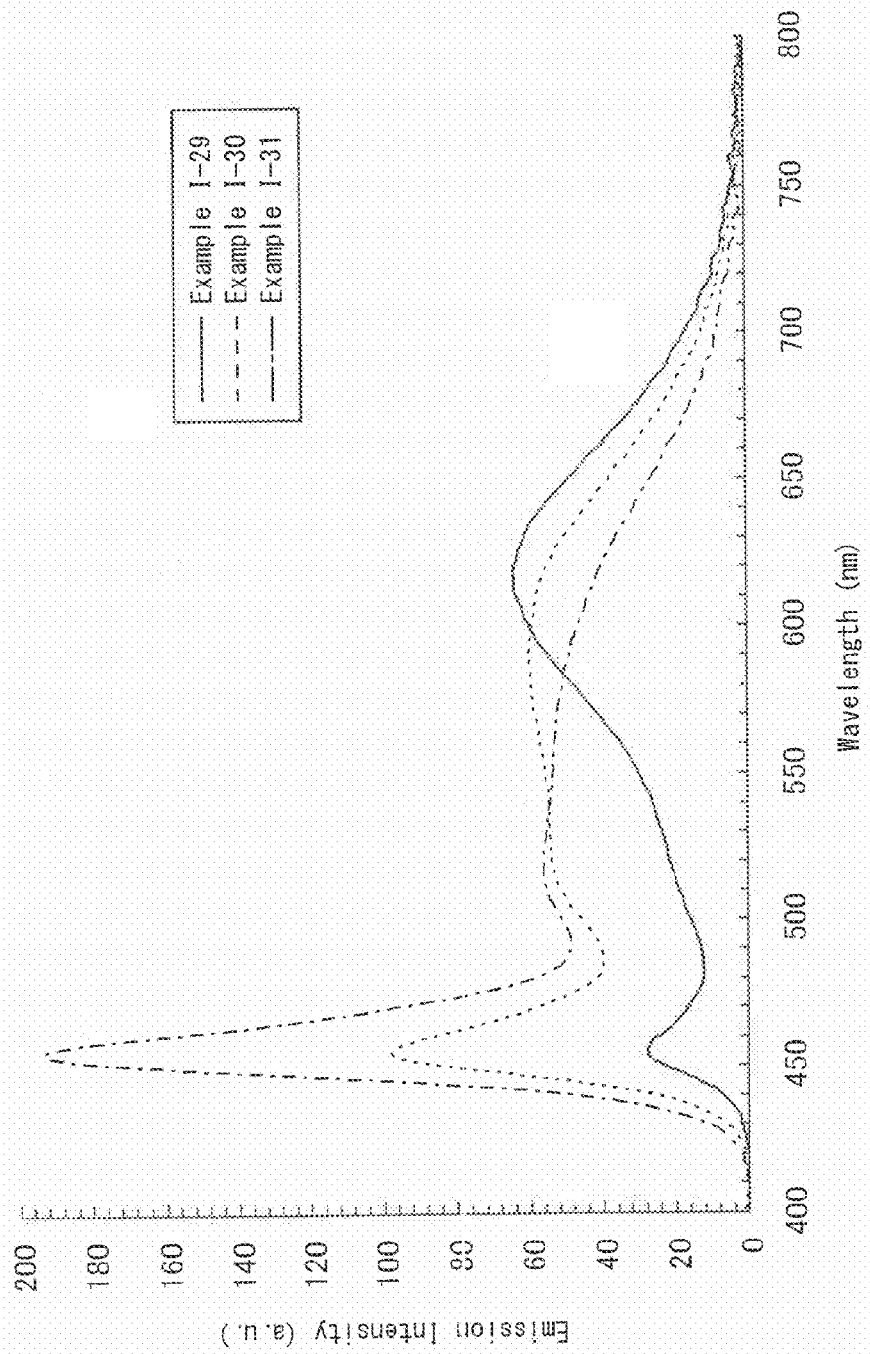
FIG. 15 is a graph showing the emission spectra measured for the surface-mount white light emitting devices produced in Examples I-29 to I-31 of the present invention.
Figure 16:
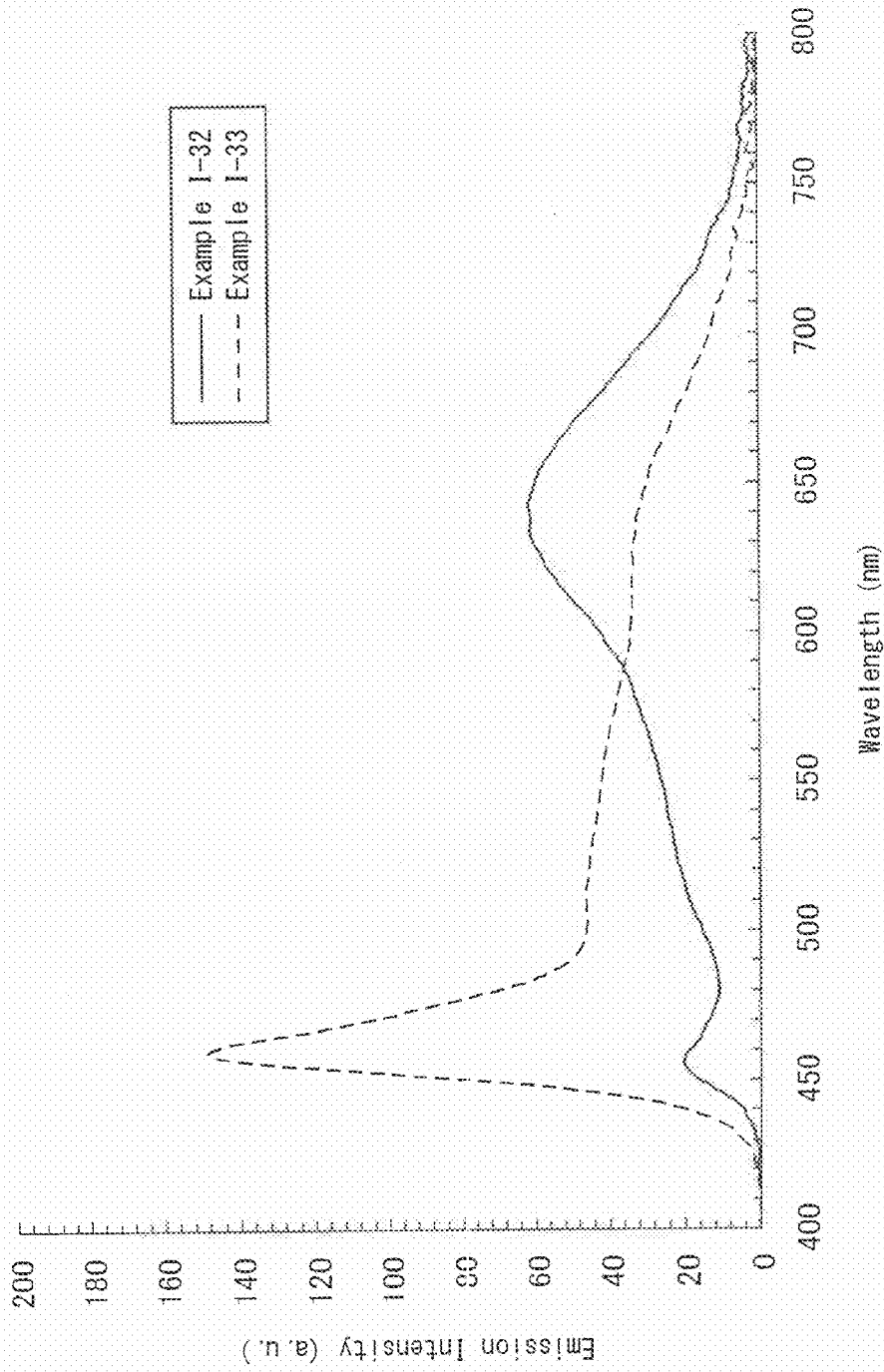
FIG. 16 is a graph showing the emission spectra measured for the surface-mount white light emitting devices produced in Examples I-32 and I-33 of the present invention.
Figure 17:
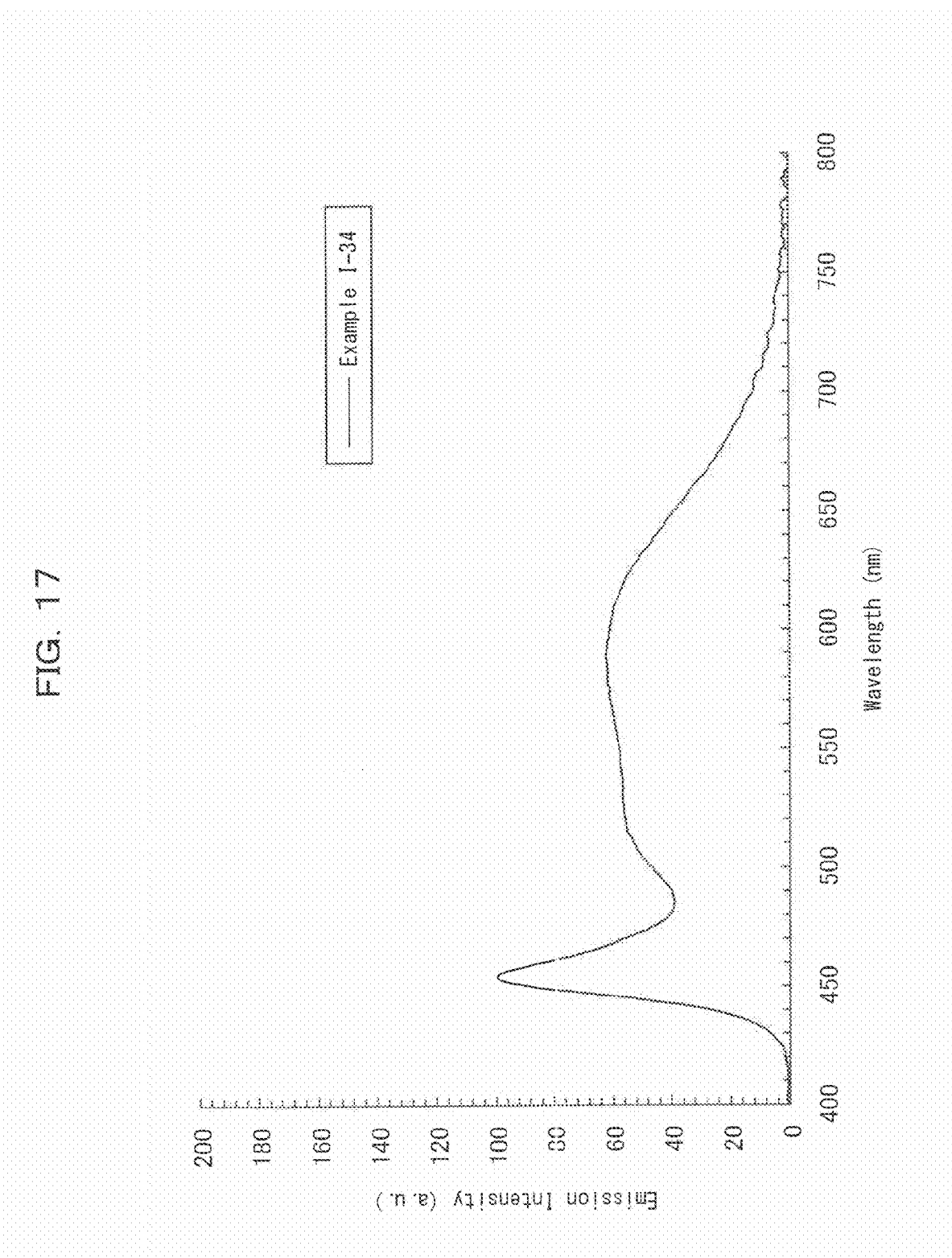
FIG. 17 is a graph showing the emission spectrum measured for the surface-mount white light emitting device produced in Example I-34 of the present invention.

FIG. 11 to FIG. 13 are photos, which substitute for drawings, showing scanning electron micrographs of the phosphors in Examples I-20, I-22 and I-24. It is evident that, from FIG. 11 to FIG. 13, those phosphors are superior because the particles of them are more spherical in comparison with those in FIG. 7 to FIG. 9, which indicates superior dispersibilities. Such phosphors can be aligned easily, for example in the aforementioned liquid medium, and therefore they are practical.

In addition, the non-luminous object colors of the phosphors in the above Examples and Comparative Examples by the method mentioned earlier. The results are shown in Table 10 below.

TABLE 10

|   | L* | a* | b* |
|---|---|---|---|
| Example I-1 | 105 | −25 | 55 |
| Example I-2 | 106 | −25 | 56 |
| Example I-3 | 105 | −24 | 54 |
| Example I-4 | 106 | −25 | 52 |
| Example I-5 | 106 | −24 | 51 |
| Example I-6 | 106 | −25 | 56 |
| Example I-7 | 106 | −27 | 61 |
| Example I-8 | 105 | −22 | 48 |
| Example I-9 | 106 | −24 | 51 |
| Example I-10 | 105 | −25 | 56 |
| Example I-11 | 105 | −24 | 50 |
| Example I-12 | 105 | −25 | 52 |
| Example I-13 | 105 | −23 | 49 |
| Example I-14 | 106 | −25 | 54 |

TABLE 10-continued

|   | L* | a* | b* |
|---|---|---|---|
| Example I-15 | 106 | −26 | 57 |
| Example I-16 | 105 | −25 | 55 |
| Example I-17 | 106 | −26 | 58 |
| Example I-18 | 106 | −25 | 57 |
| Example I-19 | 105 | −25 | 56 |
| Example I-20 | 106 | −26 | 56 |
| Example I-21 | 105 | −26 | 55 |
| Example I-22 | 105 | −26 | 57 |
| Example I-23 | 106 | −27 | 63 |
| Example I-24 | 106 | −27 | 66 |
| Example I-25 | 105 | −24 | 51 |
| Comparative Example I-1 | 106 | −23 | 50 |
| Comparative Example I-2 | 103 | −20 | 48 |
| Comparative Example I-3 | 102 | −17 | 42 |
| Comparative Example I-4 | 106 | −24 | 55 |

Examples I-26 to I-34

Examples of LED

White light emitting devices were produced using a green phosphor and a red phosphor according to the following procedure. As the green phosphor, the phosphor obtained in Example I-20, I-23 or I-24 was used. As the red phosphor, $Ca_{0.992}Eu_{0.008}AlSiN_3$, (hereinafter referred to as phosphor (A) as appropriate) or $Sr_{0.792}Ca_{0.2}Eu_{0.008}AlSiN_3$, (hereinafter referred to as phosphor (B) as appropriate) was used. As the $Ca_{0.992}Eu_{0.008}AlSiN_3$, the one synthesized referring to Electrochemical and Solid-State Letters, vol. 9, No. 4, pp. H22-H25 (2006) was used. As the $Sr_{0.792}Ca_{0.2}Eu_{0.008}AlSiN_3$, the one synthesized referring to WO 2006106948 (A1) was used.

As the first luminous body, a blue LED [22] (C460-EZ, manufactured by Cree, Inc.) having emission wavelength of 455 nm to 460 nm was used. The blue LED [22] was bonded to the terminal [27] disposed at the bottom of the recess in the frame [24] by means of die bonding using silver paste as adhesive. Then, the blue LED [22] and the electrode [26] of the frame [24] were connected using a gold wire [25], a kind of wire, having diameter of 25 μm.

The mixed phosphors consisting of the above-mentioned two kinds of phosphors (the green phosphor and the red phosphor) were blended sufficiently with a silicone resin (JCR6101UP, manufactured by Dow Corning Toray Co., Ltd.) in the ratios shown in Table 11, and then this mixture consisting of the phosphors and the silicone resin (namely, phosphor-containing composition) was poured inside the recess of the above-mentioned frame [24].

This was maintained at 150° C. for 2 hours so as to cure the silicone resin, thereby forming the phosphor-containing part [23]. A surface-mount white light emitting device was thus produced. In the explanation of the present Examples, the reference numerals of the parts corresponding to those in FIG. 2(b) are shown in "[ ]".

When the obtained surface-mount light emitting devices were driven to emit light by energizing the blue LED (22) with a current of 20 mA, the light emitting devices of all those Examples could emit a uniform white light without a spot.

The emission spectra of the produced surface-mount white light emitting devices were measured. The results are shown in FIG. 14 to FIG. 17. In Table 11, various luminescent characteristics values (including the entire luminous flux, light output (total radiation flux), color coordinates, color temperature, chromaticity deviation and color rendering index) are shown, which were calculated from the obtained emission spectra in accordance with Japanese Industrial Standards (the entire luminous flux and light output (total radiation flux) were calculated based on JIS Z 8113, the color coordinate was calculated based on JIS Z 8701, the correlated color temperature and chromaticity deviation were calculated based on JIS Z 8725 and the color rendering index was calculated based on JIS Z 8726.) In Table 11, phosphor (A) and phosphor (B) represent $Ca_{0.992}Eu_{0.008}AlSiN_3$ and $Sr_{0.792}Ca_{0.2}Eu_{0.008}AlSiN_3$, respectively, and $T_{cp}$ and $D_{uv}$ represent correlated color temperature (shown by unit of K) and chromaticity deviation, respectively.

In this way, when the phosphor of the present invention is used in combination with an arbitrary red phosphor, a light emitting device having high color rendering can be realized.

TABLE 11

|  | Example I-26 | Example I-27 | Example I-28 | Example I-29 | Example I-30 | Example I-31 | Example I-32 | Example I-33 | Example I-34 |
|---|---|---|---|---|---|---|---|---|---|
| green phosphor | Example I-20 | Example I-20 | Example I-20 | Example I-23 | Example I-23 | Example I-23 | Example I-23 | Example I-23 | Example I-24 |
| red phosphor | phosphor (B) | phosphor (B) | phosphor (B) | phosphor (B) | phosphor (B) | phosphor (B) | phosphor (A) | phosphor (A) | phosphor (B) |
| green mixing ratio (weight %) | 21 | 6.2 | 8 | 21 | 6.2 | 6 | 18 | 10 | 6.2 |
| red mixing ratio (weight %) | 4 | 0.8 | 1 | 4 | 0.8 | 1 | 5 | 1 | 0.8 |
| entire luminous flux (lm) | 2.7 | 3.9 | 3.6 | 2.7 | 4.0 | 3.8 | 2.3 | 3.1 | 4.2 |
| light output (mW) | 9.3 | 12.9 | 13.7 | 9.6 | 13.5 | 14.6 | 9.6 | 12.7 | 13.8 |
| color coordinate x | 0.488 | 0.346 | 0.287 | 0.464 | 0.343 | 0.275 | 0.467 | 0.275 | 0.344 |
| color coordinate y | 0.416 | 0.364 | 0.296 | 0.392 | 0.354 | 0.278 | 0.396 | 0.288 | 0.357 |
| Tcp | 2390 | 5000 | 8950 | 2500 | 5100 | 11480 | 2490 | 10660 | 5070 |
| Duv | 0.4 | 5.8 | 0.2 | −7.0 | 2.2 | −2.4 | −5.8 | 3.3 | 3.1 |
| Ra | 85 | 89 | 91 | 86 | 91 | 90 | 94 | 85 | 90 |
| R01 | 85 | 89 | 93 | 89 | 92 | 93 | 93 | 92 | 91 |
| R02 | 95 | 96 | 98 | 98 | 98 | 96 | 94 | 87 | 97 |
| R03 | 94 | 96 | 96 | 90 | 96 | 95 | 98 | 85 | 96 |
| R04 | 83 | 84 | 86 | 84 | 89 | 84 | 94 | 74 | 88 |
| R05 | 85 | 88 | 90 | 90 | 91 | 88 | 92 | 87 | 90 |
| R06 | 96 | 94 | 91 | 94 | 94 | 89 | 88 | 89 | 93 |
| R07 | 83 | 88 | 90 | 81 | 89 | 88 | 96 | 79 | 90 |
| R08 | 63 | 77 | 84 | 66 | 80 | 86 | 98 | 83 | 78 |
| R09 | 26 | 43 | 64 | 36 | 52 | 76 | 93 | 80 | 46 |
| R10 | 89 | 91 | 96 | 97 | 95 | 95 | 88 | 74 | 92 |
| R11 | 83 | 86 | 90 | 85 | 90 | 89 | 88 | 83 | 89 |
| R12 | 84 | 63 | 61 | 85 | 71 | 58 | 79 | 61 | 70 |

TABLE 11-continued

|  | Example I-26 | Example I-27 | Example I-28 | Example I-29 | Example I-30 | Example I-31 | Example I-32 | Example I-33 | Example I-34 |
|---|---|---|---|---|---|---|---|---|---|
| R13 | 87 | 92 | 98 | 92 | 95 | 97 | 92 | 90 | 93 |
| R14 | 97 | 98 | 99 | 96 | 98 | 99 | 99 | 92 | 99 |
| R15 | 78 | 83 | 90 | 83 | 88 | 90 | 94 | 82 | 86 |

Example Group II

II-1

Methods of Measurements

[Method for Measuring Non-Luminous Object Color]

The non-luminous object colors of samples were measured in the same way as Example Group I.

[Method for Measuring Emission Spectrum, Wavelength and Intensity of Maximum Emission Peak, and Color Coordinates x, y]

The emission spectra of the phosphors were measured using a fluorescence measurement apparatus manufactured by JASCO corporation. The light from a 150-W xenon lamp, the excitation light source, was passed through a 10 cm grating monochromator, and only the isolated light having wavelength of 455 nm was radiated onto the phosphors via optical fibers. The light generated by the radiation of the excitation light was separated using a 25 cm grating monochromator, and the emission intensity of each wavelength thereof from 300 nm to 800 nm was measured with a multichannel CCD detector, "C7041", manufactured by Hamamatsu Photonics K.K. Then, through a signal processing by a personal computer, such as sensitivity correction, the emission spectrum was obtained.

[Wavelength and Intensity of Maximum Emission Peak]

The wavelength and intensity of the maximum emission peak were measured by the same method as Example Group I.

[Color Coordinates]

The color coordinates were measured in the same way as Example Group I.

[Method for Measuring Temperature Characteristics]

The temperature characteristics was measured using an emission spectrum measurement device of multi-channel spectrum analyzer, MCPD7000, manufactured by Otsuka Electronics Co., Ltd., a stage equipped with a cooling mechanism using a peltiert device and a heating mechanism using a heater, and an apparatus equipped with a 150-W xenon lamp as light source.

A cell holding the phosphor sample was put on the stage, and the temperature was changed within the range of from 20° C. to 180° C. After verifying the surface temperature of the phosphor was held at 25° C., 125° C. or 160° C., the emission spectrum of the phosphor was measured at each of those temperatures while excited by a light from the light source having wavelength of 455 nm, which was isolated using a diffraction grating. The brightnesses were then decided from the measured emission spectra. The calculation of the brightness was carried out in accordance with JIS Z8724 using data in the wavelength region of from 480 nm to 800 nm.

As the measurement value of the temperature, a value corrected utilizing the temperature values measured with a radiation thermometer and a thermocouple was used. The ratios of the brightness values at both temperatures (125° C. and 160° C.) relative to the brightness value at 25° C. were regarded as the temperature characteristics values (Br(125)/Br(25) and Br(160)/Br(25)).

[Measurement of Particle Size Characteristics]

The particle size characteristics were measured in the same way as Example Group I.

[Measurement of the Ratio of the Particles of which Degree of Circularity is Smaller than 85%]

The ratios of the particles of which degree of circularity is smaller than 85% were measured in the same way as Example Group I.

II-2

Production Example Preparation of Sc/Ce Coprecipitation Oxide

By dissolving 151.3 g of $Sc_2O_3$ and 2.9 g of Ce$(NO_3)_3 \cdot 6H_2O$ in 1 L of nitric acid with concentration of 2.2 mol/L while heating, a nitric acid solution containing Sc and Ce mixed was obtained. To the obtained nitric acid solution was added 5 L of oxalic acid solution with concentration of 0.5 mol/L gradually while stirring, thereby an oxalate was precipitated. After the obtained oxalate precipitate was washed with water, dehydrated, and dried, it was fired at 1000° C. in the air. An oxide of 138 g was thus obtained. The composition of the obtained oxide was found to be ($SC_{1.994}$, $Ce_{0.006})C_3$, as a result of an analysis performed by means of ICP-MS (inductively-coupled plasma mass spectrometry). In addition, the weight-average median diameter thereof was 10 μm. This oxide is hereinafter referred to as coprecipitation oxide.

II-3

Examples II-1 to II-10

In Examples II-1 to II-10, each phosphor material was weighed out by a known method so that the mixed composition would be $CaSc_2O_4$:Ce. Among the material compounds, $CaCO_3$ was used as Ca-source, $Sc_2O_3$ was used as Sc-source, and $CeO_2$ was used as Ce-source. Regarding the material compounds of Sc-source and Ce-source, in Examples II-1 to II-6, and II-8, the Sc—Ce coprecipitation oxide obtained in such a way as described in the above-mentioned [Production Example] was used with each Ce content shown in Table 12. However, in Examples II-7, II-9 and II-10, $Sc_2O_3$ and $CeO_2$ were used just as they were.

The material compounds weighed out were blended sufficiently and transferred into an alumina crucible having a lid. After the heat treatment (primary firing) at 1450° C. in the air under atmospheric pressure for 1 hour and cooling, the crucible was taken out from the furnace. After adding the flux components, lithium phosphate ($Li_3PO_4$), calcium chloride ($CaCl_2$), potassium chloride (KCl), potassium hydrogenphosphate ($KH_2PO_4$) and $Li_2SO_4 \cdot H_2O$, to the obtained fired product in the ratios (weight % relative to the fired product after the primary firing) shown in Table 12 and blending them well, it was transferred into an alumina crucible again.

After the crucible was heated in an atmosphere heating furnace at 1450° C. in a hydrogen-containing (4 volume %) nitrogen atmosphere under atmospheric pressure for 10 hours, the fired product was cooled and retrieved.

The fired product was added with an alumina ball of 3 mm diameter and HCl of 1-mol/L concentration, and then subjected to a ball mill. This was washed with HCl of 1.3 mol/L concentration. Subsequently, it was washed with water and, at the same time, subjected to elutriation, thereby removing the micro particles and coarse particles.

Figure 18:
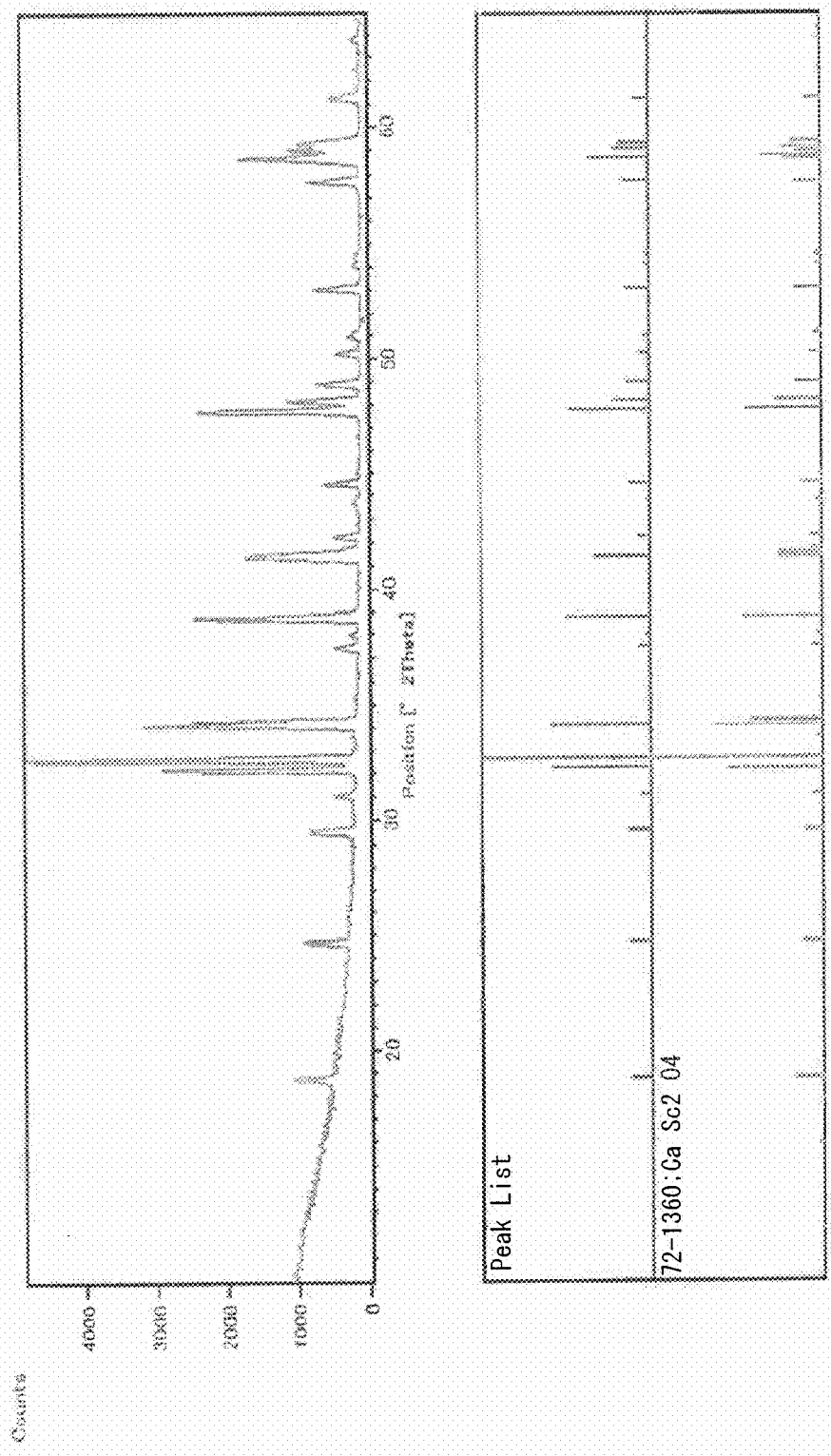
FIG. 18 is a graph showing an X-ray diffraction measurement result of Example II-4 of the present invention.
Figure 19A:
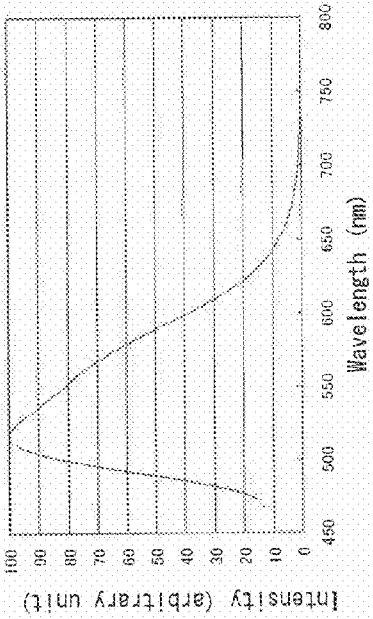
FIG. 19(a) to FIG. 19(d) are graphs showing the emission spectra of the phosphors prepared in Examples II-1 to II-4 of the present invention.
Figure 19B:
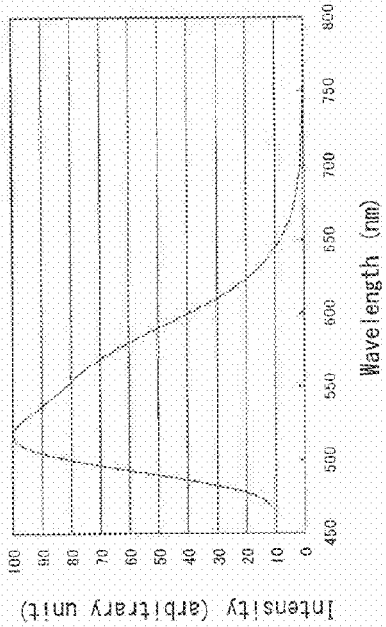
Figure 19C:
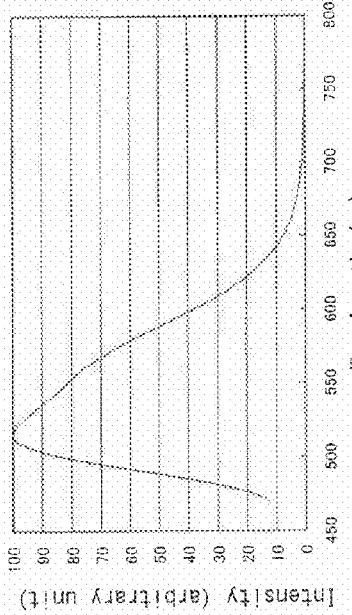
Figure 19D:
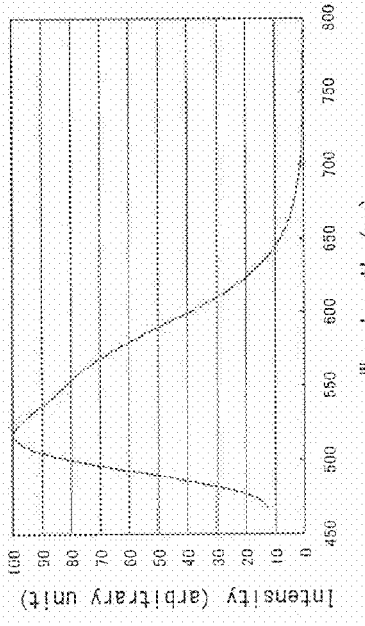

The result of measuring the X-ray diffraction pattern of the phosphor obtained in Example II-4 is shown in FIG. 18. In FIG. 18, the top graph shows the raw data of the measurement result. The upper one of the two, bottom graphs, shows the positions and intensities of the peaks, obtained by a peak detection from the measurement result. The lower one of the two, bottom graphs, shows the positions and intensities of the peaks of No. 72-1360 ($CaSc_2O_4$) in JCPDS-ICDD PDF (Joint Committee on Powder Diffraction Standards-International Centre for Diffraction Data Powder Diffraction File; a standard chart file of powder X-ray diffraction). It is evident that the obtained phosphor has the same structure as $CaSc_2O_4$, which is known to have $CaFe_2O_4$-type structure, because the peak positions and the intensities shown in the upper and lower graphs of the two, bottom graphs, are almost the same. Though there may be a small amount of change in lattice constant, presence of crystal defect, and distortion of the structure in the phosphor of the present invention due to addition of Ce, which is the luminescent center element, they can be still judged to be of the same structure when comparing their powder X-ray diffraction patterns. Furthermore, it is evident that a crystal phase (phosphor phase) other than that of the same structure as $CaSc_2O_4$, namely, impurity phase, is not contained in the phosphor of the present invention, from the reason that there are no peaks appearing, in the upper pattern of the bottom graphs, which do not exist in the lower pattern of the bottom graphs.

The phosphor was coated with calcium phosphate on its surface, by adding sodium phosphate ($Na_3PO_4 \cdot 12H_2O$) and calcium nitrate ($Ca(NO_3)_2 \cdot 4H_2O$) to the phosphor dispersed in water, while stirring.

After it was dried at 150° C., it was passed through a nylon sieve with opening of 50 μm. The phosphor was thus obtained. The weight-average median diameter $D_{50}$, QD and ratio of the particles of which degree of circularity is smaller than 85%, of the obtained phosphor, were measured. In addition, the Ce content was decided by means of ICP-MS. The results are summarized in Table 12.

TABLE 12

[powder characteristics of phosphors]

| | Ce content (mol) | coprecipitaion oxide | flux | | | | | powder characteristics | | ratio of the particles whose degree of circularity is smaller than 85% |
| --- | --- | --- | --- | --- | --- | --- | --- | --- | --- | --- |
| | | | $CaCl_2$ (weight %) | $Li_3PO_4$ (weight %) | KCl (weight %) | $KH_2PO_4$ (weight %) | $Li_2SO_4 \cdot H_2O$ (weight %) | $D_{50}$ | QD | (%) |
| Example II-1 | 0.005 | used | 10 | 5 | 2 | 0 | 0 | 8.5 | 0.21 | 6.8 |
| Example II-2 | 0.006 | used | 10 | 5 | 2 | 0 | 0 | 9 | 0.21 | 5.5 |
| Example II-3 | 0.0065 | used | 10 | 5 | 2 | 0 | 0 | 8 | 0.22 | 5.2 |
| Example II-4 | 0.007 | used | 10 | 5 | 2 | 0 | 0 | 8 | 0.22 | 7.3 |
| Example II-5 | 0.009 | used | 10 | 5 | 2 | 0 | 0 | 8 | 0.23 | 7.2 |
| Example II-6 | 0.003 | used | 10 | 5 | 2 | 0 | 0 | 7.8 | 0.22 | 7.6 |
| Example II-7 | 0.01 | not used | 12 | 5 | 2 | 0 | 0 | 7.6 | 0.22 | 8.2 |
| Example II-8 | 0.015 | used | 12 | 5 | 0 | 0 | 2 | 8.5 | 0.23 | 10.5 |
| Example II-9 | 0.02 | not used | 13 | 0 | 0 | 3 | 0 | 7.6 | 0.23 | 4.1 |
| Example II-10 | 0.025 | not used | 13 | 0 | 0 | 3 | 0 | 7.8 | 0.23 | 3.8 |

Furthermore, for the phosphors obtained in each Example, the emission spectra, maximum emission-peak wavelengths, maximum emission-peak intensities, color coordinates x and y, non-luminous object colors and temperature characteristics were measured, in such ways as described earlier. The results are shown in Table 13. FIG. 19(*a*) to FIG. 19(*d*) are graphs showing the emission spectra of the phosphors prepared in Examples II-1 to II-4. FIG. 19(*a*), FIG. 19(*b*), FIG. 19(*c*) and FIG. 19(*d*) correspond to Example II-1, Example II-2, Example II-3 and Example II-4, respectively.

Table 13 also shows the result of Comparative Example II-1 using a phosphor of YAG:Ce (P46-Y3, manufactured by Kasei Optonix, Ltd.), which was measured in the same way as the Examples.

TABLE 13

[optical characteristics of phosphors]

| | maximum emission peak wavelength (nm) | maximum emission peak intensity | color coordinate x | color coordinate y | non-luminous object color L* | non-luminous object color a* | non-luminous object color b* | Br(25) | temperature characteristics Br(125)/Br(25) | Br(160)/Br(25) |
|---|---|---|---|---|---|---|---|---|---|---|
| Example II-1 | 514 | 158 | 0.336 | 0.586 | 105 | −25 | 52 | 132 | 0.77 | 0.65 |
| Example II-2 | 516 | 158 | 0.337 | 0.587 | 105 | −25 | 52 | 132 | 0.75 | 0.66 |
| Example II-3 | 516 | 156 | 0.338 | 0.586 | 105 | −25 | 52 | 131 | 0.74 | 0.64 |
| Example II-4 | 516 | 157 | 0.339 | 0.586 | 104 | −25 | 53 | 132 | 0.73 | 0.6 |
| Example II-5 | 516 | 155 | 0.34 | 0.584 | 103 | −25 | 53 | 132 | 0.71 | 0.56 |
| Example II-6 | 510 | 150 | 0.333 | 0.588 | 100 | −25 | 50 | 128 | 0.79 | 0.65 |
| Example II-7 | 516 | 158 | 0.34 | 0.584 | 104 | −26 | 54 | 136 | 0.7 | 0.52 |
| Example II-8 | 516 | 158 | 0.345 | 0.584 | 104 | −26 | 58 | 136 | 0.66 | 0.48 |
| Example II-9 | 517 | 133 | 0.346 | 0.582 | 102 | −21 | 51 | 118 | 0.65 | 0.45 |
| Example II-10 | 517 | 128 | 0.35 | 0.581 | 101 | −19 | 55 | 113 | 0.6 | 0.4 |
| Comparative Example II-1 | 557 | 100 | 0.448 | 0.53 | 103 | −12.8 | 53 | 100 | 0.62 | 0.4 |

Figure 20:
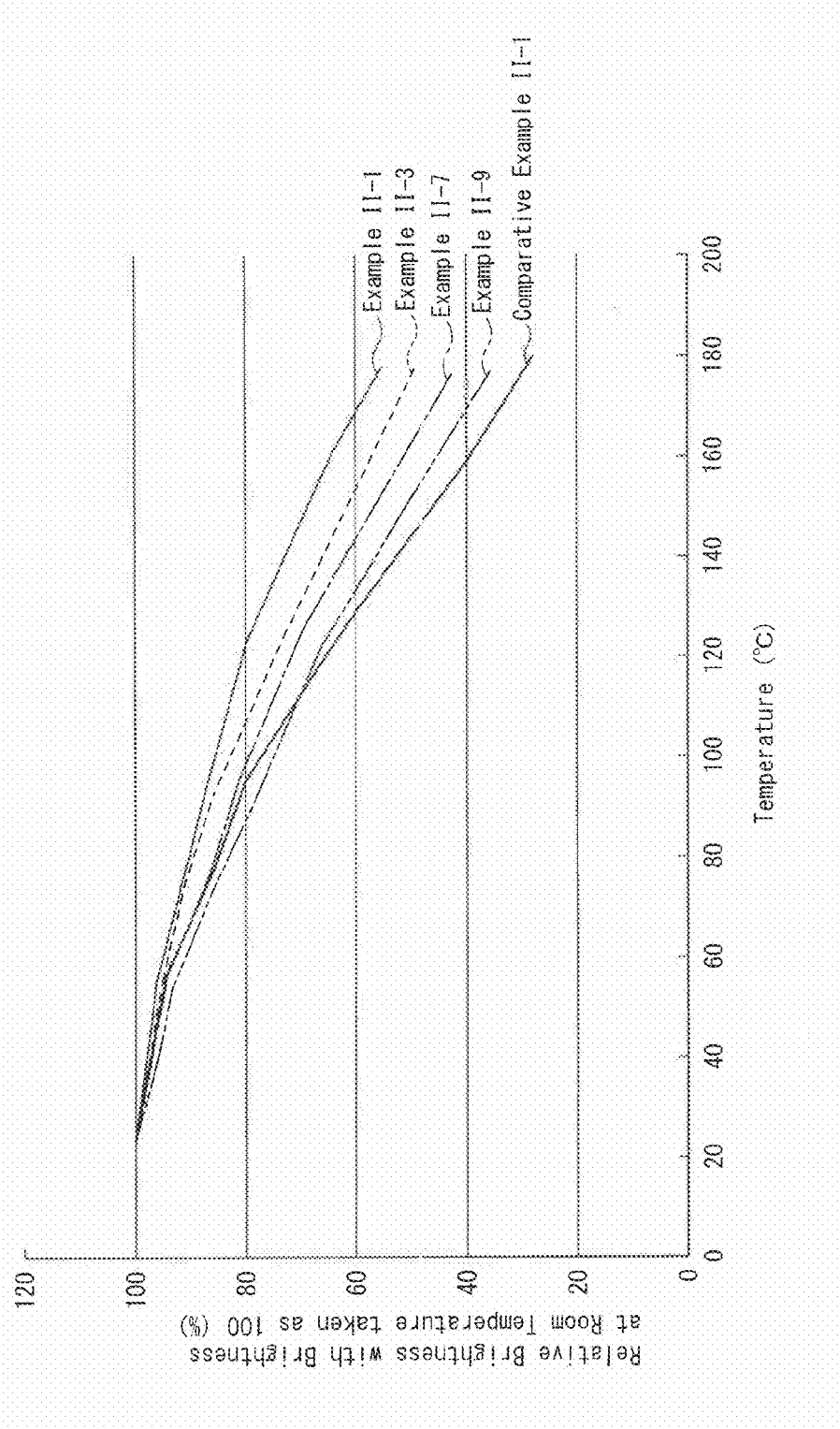
FIG. 20 is a graph showing results of comparing brightnesses at room temperature and other temperatures of the phosphors prepared in Examples II-1, II-3, II-7, II-9 and Comparative Example II-1.

FIG. 20 is a graph showing results of comparing brightnesses at room temperature (25° C.) and other temperatures of the phosphors prepared in Examples II-1, II-3, II-7, II-9 and Comparative Example II-1.

From these results, it is evident that the temperature characteristics is particularly superior in the Ce concentration range of $0.003<a<0.01$, and in the non-luminous object color range, shown in L*, a*, b* color space, of $100\leq L^*\leq 108$, $-30\leq a^*\leq -18$ and $50\leq b^*\leq 65$. It is also evident that the decrease in brightness of the phosphor of the present invention related to temperature rising is smaller than that of conventionally used YAG:Ce (Comparative Example II-1).

II-4

Examples II-11 to II-13

Figure 21:
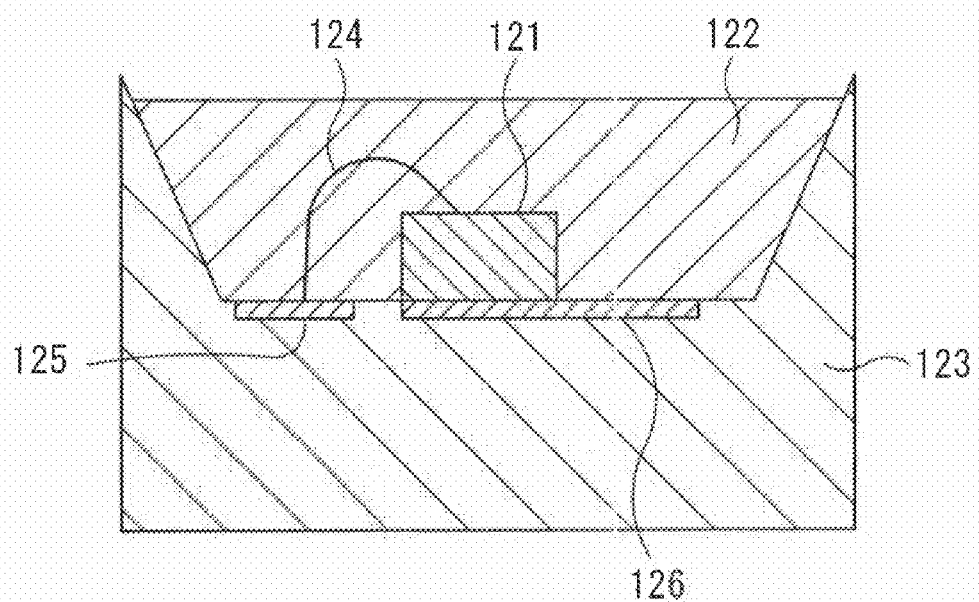
FIG. 21 is a schematic sectional view illustrating the surface-mount white light emitting devices produced in Examples II-11 to II-13 of the present invention.

White light emitting devices shown in FIG. 21 were produced using a green phosphor and a red phosphor in combination as shown in Table 14, according to the following procedure. As the green phosphor, the phosphor obtained in Example II-1 or II-4 was used. As the red phosphor, $Ca_{0.992}Eu_{0.008}AlSiN_3$ or $(Sr_{0.792}Ca_{0.2}Eu_{0.008})AlSiN_3$, was used.

TABLE 14

[combinations of green and red phosphors]

| | green phosphor | red phosphor |
|---|---|---|
| Example II-11 | phosphor obtained in Example II-1 | $Ca_{0.992}Eu_{0.008}AlSiN_3$ |
| Example II-12 | phosphor obtained in Example II-4 | $Ca_{0.992}Eu_{0.008}AlSiN_3$ |
| Example II-13 | phosphor obtained in Example II-4 | $(Sr_{0.792}Ca_{0.2}Eu_{0.008})AlSiN_3$ |

As the first luminous body, a blue LED [121] (C460-MB290-S0100, manufactured by Cree, Inc., having MB grade and light output of 3.0 mW to 11.0 mW) having emission wavelength of 455 nm to 460 nm was used. The blue LED [121] was bonded to the terminal [126] disposed at the bottom of the recess in the frame [123] by means of die bonding using silver paste as adhesive. Then, the blue LED [121] and the electrode [125] of the frame [123] were connected using a gold wire [124], a kind of wire, having diameter of 25 μm.

The mixed phosphors consisting of the above-mentioned two kinds of phosphors (the green phosphor and the red phosphor) were blended sufficiently with a silicone resin (JCR6101UP, manufactured by Dow Corning Toray Co., Ltd.) in the ratios described below, and then this mixture consisting of the mixed phosphors and the silicone resin (namely, phosphor-containing composition) was poured inside the recess of the above-mentioned frame [123].

green phosphor:red phosphor=89:11 (weight ratio)
sum of the phosphors:silicone resin=7:100 (weight ratio)

This was maintained at 150° C. for 2 hours so as to cure the silicone resin, thereby forming the phosphor-containing part [122]. A surface-mount white light emitting device was thus produced. In the explanation of the present Examples, the reference numerals of the parts corresponding to those in FIG. 21 are shown in "[ ]".

Each emission spectrum of the produced surface-mount white light emitting devices was measured. The results are shown in FIG. 22.

In addition, the correlated color temperatures, chromaticity deviations, color coordinates, relative brightnesses, average color rendering indexes Ra and color special color rendering indexes R1 to R15, of these LED, were decided in accordance with JIS Z8726. The result is shown in Table 15. As is evident from FIG. 22 and Table 15, the white light emitting devices of Examples II-11 to II-13 show flat emission spectra at around the range of from 500 nm to 650 nm. In addition, it is evident that their average color rendering indexes Ra are high.

TABLE 15

[color rendering and the like]

| | Example II-11 | Example II-12 | Example II-13 |
|---|---|---|---|
| correlated color temperature Tcp (K) | 5390 | 5333 | 5184 |
| chromaticity deviation Duv | 6.8 | 5.8 | 5.7 |
| color coordinate x | 0.335 | 0.337 | 0.341 |
| color coordinate y | 0.357 | 0.356 | 0.360 |

TABLE 15-continued

[color rendering and the like]

|  |  | Example II-11 | Example II-12 | Example II-13 |
|---|---|---|---|---|
| relative brightness |  | 1809 | 1932 | 2055 |
| color rendering index | Ra | 94.6 | 95.1 | 88.1 |
|  | R1 | 94.6 | 95.4 | 86.5 |
|  | R2 | 97.2 | 97.9 | 91.7 |
|  | R3 | 98.6 | 98.7 | 95.9 |
|  | R4 | 92.5 | 92.9 | 88.0 |
|  | R5 | 93.0 | 93.6 | 87.0 |
|  | R6 | 94.7 | 95.1 | 88.6 |
|  | R7 | 95.3 | 95.3 | 91.0 |
|  | R8 | 91.2 | 92.2 | 76.0 |
|  | R9 | 79.2 | 83.0 | 32.5 |
|  | R10 | 93.3 | 94.7 | 81.0 |
|  | R11 | 93.9 | 94.4 | 88.6 |
|  | R12 | 70.8 | 71.3 | 68.0 |
|  | R13 | 95.6 | 96.5 | 88.0 |
|  | R14 | 99.4 | 99.5 | 98.1 |
|  | R15 | 91.8 | 92.9 | 81.3 |

INDUSTRIAL APPLICABILITY

The present invention can be used in various fields utilizing light. It can be preferably used for image displays of various electronic equipments such as a cellular phone, domestic electric appliance and outdoor display, as well as for indoor and outdoor lighting systems, for example.

The present invention has been explained in detail above with reference to specific embodiments. However, it is evident to those skilled in the art that various modifications can be added thereto without departing from the intention and the scope of the present invention.

The present application is based on Japanese Patent Application (No. 2006-251826) filed on Sep. 15, 2006, Japanese Patent Application (No. 2006-251827) filed on Sep. 15, 2006 and Japanese Patent Application (No. 2007-119627) filed on Apr. 27, 2007, and their entireties are incorporated herewith by reference.

The invention claimed is:

1. A phosphor having an elemental ratio represented by the formula [1]

(In the formula [1],
$M^1$ represents at least one element selected from the group consisting of Cr, Mn, Fe, Co, Ni, Cu, Ce, Pr, Nd, Sm, Eu, Tb, Dy, Ho, Er, Tm and Yb,
$M^2$ mainly represents a bivalent metal element,
$M^3$ mainly represents a trivalent metal element,
a represents a number in the range of $0.0001 \leq a \leq 0.2$,
b represents a number in the range of $0.8 \leq b \leq 1.2$,
c represents a number in the range of $1.6 \leq c \leq 2.4$, and
d represents a number in the range of $3.2 \leq d \leq 4.8$),
and containing at least two elements selected from the group consisting of Li, Na, K, Rb, Cs, P, Cl, F, Br, I, Zn, Ga, Ge, In, Sn, Ag, Au, Pb, Cd and Bi,
wherein at least one of the following (1) through (3) applies:
(1) wherein emitting light at room temperature and having a crystal phase of $CaFe_2O_4$-type crystal structure, the percentage of the number of the phosphor particles of which average circularity is smaller than 85% being 10% or less,
(2) wherein emitting light at room temperature and having a crystal phase of $CaFe_2O_4$-type crystal structure and weight-average median diameter $D_{50}$ of 10 μm or larger, the value QD, represented by the equation, "$QD=(D_{75}-D_{25})/(D_{75}+D_{25})$", where $D_{25}$ and $D_{75}$ are the values of the particle diameter in the weight-standard particle size distribution curve at integrated values of 25% and 75% respectively, being 0.27 or smaller,
(3) wherein having the maximum emission peak in the wavelength range of from 485 nm to 555 nm and a crystal phase of $CaFe_2O_4$-type crystal structure, wherein the percentage of the number of the particles of which aspect ratio is 3 or smaller is 60% or more.

2. A phosphor according to claim 1, wherein
$M^2$ is at least one metal element selected from the group consisting of Mg, Ca, Zn, Sr, Cd and Ba, and
$M^3$ is at least one metal element selected from the group consisting of Al, Sc, Ga, Y, In, La, Gd, Yb and Lu.

3. A phosphor according to claim 1, wherein,
the phosphor satisfies the following formula [2] and/or formula [3], $$Br(125)/Br(25) \geq 0.7 \quad [2]$$

$$Br(160)/Br(25) \geq 0.5 \quad [3]$$

(In the above formulae [2] and [3],
Br(25) is brightness of said phosphor when excited by a light having wavelength of 455 nm at 25° C.,
Br(125) is brightness of said phosphor when excited by a light having wavelength of 455 nm at 125° C.,
Br(160) is brightness of said phosphor when excited by a light having wavelength of 455 nm at 160° C.).

4. A phosphor according to claim 1, wherein emitting light at room temperature and having a crystal phase of $CaFe_2O_4$-type crystal structure,
the percentage of the number of the phosphor particles of which average circularity is smaller than 85% being 10% or less.

5. A phosphor according to claim 1, wherein emitting light at room temperature and having a crystal phase of $CaFe_2O_4$-type crystal structure and weight-average median diameter $D_{50}$ of 10 μm or larger,
the value QD, represented by the equation, "$QD=(D_{75}-D_{25})/(D_{75}+D_{25})$", where $D_{25}$ and $D_{75}$ are the values of the particle diameter in the weight-standard particle size distribution curve at integrated values of 25% and 75% respectively, being 0.27 or smaller.

6. A phosphor according to claim 1, wherein having the maximum emission peak in the wavelength range of from 485 nm to 555 nm and a crystal phase of $CaFe_2O_4$-type crystal structure, wherein
the percentage of the number of the particles of which aspect ratio is 3 or smaller is 60% or more.

7. A phosphor according to claim 1, wherein,
said phosphor contains at least two elements selected from the group consisting of Li, Na, K, Rb, Cs, P, Cl, F, Br, I, Zn, Ga, Ge, In, Sn, Ag, Au, Pb, Cd and Bi in a concentration range of from 1 ppm to 5000 ppm.

8. A phosphor according to claim 1, wherein,
said phosphor contains at least two elements selected from the group consisting of Li, K, P and Cl in concentration ranges of 1 ppm $\leq$ Li $\leq$ 500 ppm, 1 ppm $\leq$ K $\leq$ 500 ppm, 0 ppm $<$ P $\leq$ 1000 ppm and 0 ppm $<$ Cl $\leq$ 1000 ppm.

9. A phosphor according to claim 1, wherein,
said phosphor contains at least one element selected from the group consisting of Zn, Ga, Ge, In and Sn in a concentration range of from 1 ppm to 500 ppm.

10. A phosphor according to claim 1, wherein,
at least two elements selected from the group consisting of Li, Na, K, Rb, Cs, P, Cl, F, Br, I, Zn, Ga, Ge, In, Sn, Ag, Au, Pb, Cd, and Bi are contained in the crystal phase of said phosphor.

11. A phosphor according to claim 1, wherein,
the electric conductivity of the supernatant fluid that is obtained by leaving the phosphor, dispersed in 10-fold amount of water as ratio by weight, to stand for 1 hour is 10 mS/m or lower.

12. A method for producing a phosphor, selected from the group consisting of following (A) and (B):
(A) a phosphor having an elemental ratio represented by the formula [1]

$$M^1_a M^2_b M^3_c O_d \qquad [1]$$

(In the formula [1],
$M^1$ represents at least one element selected from the group consisting of Cr, Mn, Fe, Co, Ni, Cu, Ce, Pr, Nd, Sm, Eu, Tb, Dy, Ho, Er, Tm and Yb,
$M^2$ mainly represents a bivalent metal element,
$M^3$ mainly represents a trivalent metal element,
a represents a number in the range of $0.0001 \leq a \leq 0.2$,
b represents a number in the range of $0.8 \leq b \leq 1.2$,
c represents a number in the range of $1.6 \leq c \leq 2.4$, and
d represents a number in the range of $3.2 \leq d \leq 4.8$)
and containing at least two elements selected from the group consisting of Li, Na, K, Rb, Cs, P, Cl, F, Br, I, Zn, Ga, Ge, In, Sn, Ag, Au, Pb, Cd and Bi,
(B) a phosphor having an elemental ratio represented by the formula [1']

$$M^1_a M^2_b M^3_c O_d \qquad [1']$$

(In the formula [1'],
$M^1$ represents at least one element selected from the group consisting of Cr, Mn, Fe, Co, Ni, Cu, Ce, Pr, Nd, Sm, Eu, Tb, Dy, Ho, Er, Tm and Yb,
$M^2$ mainly represents a bivalent metal element,
$M^3$ mainly represents a trivalent metal element,
a represents a number in the range of $0.003 < a < 0.01$
b represents a number in the range of $0.8 \leq b \leq 1.2$,
c represents a number in the range of $1.6 \leq c \leq 2.4$, and
d represents a number in the range of $3.2 \leq d \leq 4.8$), comprising:
heating precursors for the phosphor at least twice, and after the first or a subsequent heating, mixing with a material which contains two or more compounds selected from the group consisting of a halide of an alkaline-earth metal, a phosphate of an alkali metal, a halide of an alkali metal and a sulfate of an alkali metal, and heating the heated precursors and material.

13. A method for producing a phosphor, according to claim 12, wherein
the material further contains a compound which forms a metal whose melting point or sublimation point is 1200° C. or lower by heating and/or a compound which forms an oxide of an alkali metal by heating.

14. A method for producing a phosphor, according to claim 12, wherein
the material contains two or more compounds selected from the group consisting of $CaCl_2$, $Li_3PO_4$, $KH_2PO_4$, KCl and $Li_2SO_4$.

15. A method for producing a phosphor, according to claim 12, wherein
the material further contains one or more compounds selected from the group consisting of ZnO, $Ga_2O_3$, $GeO_2$, $In_2O_3$, $SnO_2$ and $K_2CO_3$.

16. A method for producing a phosphor, according to claim 12, wherein
the material further contains ZnO, and/or $K_2CO_3$.

17. A method for producing a phosphor, according to claim 12, wherein
a coprecipitation oxide that is obtained by heating a coprecipitated compound containing at least two constituent elements of said phosphor is used as the material.

18. A method for producing a phosphor, according to claim 17, wherein
at least two of the constituent elements of said phosphor are Sc and Ce.

19. A light emitting device comprising: a first luminous body and a second luminous body which emits visible light when irradiated with light from said first luminous body, wherein
said second luminous body comprises, as a first phosphor, one or more phosphors selected from the group consisting of following (A) and (B):
(A) a phosphor having an elemental ratio represented by the formula [1]

$$M^1_a M^2_b M^3_c O_d \qquad [1]$$

(In the formula [1],
$M^1$ represents at least one element selected from the group consisting of Cr, Mn, Fe, Co, Ni, Cu, Ce, Pr, Nd, Sm, Eu, Tb, Dy, Ho, Er, Tm and Yb,
$M^2$ mainly represents a bivalent metal element,
$M^3$ mainly represents a trivalent metal element,
a represents a number in the range of $0.0001 \leq a \leq 0.2$,
b represents a number in the range of $0.8 \leq b \leq 1.2$,
c represents a number in the range of $1.6 \leq c \leq 2.4$, and
d represents a number in the range of $3.2 \leq d \leq 4.8$)
and containing at least two elements selected from the group consisting of Li, Na, K, Rb, Cs, P, Cl, F, Br, I, Zn, Ga, Ge, In, Sn, Ag, Au, Pb, Cd and Bi,
(B) a phosphor having an elemental ratio represented by the formula [1']

$$M^1_a M^2_b M^3_c O_d \qquad [1']$$

(In the formula [1'],
$M^1$ represents at least one element selected from the group consisting of Cr, Mn, Fe, Co, Ni, Cu, Ce, Pr, Nd, Sm, Eu, Tb, Dy, Ho, Er, Tm and Yb,
$M^2$ mainly represents a bivalent metal element,
$M^3$ mainly represents a trivalent metal element,
a represents a number in the range of $0.003 < a < 0.01$
b represents a number in the range of $0.8 \leq b \leq 1.2$,
c represents a number in the range of $1.6 \leq c \leq 2.4$, and
d represents a number in the range of $3.2 \leq d \leq 4.8$),
wherein at least one of the following (1) through (3) applies:
(1) wherein emitting light at room temperature and having a crystal phase of $CaFe_2O_4$-type crystal structure, the percentage of the number of the phosphor particles of which average circularity is smaller than 85% being 10% or less,
(2) wherein emitting light at room temperature and having a crystal phase of $CaFe_2O_4$-type crystal structure and weight-average median diameter $D_{50}$ of 10 μm or larger, the value QD, represented by the equation, "$QD=(D_{75}-D_{25})/(D_{75}+D_{25})$", where $D_{25}$ and $D_{75}$ are the values of the particle diameter in the weight-standard particle size distribution curve at integrated values of 25% and 75% respectively, being 0.27 or smaller, (3) wherein having the maximum emission peak in the wavelength range of from 485 nm to 555 nm and a crystal phase of $CaFe_2O_4$-type crystal structure, wherein the percentage of the number of the particles of which aspect ratio is 3 or smaller is 60% or more.

20. A light emitting device according to claim 19, wherein said second luminous body comprises, as a second phosphor, one or more phosphors of which emission peak wavelengths are different from that of said first phosphor.

21. An image display comprising a light emitting device according to claim 19 as a light source.

22. A lighting system comprising a light emitting device according to claim 19 as a light source.

23. A phosphor having an elemental ratio represented by the formula [1']

$$M^1_a M^2_b M^3_c O_d \qquad [1']$$

(In the formula [1'],
$M^1$ represents at least one element selected from the group consisting of Cr, Mn, Fe, Co, Ni, Cu, Ce, Pr, Nd, Sm, Eu, Tb, Dy, Ho, Er, Tm and Yb,
$M^2$ mainly represents a bivalent metal element,
$M^3$ mainly represents a trivalent metal element,
a represents a number in the range of $0.003<a<0.01$
b represents a number in the range of $0.8 \leq b \leq 1.2$,
c represents a number in the range of $1.6 \leq c \leq 2.4$, and
d represents a number in the range of $3.2 \leq d \leq 4.8$),
wherein at least one of the following (1) through (3) applies:
(1) wherein emitting light at room temperature and having a crystal phase of $CaFe_2O_4$-type crystal structure, the percentage of the number of the phosphor particles of which average circularity is smaller than 85% being 10% or less,
(2) wherein emitting light at room temperature and having a crystal phase of $CaFe_2O_4$-type crystal structure and weight-average median diameter $D_{50}$ of 10 μm or larger, the value QD, represented by the equation, "$QD=(D_{75}-D_{25})/(D_{75}+D_{25})$", where $D_{25}$ and $D_{75}$ are the values of the particle diameter in the weight-standard particle size distribution curve at integrated values of 25% and 75% respectively, being 0.27 or smaller,
(3) wherein having the maximum emission peak in the wavelength range of from 485 nm to 555 nm and a crystal phase of $CaFe_2O_4$-type crystal structure, wherein the percentage of the number of the particles of which aspect ratio is 3 or smaller is 60% or more.

24. A phosphor according to claim 23, wherein
$M^2$ is at least one metal element selected from the group consisting of Mg, Ca, Zn, Sr, Cd and Ba, and
$M^3$ is at least one metal element selected from the group consisting of Al, Sc, Ga, Y, In, La, Gd, Yb and Lu.

25. A phosphor according to claim 23, wherein, the phosphor satisfies the following formula [2] and/or formula [3], $$Br(125)/Br(25) \geq 0.7 \qquad [2]$$

$$Br(160)/Br(25) \geq 0.5 \qquad [3]$$

(In the above formulae [2] and [3],
Br(25) is brightness of said phosphor when excited by a light having wavelength of 455 nm at 25° C.,
Br(125) is brightness of said phosphor when excited by a light having wavelength of 455 nm at 125° C.,
Br(160) is brightness of said phosphor when excited by a light having wavelength of 455 nm at 160° C.).

26. A phosphor according to claim 23, wherein, said phosphor contains at least two elements selected from the group consisting of Li, Na, K, Rb, Cs, P, Cl, F, Br, I, Zn, Ga, Ge, In, Sn, Ag, Au, Pb, Cd and Bi in a concentration range of from 1 ppm to 5000 ppm.

27. A phosphor according to claim 23, wherein, said phosphor contains at least two elements selected from the group consisting of Li, K, P and Cl in concentration ranges of 1 ppm≦Li≦500 ppm, 1 ppm≦K≦500 ppm, 0 ppm<P≦1000 ppm and 0 ppm<Cl≦1000 ppm.

28. A phosphor according to claim 23, wherein, said phosphor contains at least one element selected from the group consisting of Zn, Ga, Ge, In and Sn in a concentration range of from 1 ppm to 500 ppm.

29. A phosphor according to 23, wherein, at least two elements selected from the group consisting of Li, Na, K, Rb, Cs, P, Cl, F, Br, I, Zn, Ga, Ge, In, Sn, Ag, Au, Pb, Cd and Bi are contained in the crystal phase of said phosphor.

30. A phosphor according to claim 23, wherein, the electric conductivity of the supernatant fluid that is obtained by leaving the phosphor, dispersed in 10-fold amount of water as ratio by weight, to stand for 1 hour is 10 mS/m or lower.

* * * * *